US009761763B2

(12) United States Patent
Steranka et al.

(10) Patent No.: US 9,761,763 B2
(45) Date of Patent: Sep. 12, 2017

(54) DENSE-LUMINESCENT-MATERIALS-COATED VIOLET LEDS

(71) Applicant: SORAA, INC., Fremont, CA (US)

(72) Inventors: Frank M. Steranka, San Jose, CA (US); Rafael Aldaz, Pleasanton, CA (US); Seshasayee Ankireddi, San Jose, CA (US); Troy Trottier, San Jose, CA (US); Rohit Modi, Fremont, CA (US); Rajarshi Saha, Union City, CA (US)

(73) Assignee: Soraa, Inc., Freemont, CA (US)

( * ) Notice: Subject to any disclaimer, the term of this patent is extended or adjusted under 35 U.S.C. 154(b) by 106 days.

(21) Appl. No.: 14/135,098

(22) Filed: Dec. 19, 2013

(65) Prior Publication Data

US 2014/0175492 A1    Jun. 26, 2014

Related U.S. Application Data

(60) Provisional application No. 61/740,937, filed on Dec. 21, 2012.

(51) Int. Cl.
*H01L 33/00* (2010.01)
*H01L 33/44* (2010.01)
*H01L 33/50* (2010.01)
*F21S 8/10* (2006.01)
*H01L 25/075* (2006.01)
(Continued)

(52) U.S. Cl.
CPC .......... *H01L 33/44* (2013.01); *F21S 48/1154* (2013.01); *F21S 48/1163* (2013.01); *H01L 33/50* (2013.01); *F21K 9/233* (2016.08); *F21Y 2101/00* (2013.01); *F21Y 2115/10* (2016.08); *H01L 25/0753* (2013.01); *H01L 33/20* (2013.01); *H01L 2224/48091* (2013.01);
(Continued)

(58) Field of Classification Search
CPC ..................... H01L 33/44; H01L 33/50; H01L 2924/12044; H01L 2224/48091; H01L 33/20; H01L 2933/0041; H01L 25/0753; F21S 48/1154; F21S 48/1163; F21Y 2101/00; F21K 9/233
USPC .............................................. 257/98; 438/28
See application file for complete search history.

(56) References Cited

U.S. PATENT DOCUMENTS 3,283,143 A    11/1966    Gosnell
3,621,233 A    11/1971    Ferdinand et al.
(Continued)

FOREIGN PATENT DOCUMENTS

EP    2381490    10/2011
JP    H02-028541    1/1990
(Continued)

OTHER PUBLICATIONS

Mastro et al., 'Hydride vapor phase epitaxy-grown AlGaN/GaN high electron mobility transistors', Solid-State Electronics, vol. 47, Issue 6, Jun. 2003, pp. 1075-1079.
(Continued)

*Primary Examiner* — Phat X Cao
*Assistant Examiner* — Mohammad M Hoque
(74) *Attorney, Agent, or Firm* — Saul Ewing LLP

(57) ABSTRACT

Techniques for fabricating and using arrays of violet-emitting LEDs coated with densely-packed-luminescent-material layers together with apparatus and method embodiments thereto are disclosed.

15 Claims, 36 Drawing Sheets

(51) Int. Cl.
  *H01L 33/20*  (2010.01)
  *F21Y 101/00* (2016.01)
  *F21K 9/233*  (2016.01)
  *F21Y 115/10* (2016.01)

(52) U.S. Cl.
  CPC .............. *H01L 2924/12044* (2013.01); *H01L 2933/0041* (2013.01)

(56) References Cited

U.S. PATENT DOCUMENTS

| | | | |
|---|---|---|---|
| 4,066,868 A | 1/1978 | Witkin et al. | |
| 4,225,904 A | 9/1980 | Linder | |
| 4,350,560 A | 9/1982 | Helgeland et al. | |
| 4,581,646 A | 4/1986 | Kubodera | |
| 4,873,696 A | 10/1989 | Coldren et al. | |
| 5,005,109 A | 4/1991 | Carleton | |
| 5,142,387 A | 8/1992 | Shikama et al. | |
| 5,169,486 A | 12/1992 | Young et al. | |
| 5,449,930 A | 9/1995 | Zhou | |
| 5,523,589 A | 6/1996 | Edmond et al. | |
| 5,536,953 A | 7/1996 | Dreifus et al. | |
| 5,560,700 A | 10/1996 | Levens | |
| 5,813,753 A | 9/1998 | Vriens et al. | |
| 6,150,774 A | 11/2000 | Mueller et al. | |
| 6,275,145 B1 | 8/2001 | Rogozinski | |
| 6,300,557 B1 | 10/2001 | Wanlass | |
| 6,335,771 B1 | 1/2002 | Hiraishi | |
| 6,498,355 B1 | 12/2002 | Harrah et al. | |
| 6,498,440 B2 | 12/2002 | Stam et al. | |
| 6,509,651 B1 | 1/2003 | Matsubara et al. | |
| 6,573,537 B1 | 6/2003 | Steigerwald et al. | |
| 6,613,461 B1 * | 9/2003 | Sugahara .................... | 428/698 |
| 6,853,010 B2 | 2/2005 | Slater, Jr. et al. | |
| 6,860,628 B2 | 3/2005 | Robertson et al. | |
| 6,864,641 B2 | 3/2005 | Dygert | |
| 6,889,006 B2 | 5/2005 | Kobayashi | |
| 6,956,246 B1 | 10/2005 | Epler et al. | |
| 6,967,116 B2 | 11/2005 | Negley | |
| 6,989,807 B2 | 1/2006 | Chiang | |
| 7,005,679 B2 | 2/2006 | Tarsa et al. | |
| 7,009,199 B2 | 3/2006 | Hall | |
| 7,027,015 B2 | 4/2006 | Booth, Jr. et al. | |
| 7,038,399 B2 | 5/2006 | Lys et al. | |
| 7,067,985 B2 | 6/2006 | Adachi | |
| 7,067,995 B2 | 6/2006 | Gunter et al. | |
| 7,081,722 B1 | 7/2006 | Huynh et al. | |
| 7,083,302 B2 | 8/2006 | Chen et al. | |
| 7,095,056 B2 | 8/2006 | Vitta et al. | |
| 7,113,658 B2 | 9/2006 | Ide et al. | |
| 7,148,515 B1 | 12/2006 | Huang et al. | |
| 7,173,384 B2 | 2/2007 | Plotz et al. | |
| 7,183,577 B2 | 2/2007 | Mueller-Mach et al. | |
| 7,211,822 B2 | 5/2007 | Nagahama et al. | |
| 7,213,940 B1 | 5/2007 | Van De Ven et al. | |
| 7,233,831 B2 | 6/2007 | Blackwell | |
| 7,250,715 B2 | 7/2007 | Mueller et al. | |
| 7,252,408 B2 | 8/2007 | Mazzochette et al. | |
| 7,253,446 B2 | 8/2007 | Sakuma et al. | |
| 7,279,040 B1 | 10/2007 | Wang | |
| 7,318,651 B2 | 1/2008 | Chua et al. | |
| 7,352,138 B2 | 4/2008 | Lys et al. | |
| 7,358,543 B2 | 4/2008 | Chua et al. | |
| 7,358,679 B2 | 4/2008 | Lys et al. | |
| 7,361,938 B2 | 4/2008 | Mueller et al. | |
| 7,419,281 B2 | 9/2008 | Porchia et al. | |
| 7,521,862 B2 | 4/2009 | Mueller et al. | |
| 7,560,981 B2 | 7/2009 | Chao et al. | |
| 7,564,180 B2 | 7/2009 | Brandes | |
| 7,622,742 B2 | 11/2009 | Kim et al. | |
| 7,646,033 B2 | 1/2010 | Tran et al. | |
| 7,846,757 B2 | 12/2010 | Farrell, Jr. et al. | |
| 7,858,408 B2 | 12/2010 | Mueller et al. | |
| 7,884,538 B2 | 2/2011 | Mitsuishi et al. | |
| 7,902,564 B2 | 3/2011 | Mueller-Mach et al. | |
| 7,906,793 B2 | 3/2011 | Negley | |
| 7,997,774 B2 | 8/2011 | Liddle | |
| 8,044,412 B2 | 10/2011 | Murphy et al. | |
| 8,044,609 B2 | 10/2011 | Liu | |
| 8,062,726 B2 | 11/2011 | Greiner et al. | |
| 8,124,996 B2 | 2/2012 | Raring et al. | |
| 8,207,554 B2 | 6/2012 | Shum | |
| 8,269,245 B1 | 9/2012 | Shum | |
| 8,299,473 B1 | 10/2012 | D'Evelyn et al. | |
| 8,310,143 B2 | 11/2012 | Van De Ven et al. | |
| 8,324,840 B2 | 12/2012 | Shteynberg et al. | |
| 8,362,603 B2 | 1/2013 | Lim et al. | |
| 8,399,898 B2 | 3/2013 | Jagt et al. | |
| 8,404,071 B2 | 3/2013 | Cope et al. | |
| 8,410,711 B2 | 4/2013 | Lin et al. | |
| 8,410,717 B2 | 4/2013 | Shteynberg et al. | |
| 8,431,942 B2 | 4/2013 | Butterworth | |
| 8,476,644 B2 | 7/2013 | Illek et al. | |
| 8,502,465 B2 | 8/2013 | Katona et al. | |
| 8,519,437 B2 | 8/2013 | Chakraborty | |
| 8,525,396 B2 | 9/2013 | Shum et al. | |
| 8,541,951 B1 | 9/2013 | Shum et al. | |
| 8,575,642 B1 | 11/2013 | Shum | |
| D694,722 S | 12/2013 | Shum et al. | |
| 8,618,560 B2 | 12/2013 | D'Evelyn et al. | |
| 8,651,711 B2 | 2/2014 | Rudisill et al. | |
| 8,674,395 B2 | 3/2014 | Shum | |
| 8,686,458 B2 | 4/2014 | Krames et al. | |
| 8,704,258 B2 | 4/2014 | Tasaki et al. | |
| 8,740,413 B1 | 6/2014 | Krames et al. | |
| 8,746,918 B1 | 6/2014 | Rubino | |
| 8,752,975 B2 | 6/2014 | Rubino | |
| 8,786,053 B2 | 7/2014 | D'Evelyn et al. | |
| 8,791,499 B1 | 7/2014 | Sharma et al. | |
| 8,829,774 B1 | 9/2014 | Shum et al. | |
| 8,888,332 B2 | 11/2014 | Martis et al. | |
| 8,896,235 B1 | 11/2014 | Shum et al. | |
| 8,905,588 B2 | 12/2014 | Krames et al. | |
| 8,933,644 B2 | 1/2015 | David et al. | |
| 9,236,414 B2 * | 1/2016 | Matsuura ................ | H01L 27/15 |
| 2001/0022495 A1 | 9/2001 | Salam | |
| 2001/0055208 A1 | 12/2001 | Kimura | |
| 2002/0063258 A1 | 5/2002 | Motoki | |
| 2002/0088985 A1 | 7/2002 | Komoto et al. | |
| 2002/0190260 A1 | 12/2002 | Shen et al. | |
| 2003/0012246 A1 | 1/2003 | Klimek et al. | |
| 2003/0030063 A1 | 2/2003 | Sosniak et al. | |
| 2004/0031437 A1 | 2/2004 | Sarayama et al. | |
| 2004/0070004 A1 | 4/2004 | Eliashevich et al. | |
| 2004/0080938 A1 | 4/2004 | Holman et al. | |
| 2004/0100192 A1 * | 5/2004 | Yano ...................... | H01L 33/54 |
| | | | 313/512 |
| 2004/0104391 A1 | 6/2004 | Maeda et al. | |
| 2004/0135136 A1 | 7/2004 | Takahashi et al. | |
| 2004/0164308 A1 | 8/2004 | Asatsuma et al. | |
| 2004/0190304 A1 | 9/2004 | Sugimoto et al. | |
| 2004/0201598 A1 | 10/2004 | Eliav et al. | |
| 2004/0207998 A1 | 10/2004 | Suehiro et al. | |
| 2004/0227149 A1 | 11/2004 | Ibbetson et al. | |
| 2004/0251471 A1 | 12/2004 | Dwilinski et al. | |
| 2005/0024744 A1 | 2/2005 | Falicoff et al. | |
| 2005/0030760 A1 | 2/2005 | Capello et al. | |
| 2005/0057145 A1 * | 3/2005 | Shieh ................ | C09K 11/7731 |
| | | | 313/503 |
| 2005/0084218 A1 | 4/2005 | Ide et al. | |
| 2005/0087753 A1 | 4/2005 | D'Evelyn et al. | |
| 2005/0109240 A1 | 5/2005 | Maeta et al. | |
| 2005/0140270 A1 | 6/2005 | Henson et al. | |
| 2005/0179376 A1 | 8/2005 | Fung et al. | |
| 2005/0199899 A1 | 9/2005 | Lin et al. | |
| 2005/0224830 A1 | 10/2005 | Blonder et al. | |
| 2005/0225988 A1 | 10/2005 | Chaves et al. | |
| 2005/0232327 A1 | 10/2005 | Nomura et al. | |
| 2005/0253158 A1 * | 11/2005 | Yasukawa .......... | C09K 11/7731 |
| | | | 257/98 |
| 2006/0006404 A1 | 1/2006 | Ibbetson et al. | |
| 2006/0038542 A1 | 2/2006 | Park et al. | |
| 2006/0060872 A1 | 3/2006 | Edmond et al. | |
| 2006/0065900 A1 | 3/2006 | Hsieh et al. | |

(56) References Cited

U.S. PATENT DOCUMENTS

| | | |
|---|---|---|
| 2006/0068154 A1 | 3/2006 | Parce et al. |
| 2006/0078022 A1 | 4/2006 | Kozaki et al. |
| 2006/0097385 A1 | 5/2006 | Negley |
| 2006/0105485 A1 | 5/2006 | Basin et al. |
| 2006/0108162 A1 | 5/2006 | Tabata et al. |
| 2006/0118799 A1 | 6/2006 | D'Evelyn et al. |
| 2006/0124051 A1 | 6/2006 | Yoshioka et al. |
| 2006/0149607 A1 | 7/2006 | Sayers et al. |
| 2006/0152795 A1 | 7/2006 | Yang |
| 2006/0177362 A1 | 8/2006 | D'Evelyn et al. |
| 2006/0180828 A1 | 8/2006 | Kim et al. |
| 2006/0208262 A1 | 9/2006 | Sakuma et al. |
| 2006/0226759 A1 | 10/2006 | Masuda et al. |
| 2006/0261364 A1 | 11/2006 | Suehiro et al. |
| 2006/0262545 A1 | 11/2006 | Piepgras et al. |
| 2006/0273339 A1 | 12/2006 | Steigerwald et al. |
| 2006/0288927 A1 | 12/2006 | Chodelka et al. |
| 2007/0007898 A1 | 1/2007 | Bruning |
| 2007/0012944 A1 | 1/2007 | Bader et al. |
| 2007/0072324 A1 | 3/2007 | Krames et al. |
| 2007/0091608 A1 | 4/2007 | Hauffe et al. |
| 2007/0104861 A1* | 5/2007 | Chen .................. C09K 11/0883 427/66 |
| 2007/0114561 A1 | 5/2007 | Comanzo et al. |
| 2007/0114563 A1 | 5/2007 | Paek et al. |
| 2007/0126023 A1 | 6/2007 | Haskell et al. |
| 2007/0139920 A1 | 6/2007 | Van De Ven et al. |
| 2007/0170450 A1 | 7/2007 | Murphy |
| 2007/0181895 A1 | 8/2007 | Nagai |
| 2007/0202624 A1 | 8/2007 | Yoon et al. |
| 2007/0210074 A1 | 9/2007 | Maurer et al. |
| 2007/0228404 A1 | 10/2007 | Tran et al. |
| 2007/0231963 A1 | 10/2007 | Doan et al. |
| 2007/0240346 A1 | 10/2007 | Li et al. |
| 2007/0257272 A1* | 11/2007 | Hutchins ............. F21S 48/1747 257/98 |
| 2008/0006837 A1 | 1/2008 | Park et al. |
| 2008/0048200 A1 | 2/2008 | Mueller et al. |
| 2008/0054290 A1 | 3/2008 | Shieh et al. |
| 2008/0083741 A1 | 4/2008 | Giddings et al. |
| 2008/0087919 A1 | 4/2008 | Tysoe et al. |
| 2008/0099777 A1 | 5/2008 | Erchak et al. |
| 2008/0108162 A1 | 5/2008 | Dwilinski et al. |
| 2008/0116786 A1 | 5/2008 | Wang et al. |
| 2008/0151543 A1 | 6/2008 | Wang |
| 2008/0158887 A1 | 7/2008 | Zhu et al. |
| 2008/0173882 A1 | 7/2008 | Parikh et al. |
| 2008/0173884 A1 | 7/2008 | Chitnis et al. |
| 2008/0179607 A1 | 7/2008 | DenBaars et al. |
| 2008/0179611 A1 | 7/2008 | Chitnis et al. |
| 2008/0187746 A1 | 8/2008 | De Graaf et al. |
| 2008/0192791 A1 | 8/2008 | Furukawa et al. |
| 2008/0194054 A1 | 8/2008 | Lin et al. |
| 2008/0203419 A1* | 8/2008 | Harada ............... H01L 25/0753 257/98 |
| 2008/0206925 A1 | 8/2008 | Chatterjee et al. |
| 2008/0211389 A1 | 9/2008 | Oshio |
| 2008/0218759 A1 | 9/2008 | Colvin et al. |
| 2008/0258165 A1 | 10/2008 | Zimmerman et al. |
| 2008/0272463 A1 | 11/2008 | Butcher et al. |
| 2008/0284346 A1 | 11/2008 | Lee |
| 2009/0008573 A1 | 1/2009 | Conner |
| 2009/0008648 A1* | 1/2009 | Biwa .................... H01L 33/025 257/76 |
| 2009/0032828 A1 | 2/2009 | Romano et al. |
| 2009/0045439 A1 | 2/2009 | Hoshi et al. |
| 2009/0050908 A1 | 2/2009 | Yuan et al. |
| 2009/0071394 A1 | 3/2009 | Nakahata et al. |
| 2009/0081857 A1 | 3/2009 | Hanser et al. |
| 2009/0140279 A1 | 6/2009 | Zimmerman et al. |
| 2009/0146170 A1 | 6/2009 | Zhong et al. |
| 2009/0162963 A1 | 6/2009 | Tansu et al. |
| 2009/0173958 A1 | 7/2009 | Chakraborty et al. |
| 2009/0184624 A1 | 7/2009 | Schmidt et al. |
| 2009/0191658 A1 | 7/2009 | Kim et al. |
| 2009/0194796 A1 | 8/2009 | Hashimoto et al. |
| 2009/0206354 A1 | 8/2009 | Kitano et al. |
| 2009/0212277 A1 | 8/2009 | Akita et al. |
| 2009/0213120 A1 | 8/2009 | Nisper et al. |
| 2009/0221106 A1 | 9/2009 | Zimmerman et al. |
| 2009/0226139 A1 | 9/2009 | Yuang |
| 2009/0227056 A1 | 9/2009 | Kyono et al. |
| 2009/0262516 A1 | 10/2009 | Li |
| 2009/0272996 A1 | 11/2009 | Chakraborty |
| 2009/0273005 A1 | 11/2009 | Lin |
| 2009/0309105 A1 | 12/2009 | Letts et al. |
| 2009/0315057 A1* | 12/2009 | Konishi .................. H01L 33/62 257/98 |
| 2009/0315480 A1 | 12/2009 | Yan et al. |
| 2009/0321778 A1 | 12/2009 | Chen et al. |
| 2010/0001300 A1 | 1/2010 | Raring et al. |
| 2010/0025656 A1 | 2/2010 | Raring et al. |
| 2010/0031875 A1 | 2/2010 | D'Evelyn |
| 2010/0041170 A1 | 2/2010 | Epler et al. |
| 2010/0051974 A1 | 3/2010 | Krames |
| 2010/0055819 A1 | 3/2010 | Ohba et al. |
| 2010/0059767 A1* | 3/2010 | Kawasaki ......... G02F 1/133615 257/89 |
| 2010/0060130 A1 | 3/2010 | Li |
| 2010/0067241 A1 | 3/2010 | Lapatovich et al. |
| 2010/0109025 A1 | 5/2010 | Bhat |
| 2010/0117106 A1 | 5/2010 | Trottier |
| 2010/0140634 A1 | 6/2010 | van de Ven et al. |
| 2010/0148210 A1 | 6/2010 | Huang et al. |
| 2010/0149814 A1 | 6/2010 | Zhai et al. |
| 2010/0155746 A1 | 6/2010 | Ibbetson et al. |
| 2010/0164403 A1 | 7/2010 | Liu |
| 2010/0200888 A1 | 8/2010 | Kuhmann et al. |
| 2010/0226399 A1 | 9/2010 | Nishinaka |
| 2010/0226404 A1 | 9/2010 | Kim et al. |
| 2010/0240158 A1 | 9/2010 | Ter-Hovhannissian |
| 2010/0244055 A1 | 9/2010 | Greisen |
| 2010/0258830 A1 | 10/2010 | Ide et al. |
| 2010/0290208 A1 | 11/2010 | Pickard |
| 2010/0291313 A1 | 11/2010 | Ling |
| 2010/0315012 A1* | 12/2010 | Kim ......................... F21K 9/00 315/185 R |
| 2011/0001157 A1 | 1/2011 | McKenzie et al. |
| 2011/0018026 A1* | 1/2011 | Konno .................... H01L 33/50 257/100 |
| 2011/0025183 A1* | 2/2011 | Su ...................... H01L 25/0753 313/1 |
| 2011/0038154 A1 | 2/2011 | Chakravarty et al. |
| 2011/0057205 A1 | 3/2011 | Mueller et al. |
| 2011/0062415 A1 | 3/2011 | Ohta et al. |
| 2011/0064103 A1 | 3/2011 | Ohta et al. |
| 2011/0068700 A1 | 3/2011 | Fan |
| 2011/0101350 A1 | 5/2011 | Greisen |
| 2011/0121331 A1 | 5/2011 | Simonian et al. |
| 2011/0136281 A1 | 6/2011 | Sheen |
| 2011/0140150 A1 | 6/2011 | Shum |
| 2011/0181173 A1 | 7/2011 | De Graaf et al. |
| 2011/0182056 A1 | 7/2011 | Trottier et al. |
| 2011/0182065 A1 | 7/2011 | Negley et al. |
| 2011/0186874 A1* | 8/2011 | Shum .................. H01L 25/0753 257/88 |
| 2011/0198566 A1* | 8/2011 | Yoshizumi ............. B82Y 20/00 257/13 |
| 2011/0198979 A1 | 8/2011 | Shum et al. |
| 2011/0204763 A1 | 8/2011 | Shum et al. |
| 2011/0204779 A1 | 8/2011 | Shum et al. |
| 2011/0204780 A1 | 8/2011 | Shum et al. |
| 2011/0215348 A1 | 9/2011 | Trottier et al. |
| 2011/0223701 A1 | 9/2011 | Kyono et al. |
| 2011/0260188 A1 | 10/2011 | Choi et al. |
| 2011/0266552 A1 | 11/2011 | Tu et al. |
| 2011/0279998 A1 | 11/2011 | Su et al. |
| 2011/0317397 A1 | 12/2011 | Trottier et al. |
| 2012/0012856 A1 | 1/2012 | Chen et al. |
| 2012/0043552 A1 | 2/2012 | David et al. |
| 2012/0044667 A1* | 2/2012 | Hanawa .................. H01L 33/46 362/97.1 |

(56) References Cited

U.S. PATENT DOCUMENTS

| | | | |
|---|---|---|---|
| 2012/0061702 A1* | 3/2012 | Andrews | H01L 33/54 257/98 |
| 2012/0061709 A1* | 3/2012 | Pachler | H01L 33/60 257/98 |
| 2012/0086022 A1 | 4/2012 | Veerasamy et al. | |
| 2012/0086023 A1 | 4/2012 | Veerasamy et al. | |
| 2012/0086024 A1* | 4/2012 | Andrews | H01L 25/0753 257/88 |
| 2012/0088319 A1 | 4/2012 | Veerasamy et al. | |
| 2012/0091465 A1 | 4/2012 | Krames et al. | |
| 2012/0092853 A1* | 4/2012 | Daicho | C09K 11/7734 362/84 |
| 2012/0161163 A1* | 6/2012 | Kim | H01L 25/0753 257/88 |
| 2012/0187830 A1 | 7/2012 | Shum et al. | |
| 2012/0187862 A1* | 7/2012 | Britt | H01L 33/62 315/291 |
| 2012/0235201 A1 | 9/2012 | Shum | |
| 2012/0250310 A1* | 10/2012 | Hussell | H01L 25/0753 362/235 |
| 2012/0292649 A1 | 11/2012 | Sugiyama et al. | |
| 2012/0299051 A1 | 11/2012 | Jeong | |
| 2012/0299492 A1 | 11/2012 | Egawa et al. | |
| 2012/0313541 A1 | 12/2012 | Egawa et al. | |
| 2012/0319148 A1* | 12/2012 | Donofrio | H01L 33/54 257/98 |
| 2012/0320309 A1* | 12/2012 | Hineno | G02F 1/133609 349/64 |
| 2013/0020590 A1* | 1/2013 | Lin | H01L 33/60 257/88 |
| 2013/0020601 A1* | 1/2013 | Daicho | C09K 11/7734 257/98 |
| 2013/0022758 A1 | 1/2013 | Trottier | |
| 2013/0026483 A1 | 1/2013 | Sharma et al. | |
| 2013/0043799 A1 | 2/2013 | Siu et al. | |
| 2013/0050979 A1* | 2/2013 | Van De Ven | F21K 9/56 362/84 |
| 2013/0075773 A1* | 3/2013 | Kijima | H01L 33/502 257/98 |
| 2013/0119417 A1* | 5/2013 | Andrews | H01L 33/60 257/91 |
| 2013/0119426 A1* | 5/2013 | Katoh | H01L 33/486 257/98 |
| 2013/0126927 A1* | 5/2013 | Iguchi | H01L 33/60 257/98 |
| 2013/0207148 A1 | 8/2013 | Krauter et al. | |
| 2013/0234108 A1 | 9/2013 | David et al. | |
| 2013/0292728 A1 | 11/2013 | Ishimori et al. | |
| 2013/0313516 A1 | 11/2013 | David et al. | |
| 2013/0322089 A1 | 12/2013 | Martis et al. | |
| 2013/0323490 A1 | 12/2013 | D'Evelyn et al. | |
| 2014/0027789 A1 | 1/2014 | Katona et al. | |
| 2014/0042918 A1 | 2/2014 | Lee | |
| 2014/0070710 A1 | 3/2014 | Harris | |
| 2014/0091697 A1* | 4/2014 | Shum | F21K 9/1375 313/46 |
| 2014/0103356 A1 | 4/2014 | Krames et al. | |
| 2014/0119007 A1* | 5/2014 | Edmond | F21V 3/0472 362/235 |
| 2014/0145235 A1 | 5/2014 | Shum | |
| 2014/0175377 A1* | 6/2014 | D'Evelyn | H01L 33/44 257/13 |
| 2014/0218909 A1* | 8/2014 | Tetsuo | F21K 9/58 362/231 |
| 2014/0225137 A1 | 8/2014 | Krames et al. | |
| 2014/0301062 A1* | 10/2014 | David et al. | 362/84 |
| 2015/0049460 A1 | 2/2015 | David et al. | |
| 2015/0062892 A1 | 3/2015 | Krames et al. | |
| 2015/0155439 A1* | 6/2015 | Cich | H01L 33/32 362/294 |

FOREIGN PATENT DOCUMENTS

| | | |
|---|---|---|
| JP | H03-142963 | 6/1991 |
| JP | 06-334215 | 12/1994 |
| JP | H09-199756 | 7/1997 |
| JP | 2002-161000 | 6/2002 |
| JP | 2004-179644 | 6/2004 |
| JP | 2004-533391 | 11/2004 |
| JP | 2005-217421 | 8/2005 |
| JP | 2007-507115 | 3/2006 |
| JP | 2006-147933 | 6/2006 |
| JP | 2007-067418 | 3/2007 |
| JP | 2007-103371 | 4/2007 |
| JP | 2007-110090 | 4/2007 |
| JP | 2007-331973 | 12/2007 |
| JP | 2008-501600 | 1/2008 |
| JP | 2008-084973 | 4/2008 |
| JP | 2008-521737 | 6/2008 |
| JP | 2008-172040 | 7/2008 |
| JP | 2008-258503 | 10/2008 |
| JP | 2008-263154 | 10/2008 |
| JP | 2009-130097 | 6/2009 |
| JP | 2010-517274 | 9/2009 |
| JP | 2009-267164 | 11/2009 |
| JP | 2010-034487 | 2/2010 |
| JP | 2010-098068 | 4/2010 |
| JP | 2010-212493 | 9/2010 |
| JP | 2010-226110 | 10/2010 |
| JP | 2010-263128 | 11/2010 |
| JP | 2011-501351 | 1/2011 |
| JP | 2011-051863 | 3/2011 |
| JP | 2011-057763 | 3/2011 |
| JP | 2011-068503 | 4/2011 |
| JP | 2011-077325 | 4/2011 |
| JP | 2011142254 | * 7/2011 |
| JP | 2011-148655 | 8/2011 |
| JP | 2011-151419 | 8/2011 |
| JP | 2010232525 | * 10/2011 |
| JP | 2011-219304 | 11/2011 |
| JP | 2011-222760 | 11/2011 |
| JP | 2011-230998 | 11/2011 |
| JP | 2011-243963 | 12/2011 |
| JP | 2012-001432 | 1/2012 |
| JP | 2012-056970 | 3/2012 |
| JP | 2012-064860 | 3/2012 |
| JP | 2012-512119 | 5/2012 |
| WO | WO 2006/062880 | 6/2006 |
| WO | WO 2008/091846 | 7/2008 |
| WO | WO 2009/001039 | 12/2008 |
| WO | WO 2009/066430 | 5/2009 |
| WO | WO 2010/119375 | 10/2010 |
| WO | WO 2010/150880 | 12/2010 |
| WO | WO 2011/010774 | 1/2011 |
| WO | WO 2011/034226 | 3/2011 |
| WO | WO 2011/035265 | 3/2011 |
| WO | WO 2011/097393 | 8/2011 |
| WO | WO 2012/022813 | 2/2012 |
| WO | WO 2012/024636 | 2/2012 |

OTHER PUBLICATIONS

Morkoc, 'Handbook of Nitride Semiconductors and Devices', vol. 1, 2008, p. 704.

UPSTO Office Action for U.S. Appl. No. 13/135,087 dated Aug. 15, 2014 (12 pages).

USPTO Notice of Allowance for U.S. Appl. No. 13/973,213 dated Sep. 16, 2014 (7 pages).

USPTO Office Action for U.S. Appl. No. 14/022,587 dated Jul. 30, 2014 (9 pages).

USPTO Office Action for U.S. Appl. No. 14/054,234 dated Aug. 14, 2014 (24 pages).

International Search Report of PCT Application No. PCT/US2011/023622, dated Apr. 1, 2011, 2 pages total.

Saito et al., 'Plane Dependent Growth of GaN in Supercritical Basic Ammonia', Applied Physics Express, vol. 1, No. 12, Dec. 2008, pp. 121103-1-121103-3.

Communication from the Japanese Patent Office re 2013-117510 dated Sep. 24, 2014 (8 pages).

(56) References Cited

OTHER PUBLICATIONS

Zhong et al., 'High Power and High Efficiency Blue Light Emitting Diode on Freestanding Semipolar (1011) Bulk GaN Substrate', Applied Physics Letter, vol. 90, No. 23, 2007, pp. 233504-1-233504-3.

Zhong et al., 'Demonstration of High Power Blue-Green Light Emitting Diode on Semipolar (1122) Bulk GaN Substrate', Electronics Letters, vol. 43, No. 15, 2007, pp. 825-826.

USPTO Office Action for U.S. Appl. No. 13/019,897 dated Dec. 5, 2014 (18 pages).

USPTO Office Action for U.S. Appl. No. 13/210,769 dated Oct. 10, 2014 (10 pages).

USPTO Notice of Allowance for U.S. Appl. No. 13/781,633 dated Nov. 28, 2014 (9 pages).

USPTO Notice of Allowance for U.S. Appl. No. 13/909,752 dated Sep. 30, 2014 (9 pages).

Communication from the Japanese Patent Office re 2013-263760 dated Nov. 14, 2014 (11 pages).

Caliper, 'CALiPER Application Summary Report 22: LED MR16 Lamps', Solid-State Lighting Program, Jun. 2014, pp. 1-25.

Chhajed et al., 'Junction temperature in light-emitting diodes assessed by different methods', Future Chips Constellation, not dated, pp. 1-9.

Cich et al., 'Bulk GaN based violet light-emitting diodes with high efficiency at very high current density', Applied Physics Letters, Nov. 29, 2012, pp. 223509-1-223509-3.

Csuti et al., 'Color-matching experiments with RGB-LEDs', Color Research and Application, vol. 33, No. 2, 2008, pp. 1-9.

David et al., 'Carrier distribution in (0001)InGaN/GaN multiple quantam well light-emitting diodes', Applied Physics Letters, vol. 92, No. 053502, Feb. 4, 2008, pp. 1-3.

David et al., 'Influence of polarization fields on carrier lifetime and recombination rates in InGaN-based light-emitting diodes', Applied Physics Letters, vol. 97, No. 033501, Jul. 19, 2010, pp. 1-3.

Davis et al., 'Color quality scale', Optical Engineering, vol. 49, No. 3, Mar. 2010, pp. 033602-1-036602-16.

Gardner et al., 'Blue-Emitting InGaN—GaN Double-Heterostructure Light-Emitting Diodes Reaching Maximum Quantum Efficiency Above 200 A/cm2', Applied Physics Letters. vol. 91, 2007, pp. 243506-1-243506-3.

Hayakawa et al., 'Analysis of trace Co in synthetic diamonds using synchroton radiation excited X-ray fluorescence analysis', Journal of Crystal Growth, vol. 210, Mar. 1, 2000, pp. 388-394.

Houser et al., 'Review of measures for light-source color rendition and considerations for a two-measure system for characterizing color rendition', Optics Express, vol. 21, No. 8, Apr. 19, 2013, pp. 10393-10411.

Paper and Board Determination of CIE Whiteness, D65/10 (outdoor daylight), ISO International Standard 11475:2004E (2004), 18 pgs.

Kumar et al., 'Guest Editorial Special Issue on Light-Emitting Diodes', IEEE Transactions on Electron Devices, vol. 57, No. 1, Jan. 2010, pp. 7-11.

Laufer et al., 'Determination of secondary ion mass spectrometry relative sensitivity factors for polar and non-polar ZnO', Journal of Applied Physics, vol. 110, 2011, pp. 094606-1-094906-5.

Madelung, 'III-V Compounds', Semiconductors: Data Handbook, Springer Verlag, Berlin-Heidelberg, vol. 3, Ch. 2, 2004, pp. 71-172.

Masui et al., 'Electrical Characteristics of Nonpolar InGaN-Based Light-Emitting Diodes Evaluated at Low Temperature', Japanese Journal of Applied Physics, vol. 46, No. 11, 2007, pp. 7309-7310.

Michiue et al., 'Recent Development of Nitride LEDs and LDs', Proceedings of SPIE, vol. 7216, 2009, pp. 72161Z-1-72161Z-6.

Narendran et al., 'Color Rendering Properties of LED Light Sources', Solid State Lighting II: Proceedings of SPIE, 2002, pp. 1-8.

Narukawa et al., 'White light emitting diodes with super-high luminous efficacy', Journal of Physics D: Applied Physics, vol. 43, No. 354002, Aug. 19, 2010, pp. 1-6.

http://www.philipslumileds.com/products/luxeon-flash, 'LUXEON Flash', Philips Lumileds, Aug. 8, 2013, pp. 1-2.

Sato et al., 'High Power and High Efficiency Semipolar InGaN Light Emitting Diodes', Journal of Light and Visible Environment, vol. 32, No. 2, Dec. 13, 2007, pp. 57-60.

Sato et al., 'High Power and High Efficiency Semipolar InGaN Light Emitting Diodes', Journal of Light and Visible Environment, vol. 32, No. 2, Feb. 12, 2008, pp. 107-110.

Sekiguchi et al., 'Hydrothermal growth of ZnO single crystals and their optical characterization', Journal of Crystal Growth, vol. 214-215, Jun. 2, 2000, pp. 72-76.

Shen et al., 'Auger Recombination in Letters InGaN Measured by Photoluminescence', Applied Physics Letters, vol. 91, 2007, pp. 141101-1-141101-3.

Tomiya et al., 'Dislocation Related Issues in the Degradation of GaN-Based Laser Diodes', IEEE Journal of Selected Topics in Quantum Electronics, vol. 10, No. 6, 2004, pp. 1277-1287.

Communication from the Chinese Patent Office re 201080052148.X dated Apr. 11, 2014 (5 pages).

Communication from the Japanese Patent Office re 2012-529969 dated Jul. 4, 2014 (8 pages).

Communication from the Japanese Patent Office re 2012-529969 dated Dec. 5, 2014 (2 pages).

Communication from the Japanese Patent Office re 2012-5520086 dated Nov. 28, 2014 (6 pages).

Communication from the Japanese Patent Office re 2013097298 dated Jun. 6, 2014 (7 pages).

Communication from the Japanese Patent Office re 2012-529969, dated Oct. 15, 2013, (6 pages).

Weaver et al., 'Optical Properties of Selected Elements', Handbook of Chemistry and Physics, vol. 94, 2013-2014, pp. 12-126-12-140.

Whitehead et al., 'A Monte Carlo method for assessing color rendering quality with possible application to color rendering standards', Color Research and Application, vol. 37, No. 1, Feb. 2012, pp. 13-22.

USPTO Office Action for U.S. Appl. No. 12/749,466 dated Jul. 3, 2012 (18 pages).

USPTO Notice of Allowance for U.S. Appl. No. 12/754,886 dated May 17, 2012 (19 pages).

USPTO Notice of Allowance for U.S. Appl. No. 12/754,886 dated Jun. 5, 2012 (16 pages).

USPTO Notice of Allowance for U.S. Appl. No. 12/754,886 dated Jun. 20, 2012 (14 pages).

USPTO Office Action for U.S. Appl. No. 12/936,238 dated Aug. 30, 2012 (11 pages).

USPTO Office Action for U.S. Appl. No. 12/936,238 dated Jan. 30, 2013 (12 pages).

USPTO Notice of Allowance for U.S. Appl. No. 12/936,238 dated Apr. 16, 2013 (9 pages).

USPTO Office Action for U.S. Appl. No. 13/025,791 dated Nov. 25, 2011 (11 pages).

USPTO Office Action for U.S. Appl. No. 13/025,791 dated Feb. 20, 2013 (13 pages).

USPTO Notice of Allowance for U.S. Appl. No. 13/025,791 dated Jun. 17, 2013 (8 pages).

USPTO Office Action for U.S. Appl. No. 13/328,978 dated May 15, 2013 (24 pages).

USPTO Office Action for U.S. Appl. No. 13/328,978 dated Sep. 26, 2013 (25 pages).

USPTO Notice of Allowance for U.S. Appl. No. 13/328,978 dated Mar. 18, 2014 (13 pages).

USPTO Office Action for U.S. Appl. No. 13/357,315 dated Dec. 31, 2014 (22 pages).

USPTO Notice of Allowance for U.S. Appl. No. 13/623,788 dated Aug. 20, 2013 (11 pages).

USPTO Office Action for U.S. Appl. No. 13/787,582 dated Jan. 22, 2015 (16 pages).

USPTO Notice of Allowance for U.S. Appl. No. 13/856,613 dated Nov. 21, 2014 (8 pages).

USPTO Office Action for U.S. Appl. No. 13/904,237 dated Dec. 29, 2014 (20 pages).

USPTO Notice of Allowance for U.S. Appl. No. 13/931,359 dated Dec. 23, 2013 (10 pages).

USPTO Office Action for U.S. Appl. No. 13/959,422 dated Oct. 8, 2013 (10 pages).

(56) References Cited

OTHER PUBLICATIONS

USPTO Notice of Allowance for U.S. Appl. No. 13/959,422 dated Jul. 9, 2014 (7 pages).
USPTO Office Action for U.S. Appl. No. 14/054,234 dated Mar. 6, 2015 (20 pages).
USPTO Office Action for U.S. Appl. No. 14/097,043 dated Oct. 15, 2014 (11 pages).
USPTO Office Action for U.S. Appl. No. 14/191,950 dated Aug. 18, 2014 (7 pages).
USPTO Notice of Allowance for U.S. Appl. No. 14/256,670 dated Aug. 4, 2014 (12 pages).
USPTO Notice of Allowance for U.S. Appl. No. 14/256,670 dated Sep. 19, 2014 (2 pages).
USPTO Notice of Allowance for U.S. Appl. No. 14/310,957 dated Oct. 8, 2014 (9 pages).
USPTO Notice of Allowance for U.S. Appl. No. 14/310,957 dated Nov. 28, 2014 (6 pages).
USPTO Notice of Allowance for U.S. Appl. No. 14/528,876 dated Jan. 28, 2015 (8 pages).
Benke et al., 'Uncertainty in Health Risks from Artificial Lighting due to Disruption of Circadian Rythm and Melatonin Secretion: A Review', Human and Ecological Risk Assessment: An International Journal, vol. 19, No. 4, 2013, p. 916-929.
Hanifin et al., 'Photoreception for Circadian, Neuroendocrine, and Neurobehavioral Regulation', Journal of Physiological Anthropology, vol. 26, 2007, p. 87-94.
Iso et al., 'High Brightness Blue InGaN/GaN Light Emitting Diode on Nonpolar m-Plane Bulk GaN Substrate', Japanese Journal of Applied Physics, vol. 46, No. 40, 2007, p. L960-L962.
International Search Report & Written Opinion of PCT Application No. PCT/US2013/029453, dated Jul. 25, 2013, 11 pages total.
Rea et al., 'White Lighting', Color Research and Application, vol. 38, No. 2, Sep. 3, 2011, p. 82-92.
Sato et al., 'Optical Properties of Yellow Light-Emitting Diodes Grown on Semipolar (1122) Bulk GaN Substrate', Applied Physics Letters, vol. 92, No. 22, 2008, p. 221110-1-221110-3.
Communication from the Chinese Patent Office re 200980134876.2 dated Mar. 6, 2014, (10 pages).
Communication from the Japanese Patent Office re 2011-522191 dated Mar. 28, 2014, (6 pages).
Communication from the Korean Patent Office re 10-2012-7009980 dated Apr. 15, 2013, (6 pages).
Weaver et al., 'Optical Properties of Selected Elements', Handbook of Chemistry and Physics, 94th Edition, 2013-2014, p. 12-126-12-150.
USPTO Office Action for U.S. Appl. No. 12/491,176 dated Mar. 1, 2012 (9 pages).
USPTO Office Action for U.S. Appl. No. 12/491,176 dated Jul. 19, 2012 (13 pages).
USPTO Office Action for U.S. Appl. No. 12/491,176 dated Nov. 22, 2013 (14 pages).
USPTO Office Action for U.S. Appl. No. 12/879,784 dated Jan. 25, 2012 (6 pages).
USPTO Notice of Allowance for U.S. Appl. No. 12/879,784 dated Apr. 3, 2012 (7 pages).
USPTO Office Action for U.S. Appl. No. 12/914,789 dated Oct. 12, 2011 (7 pages).
USPTO Office Action for U.S. Appl. No. 12/914,789 dated Feb. 24, 2012 (8 pages).
USPTO Notice of Allowance for U.S. Appl. No. 12/914,789 dated May 17, 2012 (5 pages).
USPTO Office Action for U.S. Appl. No. 13/019,897 dated Mar. 30, 2012 (14 pages).
USPTO Office Action for U.S. Appl. No. 13/019,897 dated Jan. 16, 2013 (7 pages).
USPTO Office Action for U.S. Appl. No. 13/019,897 dated Dec. 2, 2013 (17 pages).
USPTO Office Action for U.S. Appl. No. 13/019,897 dated Jun. 12, 2014 (8 pages).
USPTO Office Action for U.S. Appl. No. 13/025,833 dated Jul. 12, 2012 (15 pages).
USPTO Office Action for U.S. Appl. No. 13/135,087 dated Sep. 27, 2013 (7 pages).
USPTO Office Action for U.S. Appl. No. 13/210,769 dated Apr. 3, 2013 (13 pages).
USPTO Office Action for U.S. Appl. No. 13/210,769 dated Oct. 28, 2013 (9 pages).
USPTO Notice of Allowance for U.S. Appl. No. 13/298,905 dated Jun. 11, 2013 (8 pages).
USPTO Office Action for U.S. Appl. No. 13/357,315 dated Oct. 15, 2013 (12 pages).
USPTO Office Action for U.S. Appl. No. 13/472,356 dated Dec. 9, 2013 (11 pages).
USPTO Office Action for U.S. Appl. No. 13/472,356 dated Jun. 5, 2014 (12 pages).
USPTO Office Action for U.S. Appl. No. 13/482,956 dated Aug. 17, 2012 (9 pages).
USPTO Office Action for U.S. Appl. No. 13/482,956 dated Feb. 14, 2013 (15 pages).
USPTO Office Action for U.S. Appl. No. 13/482,956 dated Jul. 22, 2013 (16 pages).
USPTO Notice of Allowance for U.S. Appl. No. 13/482,956 dated Oct. 28, 2013 (9 pages).
USPTO Office Action for U.S. Appl. No. 13/600,988 dated Jul. 18, 2013 (12 pages).
USPTO Notice of Allowance for U.S. Appl. No. 13/600,988 dated Sep. 16, 2013 (9 pages).
USPTO Office Action for U.S. Appl. No. 13/781,633 dated Mar. 6, 2014 (11 pages).
USPTO Office Action for U.S. Appl. No. 13/904,237 dated May 22, 2014 (13 pages).
USPTO Office Action for U.S. Appl. No. 14/171,885 dated Mar. 28, 2014 (8 pages).

\* cited by examiner

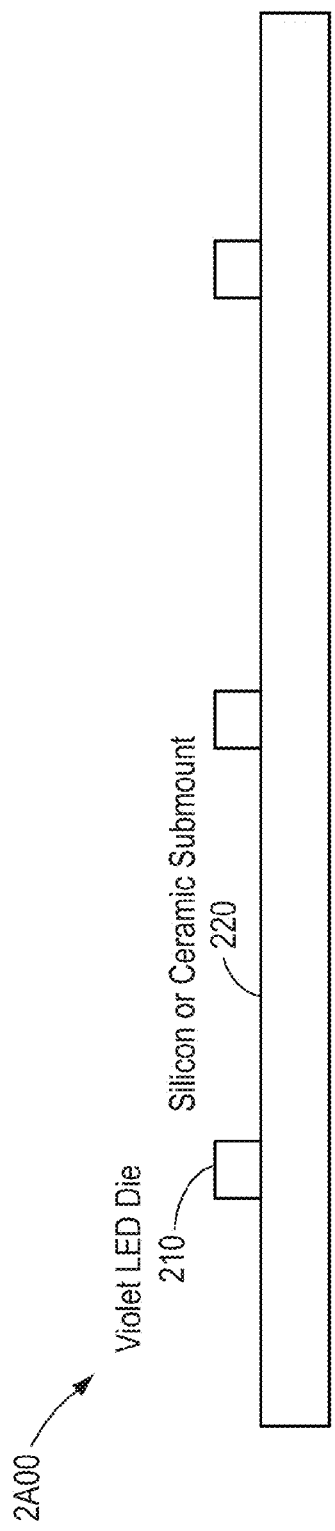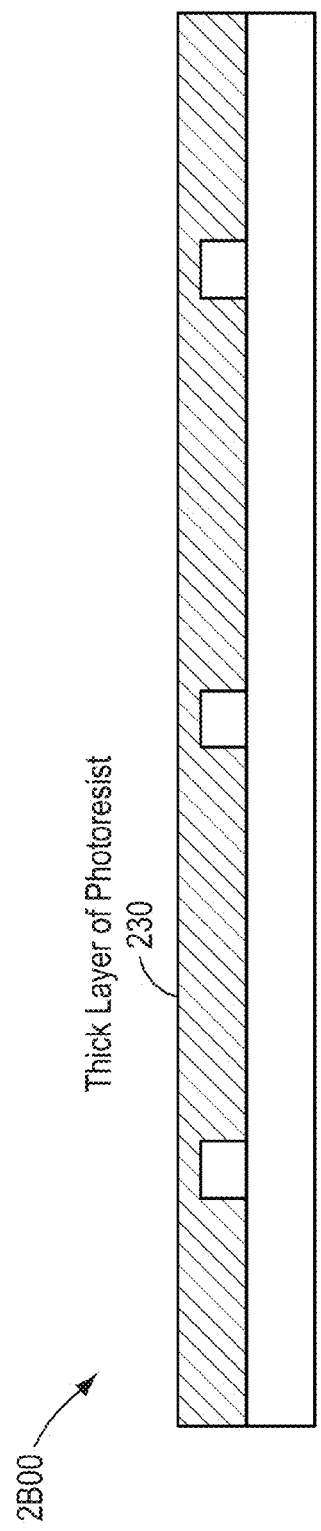

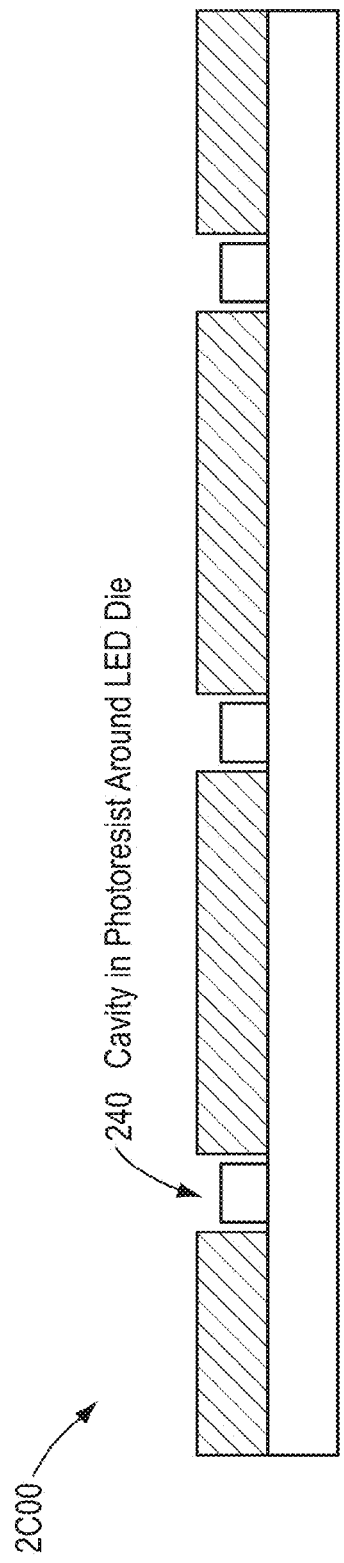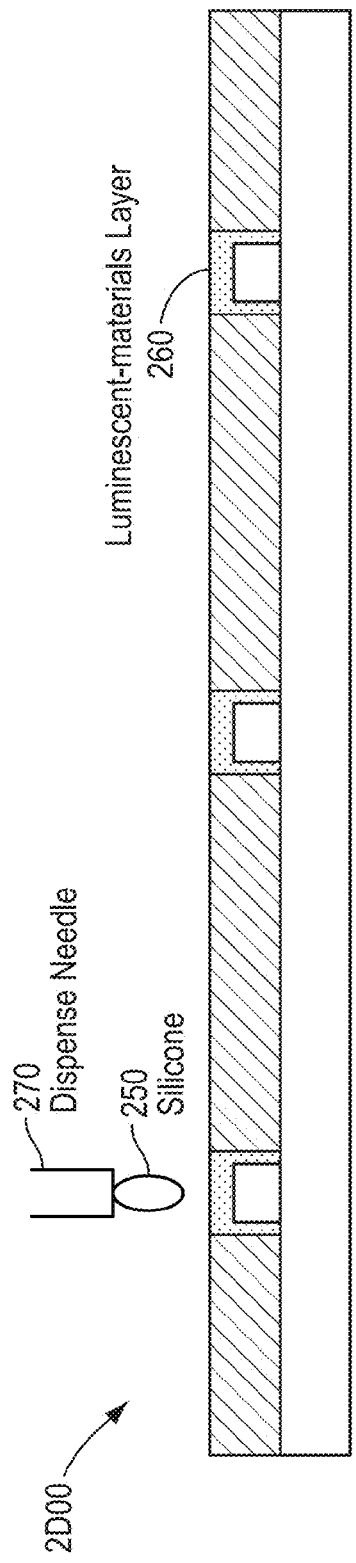

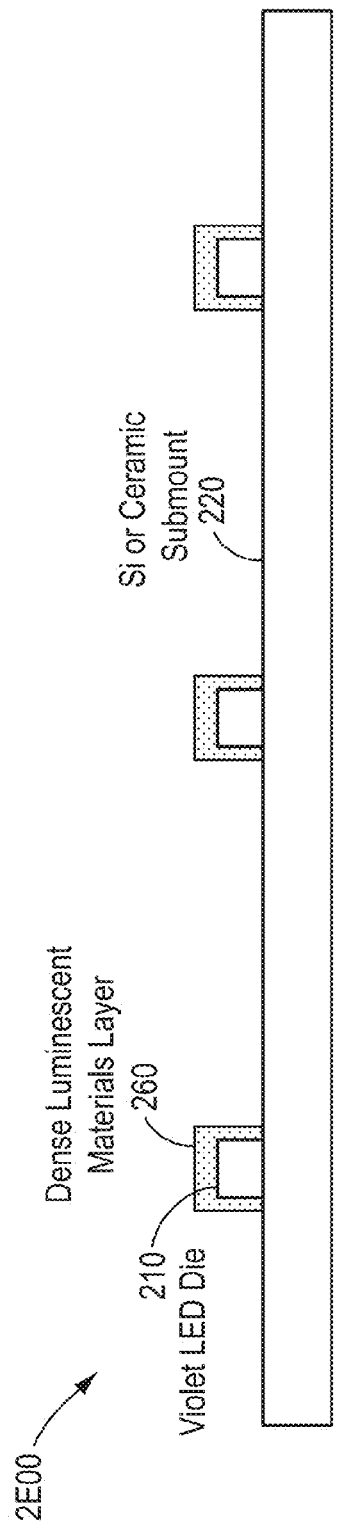
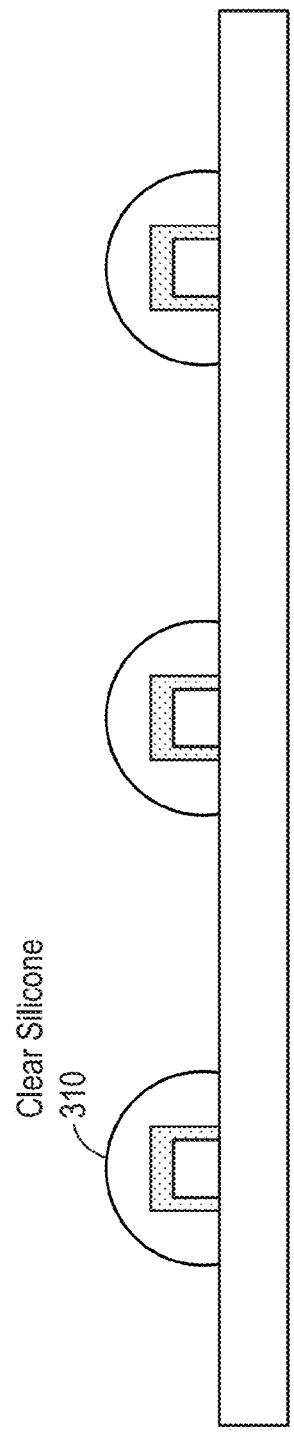

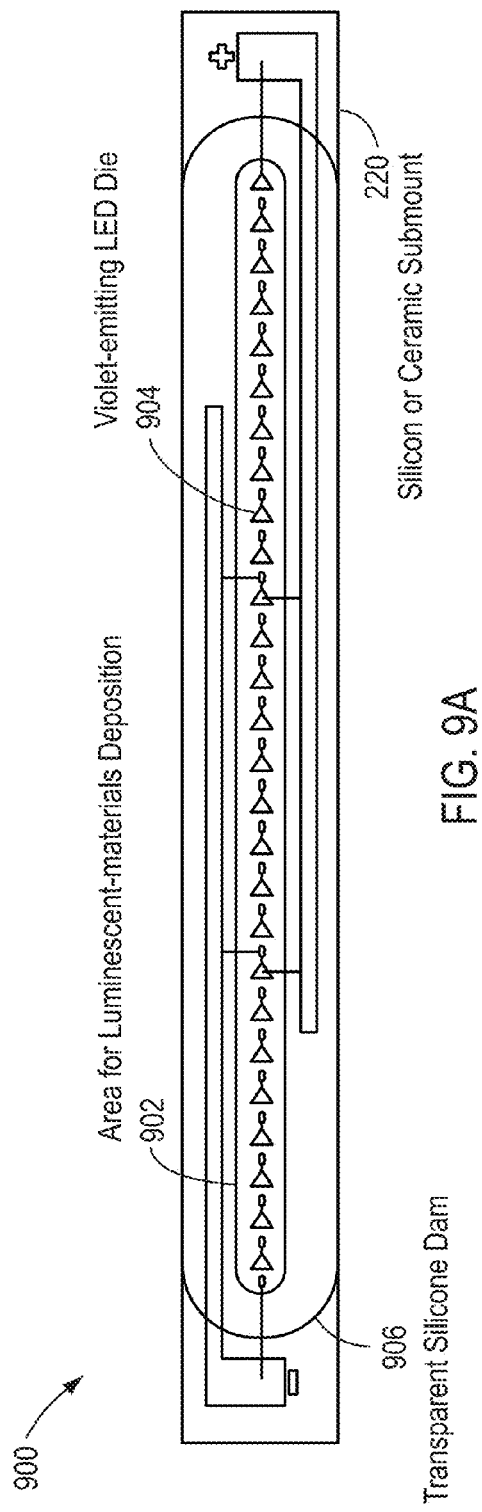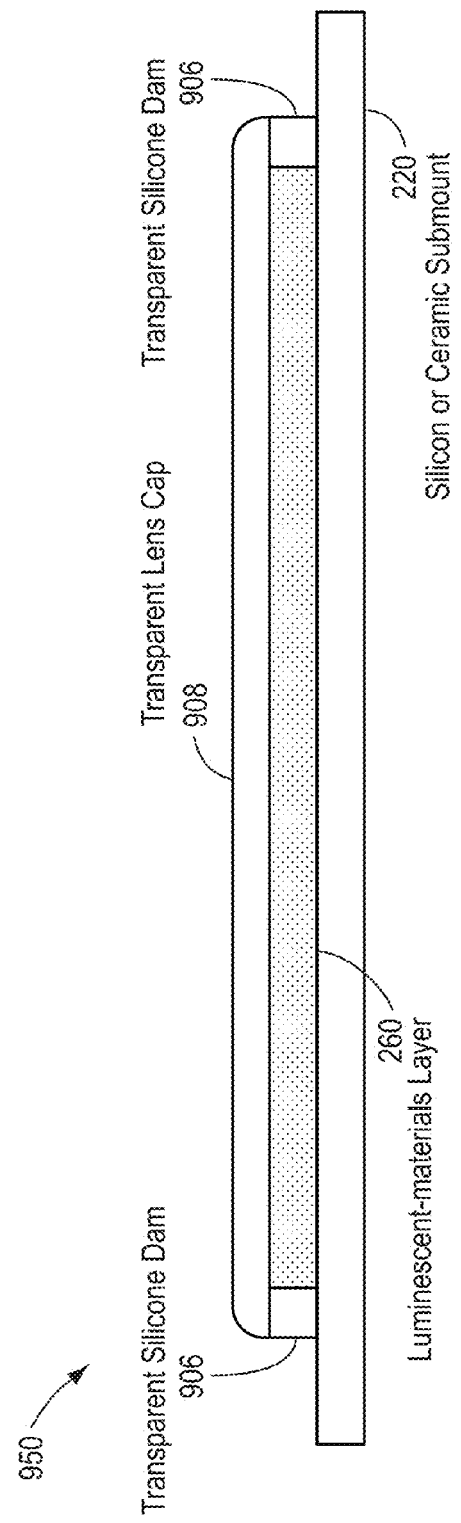
FIG. 9A
FIG. 9B

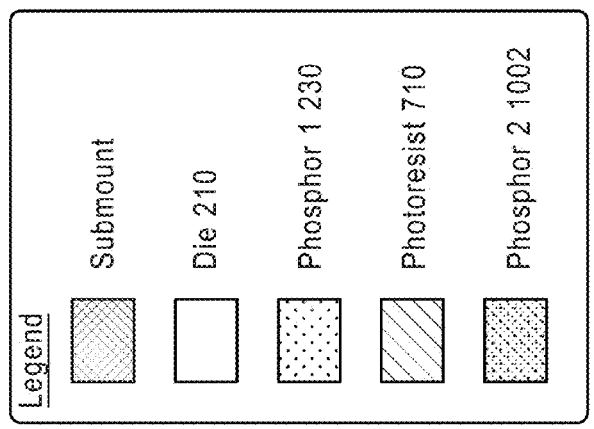
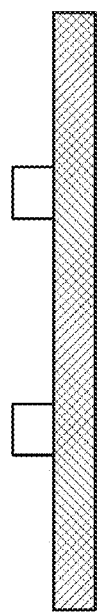
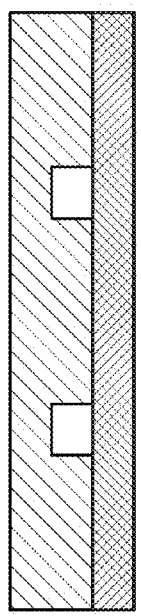
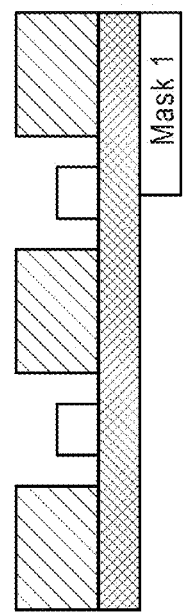
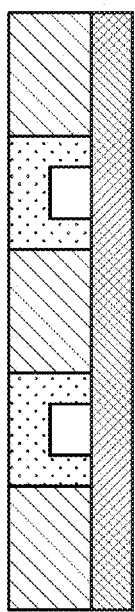

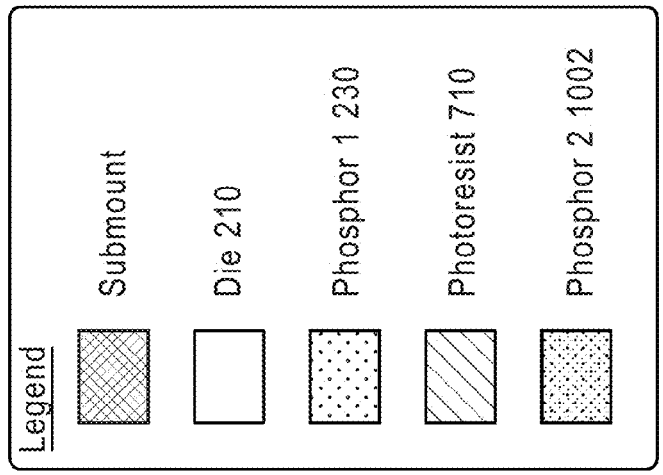
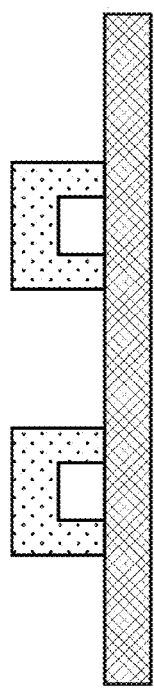
FIG. 10E
10E00
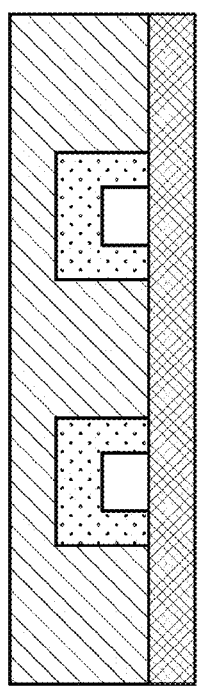
FIG. 10F
10F00
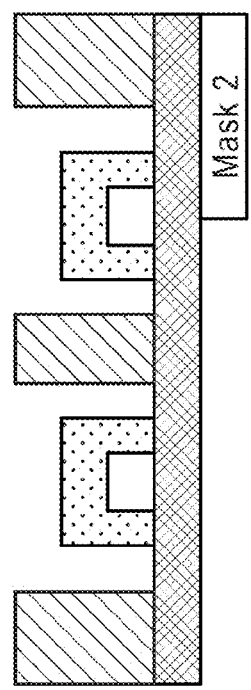
FIG. 10G
10G00

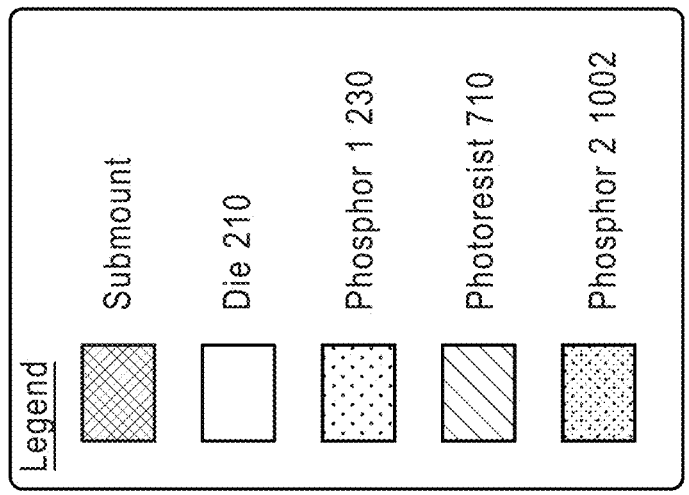
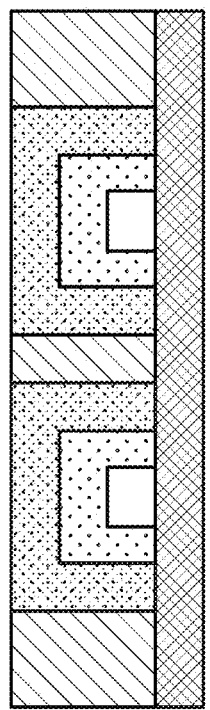
FIG. 10H
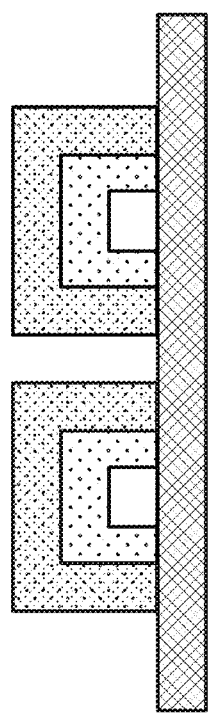
FIG. 10I

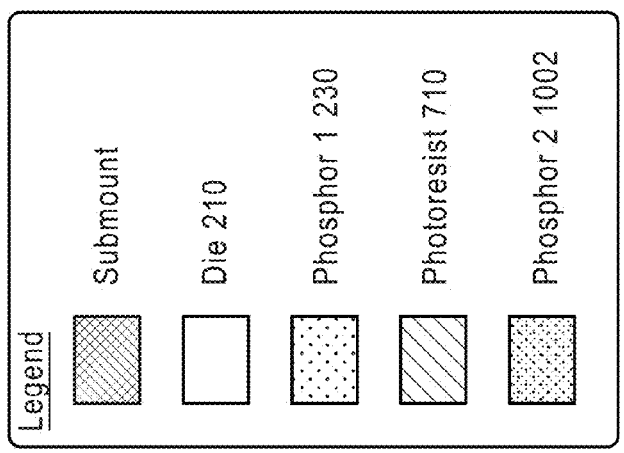
FIG. 11A
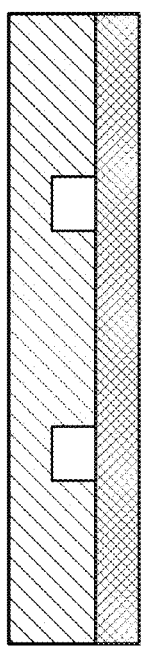
FIG. 11B
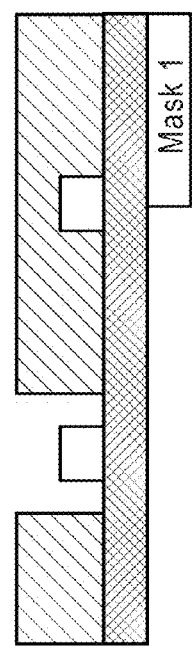
FIG. 11C
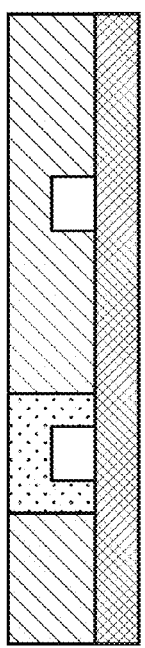
FIG. 11D

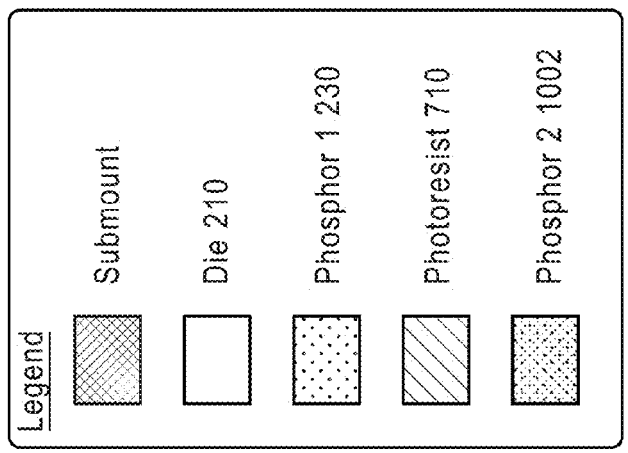
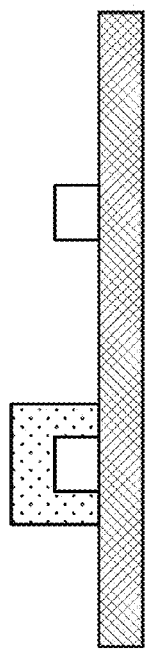
FIG. 11E
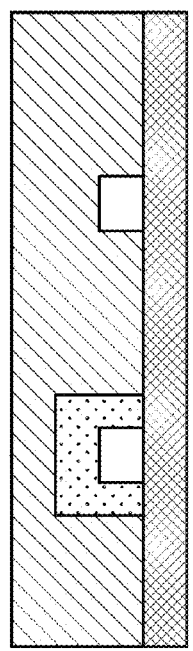
FIG. 11F
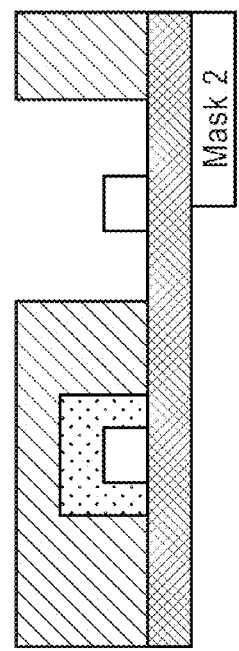
FIG. 11G

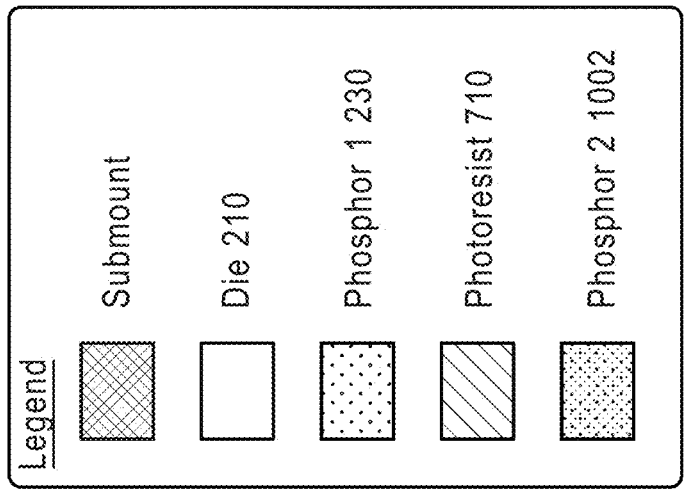
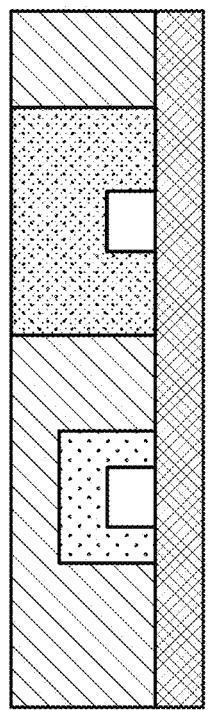
FIG. 11H
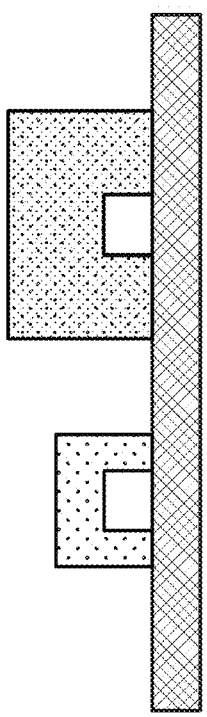
FIG. 11I

13C00

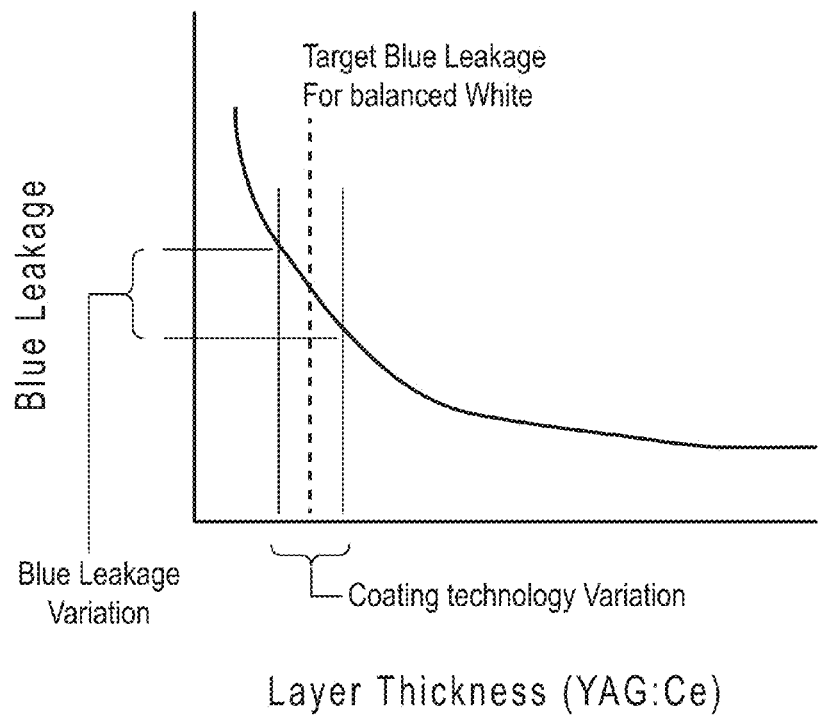
FIG. 13E
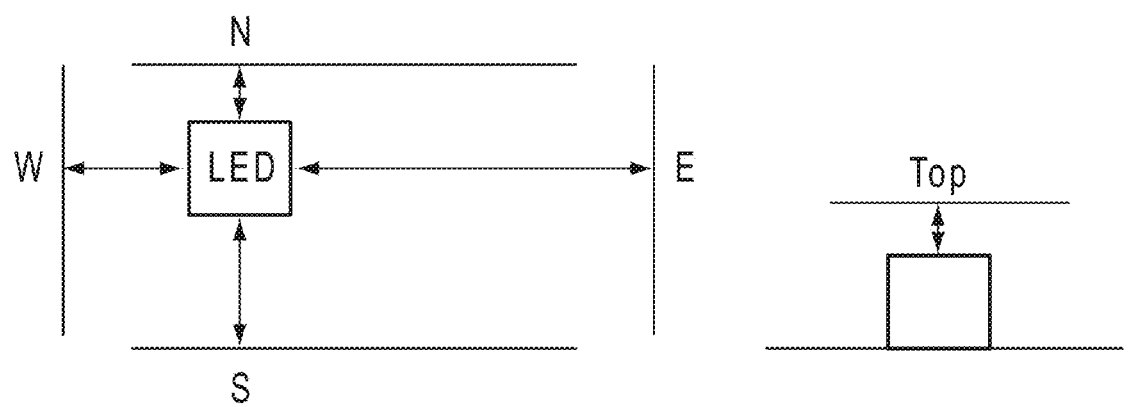
FIG. 13F1
FIG. 13F2

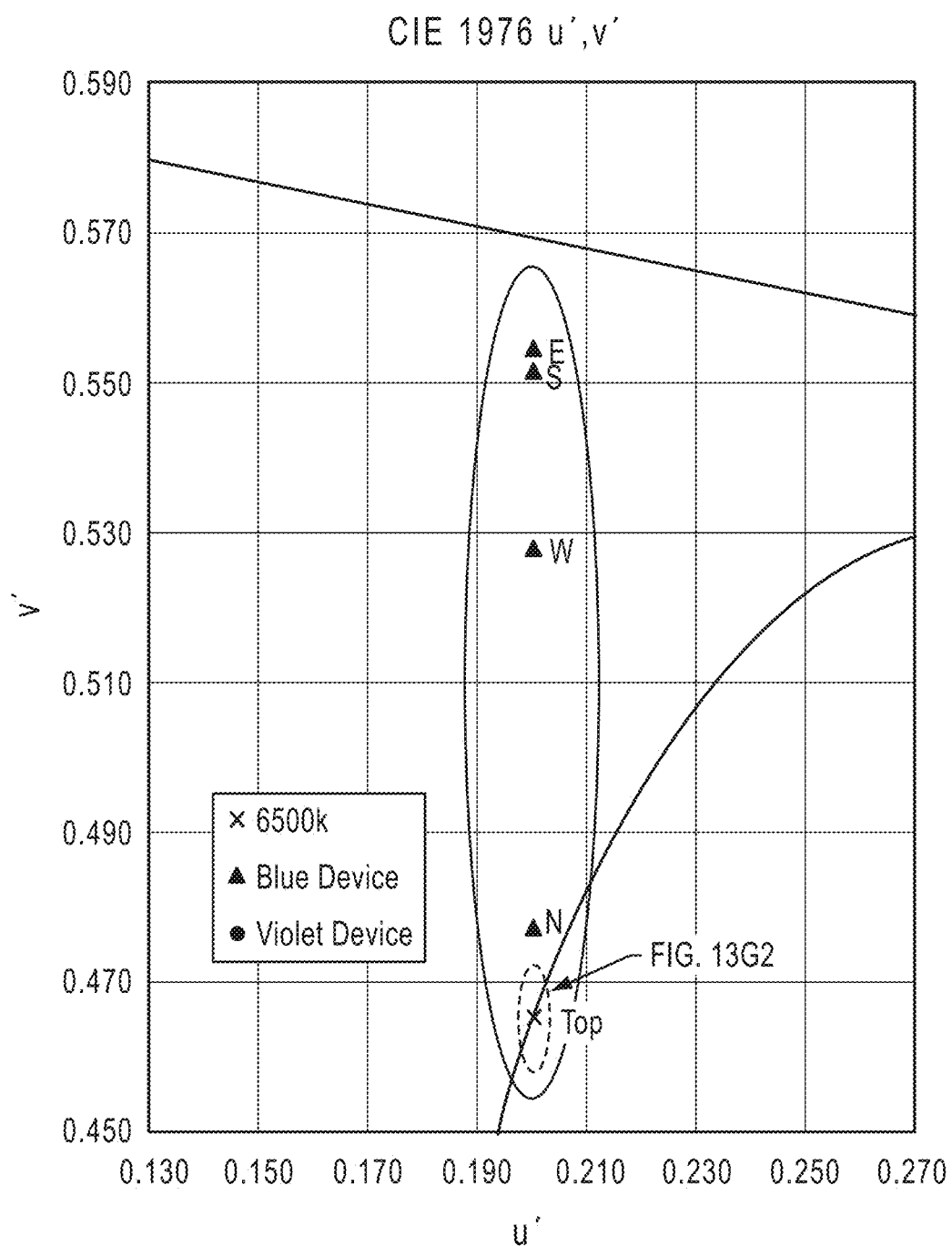
FIG. 13G1

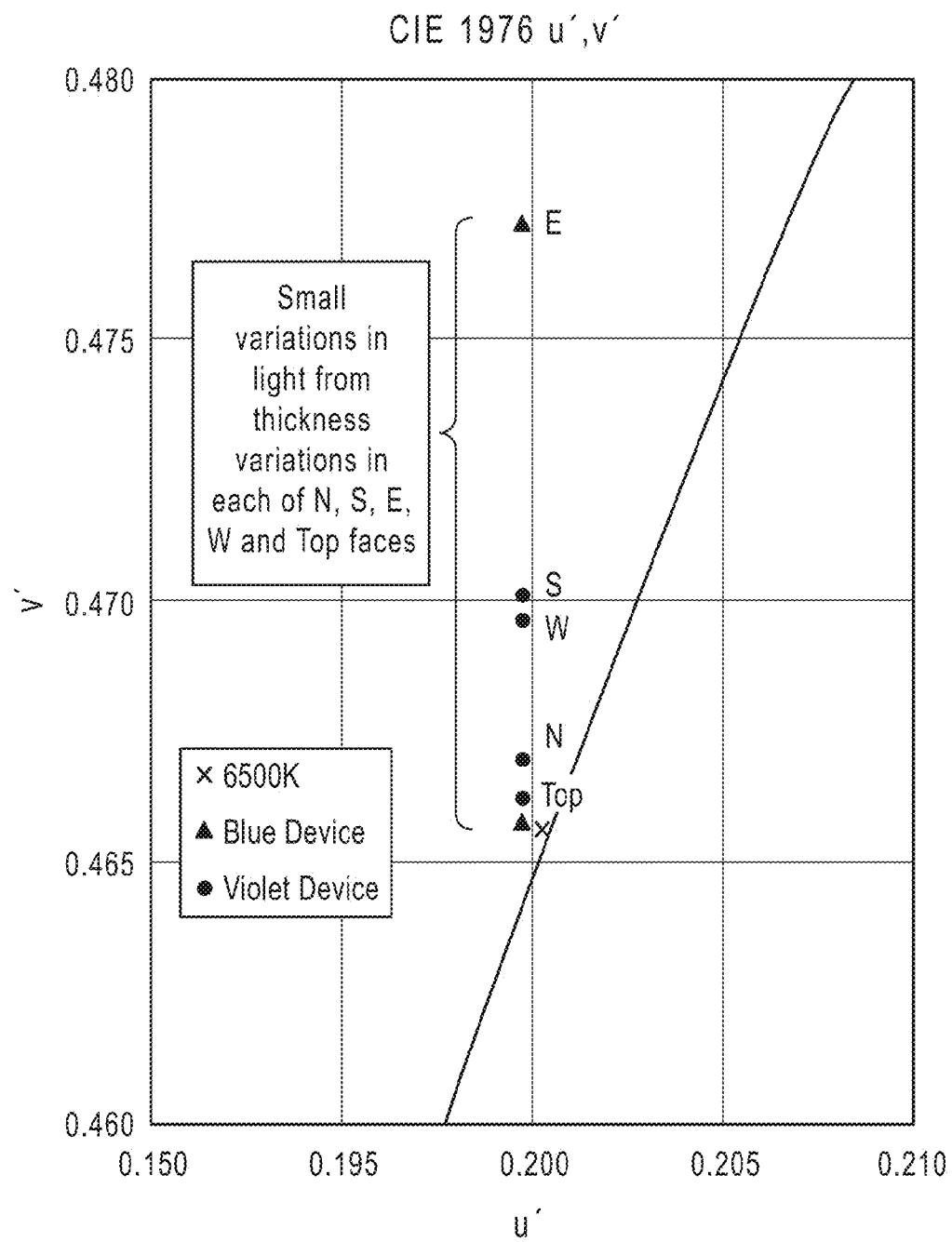
FIG. 13G2

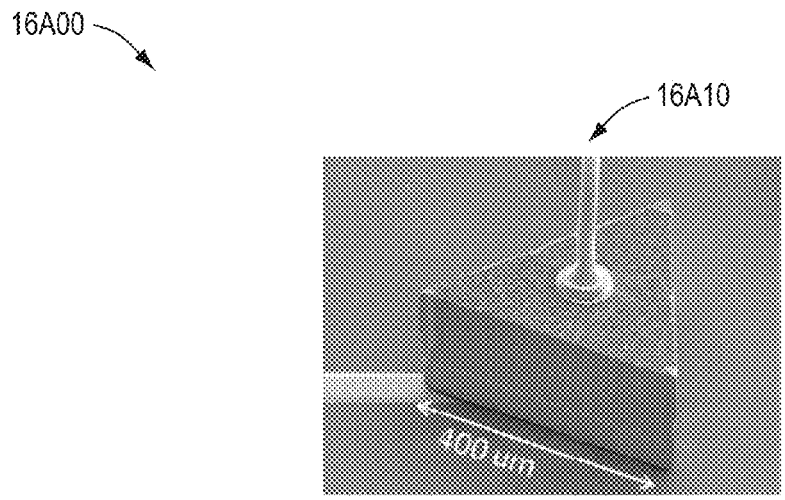
FIG. 16A1
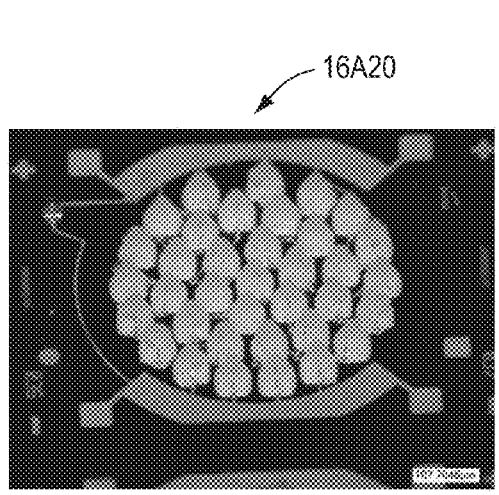
FIG. 16A2
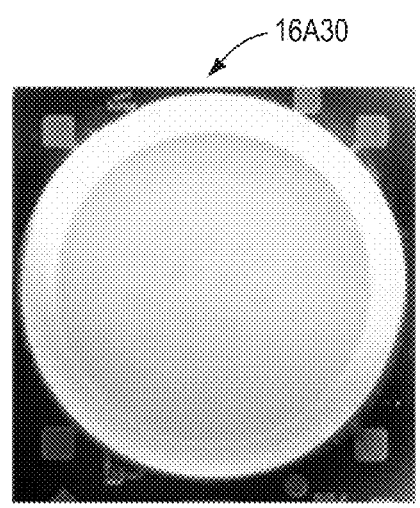
FIG. 16A3

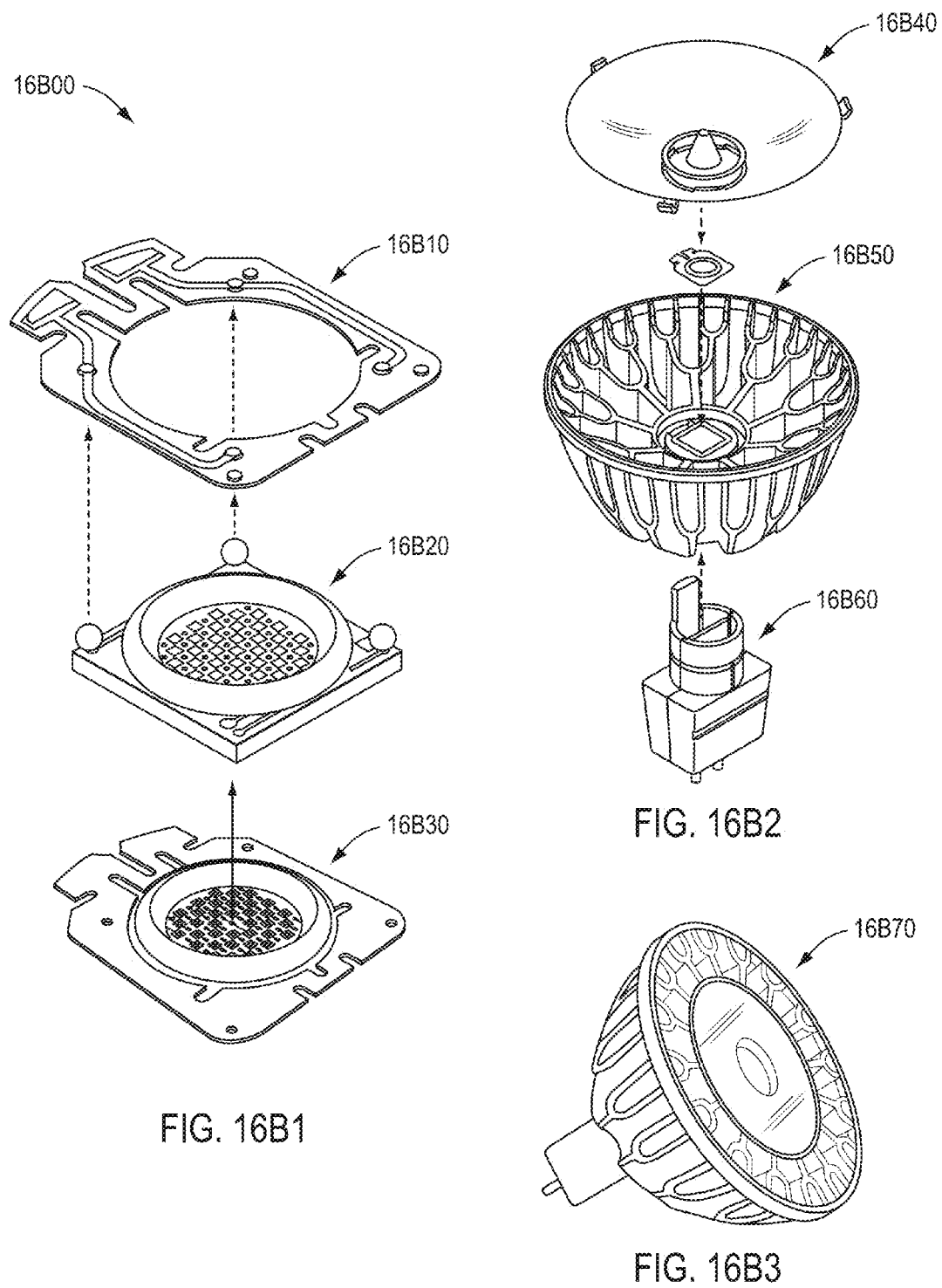
FIG. 16B1
FIG. 16B2
FIG. 16B3

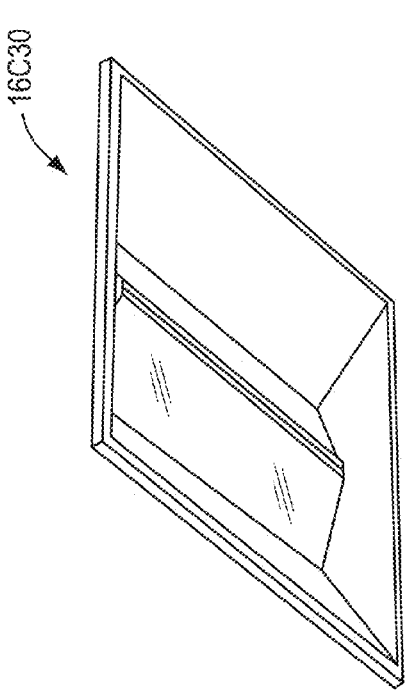
FIG. 16C1
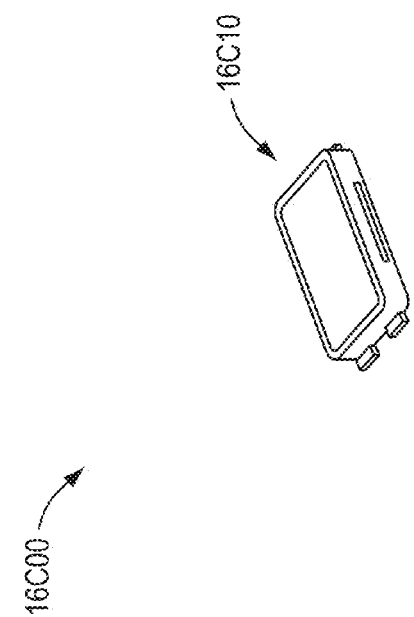
FIG. 16C3
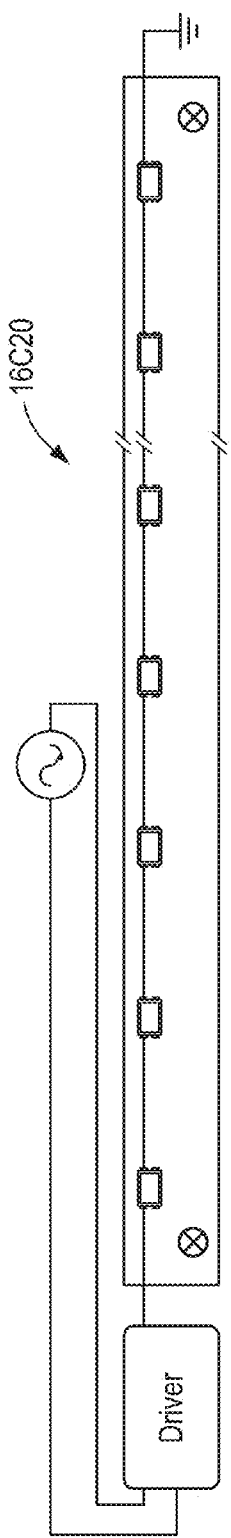
FIG. 16C2

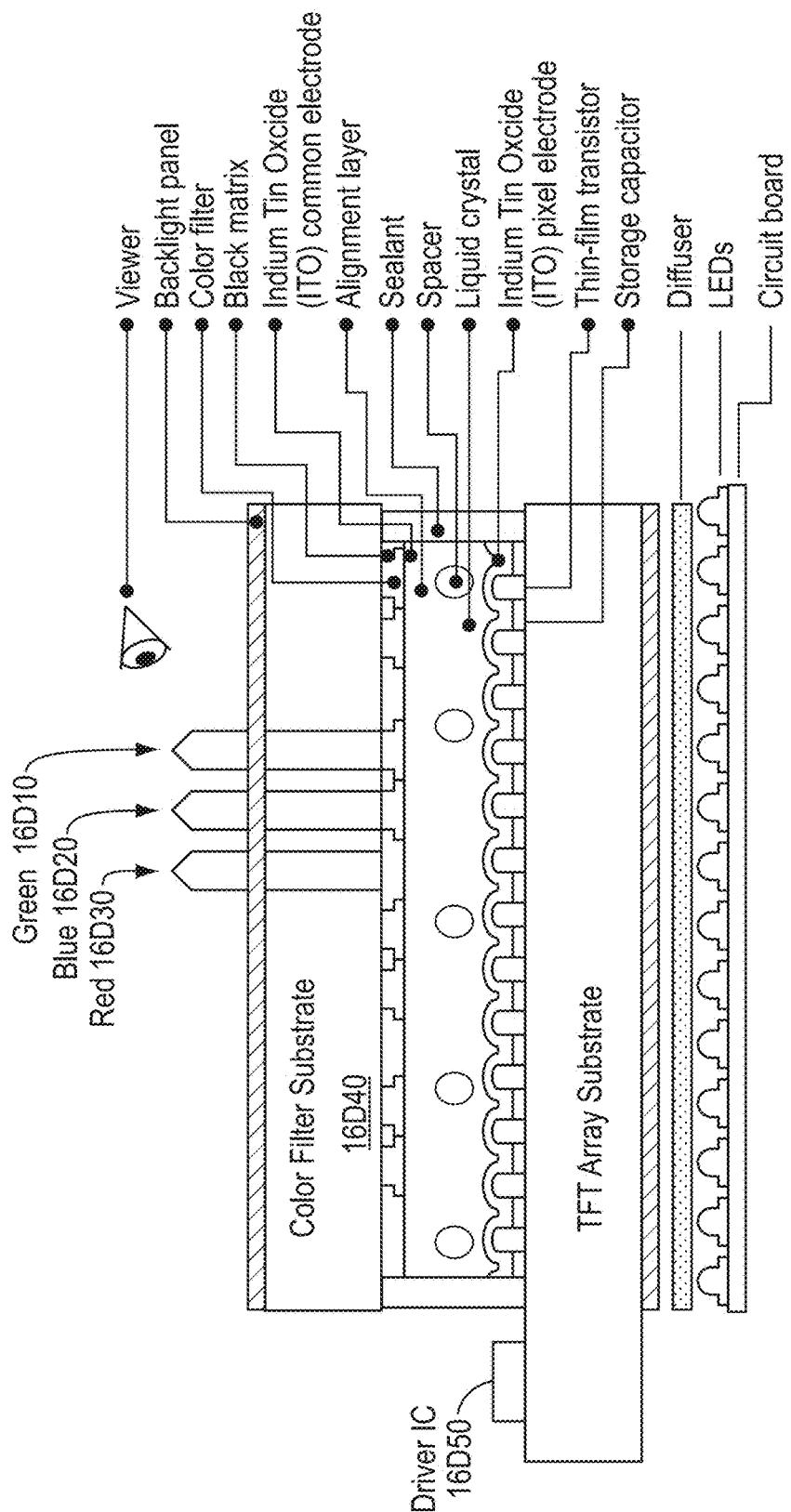
FIG. 16D1

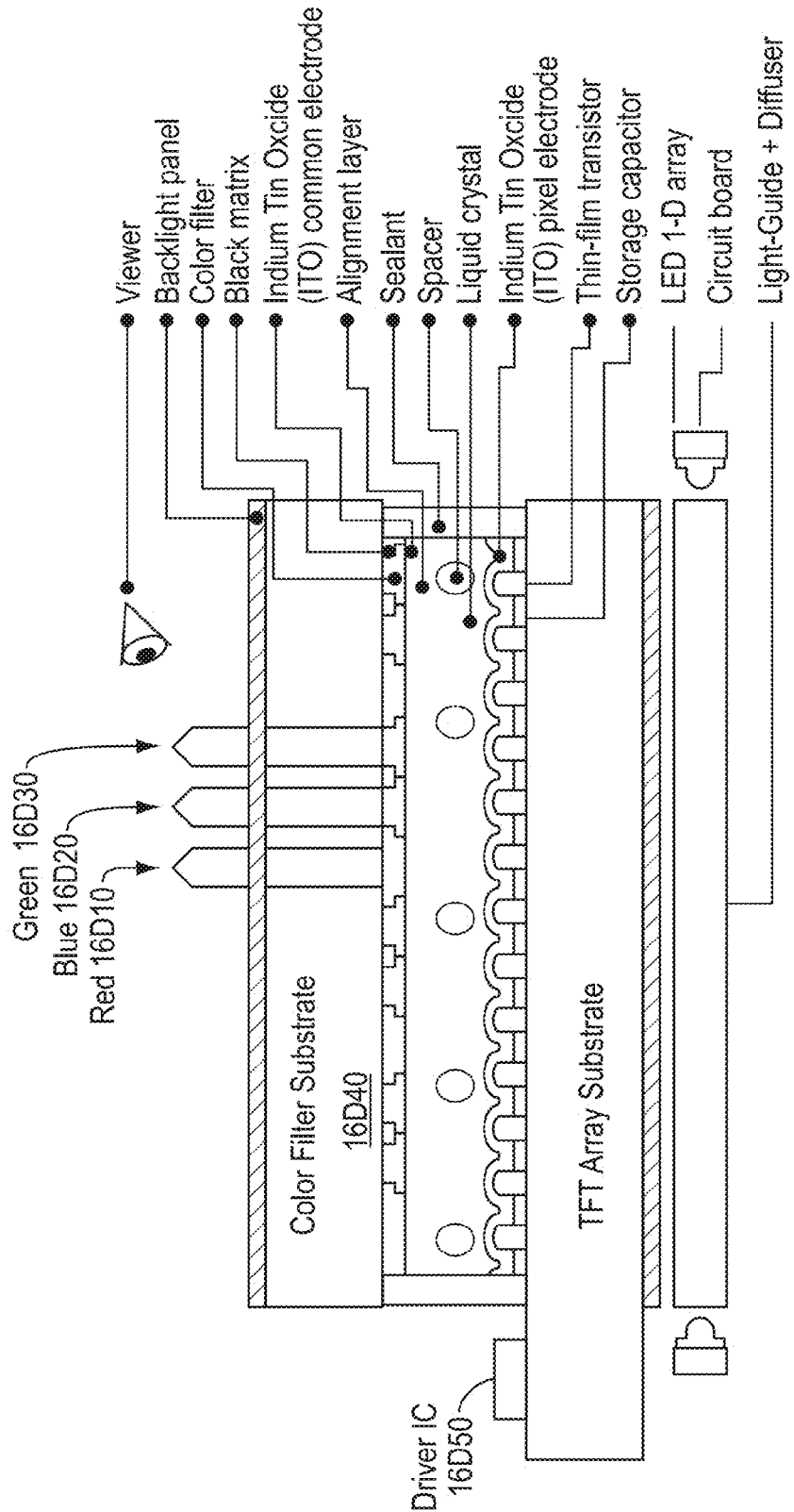
FIG. 16D2

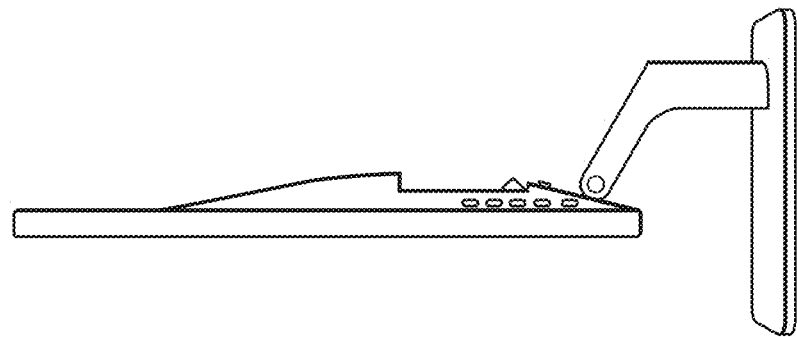
FIG. 16E2
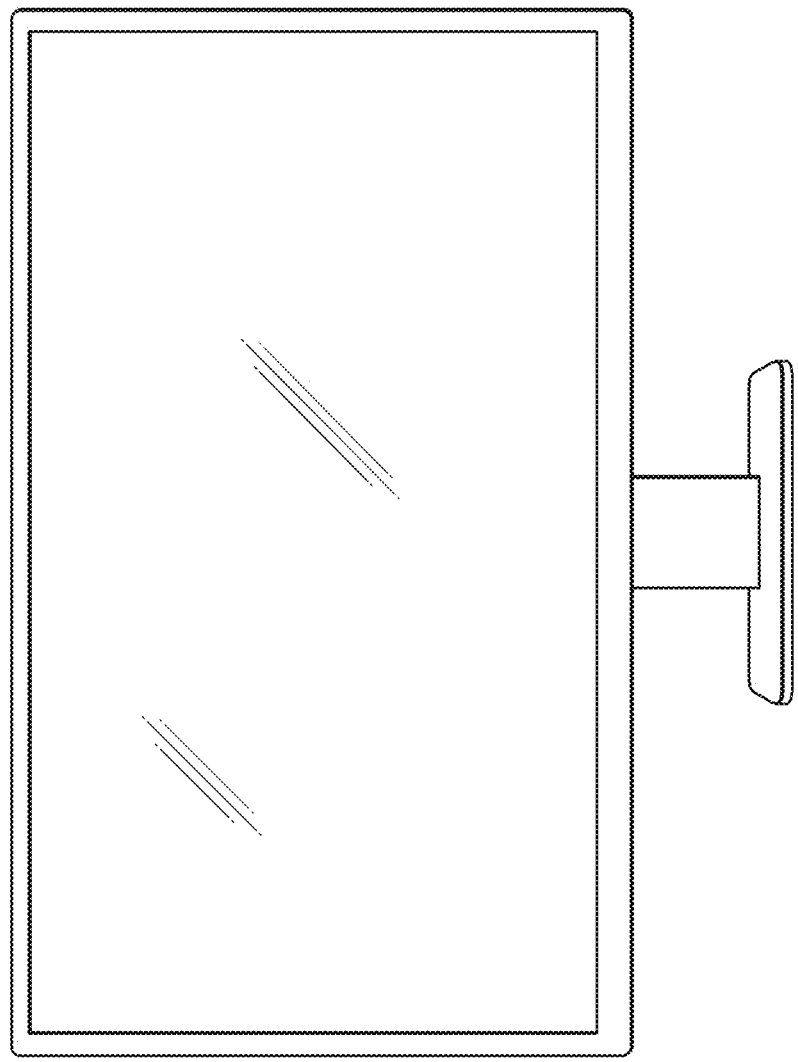
FIG. 16E1

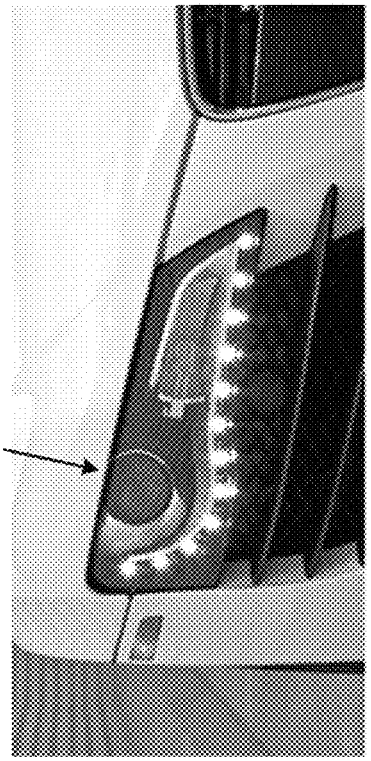
FIG. 16F2
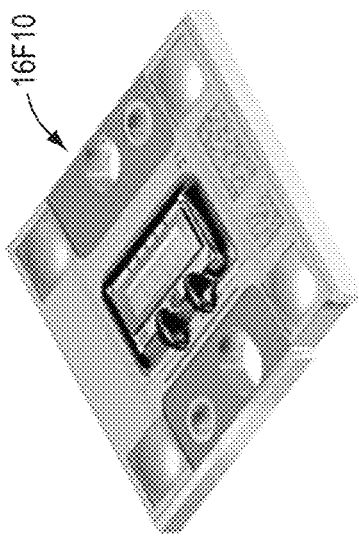
FIG. 16F1
FIG. 16F3

DENSE-LUMINESCENT-MATERIALS-COATED VIOLET LEDS

This application claims the benefit under 35 U.S.C. §119 (e) of U.S. Provisional Application No. 61/740,937, filed on Dec. 21, 2012.

FIELD

The disclosure relates to the field of LED illumination and more particularly to techniques for producing arrays of violet LEDs coated with densely-packed-luminescent-material layers.

BACKGROUND

Legacy implementations of white LED light sources have been constructed by encircling an array of blue LED die with a reflective white dam and filling the area inside the dam with a silicone-phosphor mix. This legacy approach results in the blue LED die being surrounded by luminescent-materials-containing silicone, yet the resulting legacy implementations exhibit several significant drawbacks. First, light emitted by the luminescent materials that are located far from the LED die is scattered many times before being able to exit the structure. In the process of doing so, this light can be absorbed by other luminescent-material particles, adjacent LED die (if any), and/or by the materials that form the base of the structure (i.e., submount materials). While the reflectivity of the submount materials have been specially treated, for example, by coating the submount surface with either a high-reflectivity white coating or with highly-reflective metals such as silver, some fraction of the light is converted to heat, and the efficiency of light emission is reduced. A more desirable optical configuration is to fabricate such light sources with luminescent-materials particles juxtaposed in a spatial region very near the LED die themselves. In this manner, light scattering by luminescent-material particles far from the die and absorption by the submount materials can be reduced, and the efficiency of such a light source can be improved. For example, to conformally coat the die with a phosphor material a laminar sheet of silicone or other binder, which is impregnated with phosphors, is hot-rolled onto the LED die. This method has the disadvantage that there is poor coverage on the sides of the LED die, which result in reduced light output.

However, in order to have the luminescent materials particles confined to a spatial region very near the LED die themselves, what is needed is an inexpensive method of applying one or more conformal layers (e.g., coatings) of luminescent materials around LED die in order to improve the light emission efficiency of the LED light source while concurrently providing for desired color balance as well as reliable operation under high current density operation.

SUMMARY

To improve the light emission efficiency of an LED light source a high-aspect ratio photoresist is used to create cavities that are then filled with phosphors. The methods provide devices in which the phosphor covers the sides of the LED die.

In a first aspect, methods for coating violet-emitting LED die with densely-packed-luminescent-materials are provided, comprising attaching an arrangement of a one or more violet-emitting LED die to a submount structure; applying a photoresist characterized by a thickness greater than a height of at least some of the one or more violet-emitting LED die; opening a first cavity hole in the photoresist around at least some of the one or more violet-emitting LED die; dispensing a luminescent material into the first cavity hole; and stripping the photoresist to provide one or more densely-packed-luminescent-materials coated violet-emitting LED die.

In a second aspect, apparatus are provided, comprising a submount; a violet-emitting LED die attached to the submount, wherein the perimeter of the die forms an area; and a coating covering at least one surface of the violet-emitting LED die, wherein the coating comprises at least one luminescent material.

In a third aspect, apparatus are provided, comprising a lamp base; a submount; a violet-emitting LED die attached to the submount and electrically connected to the lamp base, wherein the perimeter of the violet-emitting LED die forms a triangular area; and a coating covering at least one surface of the violet-emitting LED die, wherein the coating comprises at least one luminescent material.

BRIEF DESCRIPTION OF THE DRAWINGS

Those skilled in the art will understand that the drawings, described herein, are for illustration purposes only. The drawings are not intended to limit the scope of the present disclosure.

FIG. 2A is a diagram showing a juxtaposition of violet LED die where the violet-emitting LED die are mounted to a silicon or ceramic submount used for fabricating arrays of violet LEDs coated with densely-packed-luminescent-material layers, according to some embodiments.

FIG. 2B is a diagram showing coated violet LED die where the coated violet-emitting LED die are mounted to a silicon or ceramic submount and the submount is coated with a layer of photoresist which is thicker than the top surface of the violet LED die, according to some embodiments.

FIG. 2C is a diagram of cavities in the photoresist around each LED die in a process for fabricating arrays of violet LED die coated with densely-packed-luminescent-material layers, according to some embodiments.

FIG. 2D depicts an assembly step to fill the cavities with densely-packed luminescent materials and fix them in place by dispensing silicone onto the luminescent-material layer, according to some embodiments.

FIG. 2E depicts an assembly step to strip the photoresist layer leaving behind the luminescent-materials coating over the violet LED die, according to some embodiments.

FIG. 3 is a diagram showing clear silicone encapsulation of coated violet LED die to improve light-extraction efficiency in a process for fabricating arrays of violet LED die coated with densely-packed-luminescent-material layers.

FIG. 9A shows a top view of a linear light source prior to filling with luminescent material, according to some embodiments.

FIG. 9B shows a side view of a linear light source after covering the area for luminescent-materials deposition with luminescent material and further covering with a transparent lens cap, according to some embodiments.

FIGS. 10A through 10I depict a process for producing multiple coats over a single LED die, according to some embodiments.

FIGS. 11A through 11I depict a process for producing a single coat of a first luminescent material over a first single violet LED die, and a single coat of a second luminescent material over a second single violet LED die, according to some embodiments.

FIG. 13E is a chart showing how blue light leakage variation due to variations in coating thickness results in white color point variation according to some embodiments.

FIG. 13F1 and FIG. 13F2 characterize the dimensions given as N, S, E, and W, and Top which dimensions are used to define the phosphor layer thickness around the LED die according to some embodiments.

FIG. 13G1 and FIG. 13G2 show charts for comparisons of color variation from phosphor layer asymmetries. The variations are many times smaller for a violet-based LED as compared to a blue-based LED.

FIGS. 16A1 through FIG. 16I depict embodiments of the present disclosure as can be applied toward lighting applications.

DETAILED DESCRIPTION

Figure 1:
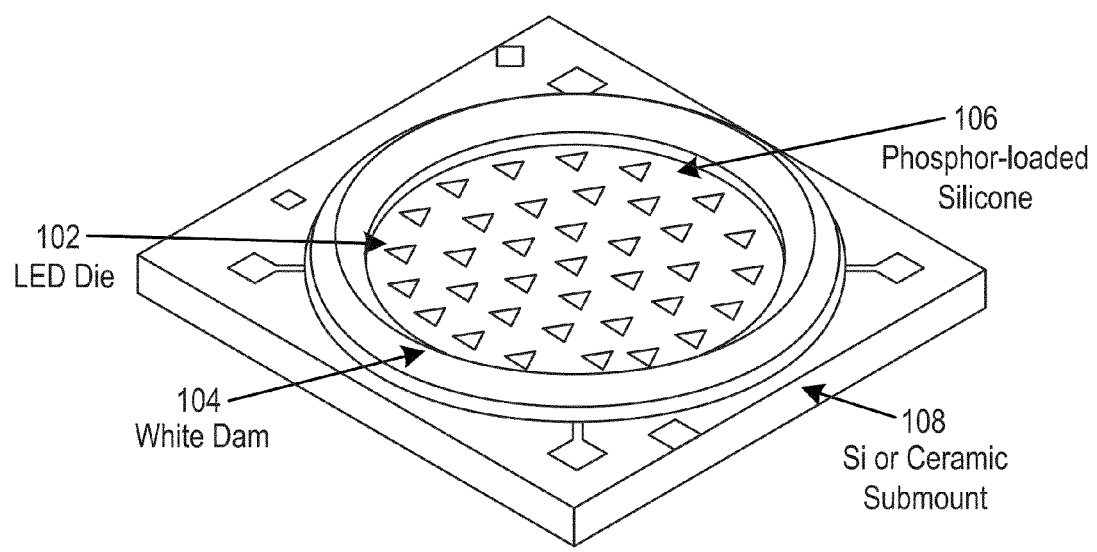
FIG. 1 is an LED die array showing series of LED die that are attached and electrically connected to a silicon or ceramic submount.

The term "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

The term "or" is intended to mean an inclusive "or" rather than an exclusive "or". That is, unless specified otherwise, or is clear from the context, "X employs A or B" is intended to mean any of the natural inclusive permutations. That is, if X employs A, X employs B, or X employs both A and B, then "X employs A or B" is satisfied under any of the foregoing instances. In addition, the articles "a" and "an" as used in this application and the appended claims should generally be construed to mean "one or more" unless specified otherwise or is clear from the context to be directed to a singular form.

Reference is now made in detail to certain embodiments. The disclosed embodiments are not intended to be limiting of the claims.

The compositions of wavelength-converting materials referred to in the present disclosure comprise various luminescent materials. And, the compositions of luminescent materials referred to in the present disclosure comprise various wavelength-converting materials.

Wavelength-conversion materials can be ceramic or semiconductor particle phosphors, ceramic or semiconductor plate phosphors, organic or inorganic downconverters, upconverters (anti-stokes), nano-particles and other materials which provide wavelength conversion. Some examples are listed below:

$(Sr_n,Ca_{1-n})_{10}(PO_4)_6*B_2O_3:Eu^{2+}$ (wherein $0 \leq n \leq 1$)
$(Ba,Sr,Ca)_5(PO_4)_3(Cl,F,Br,OH):Eu^{2+},Mn^{2+}$
$(Ba,Sr,Ca)BPO_5:Eu^{2+},Mn^{2+}$
$Sr_2Si_3O_8*2SrC_{12}:Eu^{2+}$
$(Ca,Sr,Ba)_3MgSi_2O_8:Eu^{2+}, Mn^{2+}$
$BaAl_8O_{13}:Eu^{2+}$
$2SrO*0.84P_2O_5*0.16B_2O_3:Eu^{2+}$
$(Ba,Sr,Ca)MgAl_{10}O_{17}:Eu^{2+},Mn^{2+}$
$K_2SiF_6:Mn^{4+}$
$(Ba,Sr,Ca)Al_2O_4:Eu^{2+}$
$(Y,Gd,Lu,Sc,La)BO_3:Ce^{3+},Tb^{3+}$
$(Ba,Sr,Ca)_2(Mg,Zn)Si_2O_7:Eu^{2+}$
$(Mg,Ca,Sr,Ba,Zn)_2Si_{1-x}O_{4-2x}:Eu^{2+}$ (wherein $0 \leq x \leq 0.2$)
$(Ca, Sr, Ba)MgSi_2O_6:Eu^{2+}$
$(Sr,Ca,Ba)(Al,Ga)_2S_4:Eu^{2+}$
$(Ca, Sr)_8(Mg,Zn)(SiO_4)_4C_{12}:Eu^{2+},Mn2+$
$Na_2Gd_2B_2O_7:Ce^{3+},Tb^{3+}$
$(Sr,Ca,Ba,Mg,Zn)_2P2O_7:Eu^{2+},Mn^{2+}$
$(Gd,Y,Lu,La)_2O_3:Eu^{3+},Bi^{3+}$
$(Gd,Y,Lu,La)_2O_2S:Eu^{3+},Bi^{3+}$
$(Gd,Y,Lu,La)VO_4:Eu^{3+},Bi^{3+}$
$(Ca,Sr)S:Eu^{2+},Ce^{3+}$
$(Y,Gd,Tb,La,Sm,Pr,Lu)_3(Sc,Al,Ga)_{5-n}O_{12-3/2n}:Ce^{3+}$ (wherein $0 \leq n \leq 0.5$)
$ZnS:Cu^+,Cl^-$
$(Y,Lu,Th)3Al_5O12:Ce^{3+}$
$ZnS:Cu^+,Al^{3+}$
$ZnS:Ag+,Al^{3+}$ ZnS:Ag+,Cl−
$Ca_{1-x}Al_{x-xy}Si_{1-x+xy}N_{2-x-xy}C_{xy}$:A
$Ca_{1-x-z}Na_zM(III)_{x-xy-z}Si_{1-x+xy+z}N_{2-x-xy}C_{xy}$:A
$M(II)_{1-x-z}M(I)_zM(III)_{x-xy-z}Si_{1-x+xy+z}N_{2-x-xy}C_{xy}$:A
$M(II)_{1-x-z}M(I)_zM(III)_{x-xy-z}Si_{1-x+xy+z}N_{2-x-xy-2w/3}C_{xy}O_{w-v}/2H_v$:A
$M(II)_{1-x-z}M(I)_zM(III)_{x-xy-z}Si_{1-x+xy+z}N_{2-x-xy-2w/3-v/3}C_{xy}O_wH_v$:A wherein $0<x<1$, $0<y<1$, $0\le z<1$, $0\le v<1$, $0<w<1$, $x+z<1$, $x>xy+z$, and $0<x-xy-z<1$, M(II) is at least one divalent cation, M(I) is at least one monovalent cation, M(III) is at least one trivalent cation, H is at least one monovalent anion, and A is a luminescence activator doped in the crystal structure.

$LaAl(Si_{6-z}Al_z)(N_{10-z}O_z):Ce^{3+}$ (wherein z=1)
$(Ca, Sr) Ga_2S4:Eu^{2+}$
$AlN:Eu^{2+}$
$SrY_2S_4:Eu^{2+}$
$CaLa_2S_4:Ce^{3+}$
$(Ba,Sr,Ca)MgP_2O_7:Eu^{2+},Mn^{2+}$
$(Y,Lu)_2WO_6:Eu^{3+},Mo^{6+}$
$CaWO_4$
$(Y,Gd,La)_2O_2S:Eu^{3+}$
$(Y,Gd,La)_2O_3:Eu^{3+}$
$(Ba,Sr,Ca)_nSi_nN_n:Eu^{2+}$ (where 2n+4=3n)
$Ca_3(SiO_4)Cl_2:Eu^{2+}$
$(Y,Lu,Gd)_{2-n}Ca_nSi_4N_{6+n}C_{1-n}:Ce^{3+}$, (wherein $0 \le n \le 0.5$)
(Lu,Ca,Li,Mg,Y) alpha-SiAlON doped with $Eu^{2+}$ and/or $Ce^{3+}$
$(Ca,Sr,Ba)SiO_2N_2:Eu^{2+},Ce^{3+}$
$Ba_3MgSi_2O_8:Eu^{2+},Mn^{2+}$
$(Sr,Ca)AlSiN_3:Eu^{2+}$
$CaAlSi(ON)_3:Eu^{2+}$
$Ba_3MgSi_2O_8:Eu^{2+}$
$LaSi_3N_5:Ce^{3+}$
$Sr10(PO4)_6Cl_2:Eu^{2+}$
$(BaSi)O_{12}N_2:Eu^{2+}$
M(II)aSibOcNdCe:A wherein (6<a<8, 8<b<14, 13<c<17, 5<d<9, 0<e<2) and M(II) is a divalent cation of (Be,Mg,Ca,Sr,Ba,Cu,Co,Ni,Pd,Tm,Cd) and A of (Ce,Pr,Nd,Sm,Eu,Gd,Tb,Dy,Ho,Er,Tm,Yb,Lu,Mn,Bi,Sb)
$SrS_{f2}(O,Cl)_2N_2:Eu^{2+}$
$SrSi_9Al_{19}ON_{31}:Eu^{2+}$
$(Ba,Sr)Si_2(O,Cl)_2N_2:Eu^{2+}$
$LiM_2O_8:Eu3+$ where M=(W or Mo).

For purposes of the application, it is understood that when a luminescent material has two or more dopant ions (i.e., those ions following the colon in the above luminescent materials), this is to mean that the luminescent material has at least one (but not necessarily all) of those dopant ions within the material. That is, as understood by those skilled in the art, this type of notation means that the luminescent material can include any or all of those specified ions as dopants in the formulation.

Further, it is to be understood that nanoparticles, quantum dots, semiconductor particles, and other types of materials can be used as wavelength-converting materials. The list above is representative and should not be taken to include all the materials that may be utilized within embodiments described herein.

Improvements to be addressed include high-current-density/high-power LED applications where luminescent-material-particle heating can reduce efficiency and reduce lifetime. The LED die in such applications emit a large flux of photons, which, when absorbed by the luminescent-material particles that surround the LED die, generate substantial heat in the luminescent material particles as a result of the photon down-conversion process. Often this down-conversion-generated heat accumulates in the luminescent-material particles due to the poor thermal conductivity of the silicone in which they are dispersed. One result of the accumulated heat is a significant temperature rise in the luminescent-material particles. This temperature rise has the effects of reducing the photon down-conversion efficiency as well as causing decomposition (e.g., browning or cracking) of the surrounding silicone encapsulant. One solution to this problem is to have the luminescent materials packed so tightly around the LED die that they maintain thermal contact both with each other, with the submount, and with the LED die surface. In this configuration, heat can then be efficiently transported from the luminescent materials particles through the submount and LED die themselves and out the back of the package (e.g., in the case that the thermal conductivity of both the luminescent-material particles and the LED die are higher those of silicone encapsulants).

Legacy techniques provide for deposition of layers on the surface of an LED wafer which can later be diced into individual LED die, however, this coating process is inappropriate for three-dimensional LED die. What is disclosed herein is an approach to coating three-dimensional violet LED die with a dense layer of luminescent-material particles.

One approach is to conformally coat the LED die using an electrophoretic-deposition (EPD) process. However, a precisely-controlled luminescent-material-deposition process is required when blue-emitting LED die are employed as the amount of blue leakage into the final white spectrum needs to be ultra-precisely controlled. EPD deposition systems are complex and, as a result, this coating process is expensive—particularly if multi-layer coatings are desired. By employing violet-emitting LED die instead of blue-emitting LED die, the need for such ultra-precise luminescent-material-thickness control is reduced—enabling the use of less-complex luminescent-material deposition processes. In some cases employing a dense-luminescent-material layer provides thermal control based at least in part on the characteristics of the selected luminescent-material(s). When the density of the luminescent materials in the coating is insufficient to allow reasonable thermal contact between them, thermally-conductive and optically-transparent materials can be added to the coating to improve the overall thermal conductivity of the layer. Exemplary thermally-conductive and optically-transparent materials are listed in Table 1.

TABLE 1

Selected Thermally-conductive and Optically-transparent Materials

| Name | Crystal index of Refraction (500 nm) | Thermal Conductivity of Bulk Crystal (W/m*K) |
|---|---|---|
| Magnesium Fluoride ($MgF_2$) | 1.38 | 22 |
| Lithium Fluoride (LiF) | 1.4 | 11 |
| Sodium Fluoride (NaF) | 1.4 | 17 |
| Calcium Fluoride ($CaF_2$) | 1.43 | 10 |
| Strontium Fluoride ($SrF_2$) | 1.44 | 10 |
| Barium Fluoride ($BaF_2$) | 1.47 | 11.7 |
| Sodium Chloride (NaCl) | 1.5 | 6 |
| Potassium Chloride (KCl) | 1.5 | 7 |
| Yttrium Lithium Fluoride ($LiYF_4$) | 1.5 | 6 |
| Lanthanum Fluoride ($LaF_3$) | 1.6 | 5.1 |
| Calcium Carbonate ($CaCO_3$) | 1.6 | 4.7 |
| Beryllium Oxide (BeO) | 1.7 | 370 |
| Magnesium Oxide (MgO) | 1.7 | 56 |

TABLE 1-continued

Selected Thermally-conductive and Optically-transparent Materials

| Name | Crystal index of Refraction (500 nm) | Thermal Conductivity of Bulk Crystal (W/m*K) |
|---|---|---|
| Sapphire ($Al_2O_3$) | 1.8 | 40 |
| Yttrium Aluminum Garnet ($YsAl_5O_{12}$) | 1.85 | 13 |
| Yttrium oxide ($Y_2O_3$) | 1.9 | 27 |
| Yttrium Vanadate ($YVO_4$) | 1.95 | 5.23 |
| Zinc Oxide (ZnO) | 2.00 | 21 |
| Aluminum Nitride (AlN) | 2.2 | 320 |
| Diamond | 2.42 | 2000 |

In addition to the examples of Table 1, other materials can be used such as, for example, Zinc Fluoride—$ZnF_2$, Iron Fluoride—$FeF_2$, Cerium Fluoride—$CeF_3$, Potassium Dihydrogen Phosphate—$KH_2PO_4$, Aluminum phosphate—$AlPO_4$, and Potassium sulfate ($K_2SO_4$).

Further, there are a number of groups of materials (e.g., complex fluorides such as $KMeF_3$, phosphates, and sulfates) having characteristics within the desired ranges.

Now, referring to the aforementioned FIG. 2A to FIG. 2E and FIG. 3, the luminescent-material-deposition process can include any one or more of the following steps:

1) Attach violet LED die 210 (e.g., flip-chip LED die) to a submount 220 structure (e.g., a silicon or ceramic submount).

2) Apply resist layer (e.g., a thick-film) to the LED die array. As shown, the resist layer thickness is slightly larger than the height of the LED die. In this configuration, the height of the resist can substantially influence the final thickness of the luminescent materials coating on the top surface of the die. The thickness of the luminescent materials coating on the top of the die can thus be independently adjusted relative to the thickness of the luminescent-materials coating on the sides of the die. The thickness of the luminescent materials coating on the sides of the die can be controlled by the size of the openings in the resist layer.

3) Open holes in the resist around the LED die using photolithography. Non-flip chip designs may also provide for opening holes in the resist around the wirebond pads.

4) Wirebond the die as needed (e.g., if they are not of a flip-chip configuration).

5) Dispense a dense layer of luminescent materials into the cavities (e.g., cavity 240) that surround the LED die and on top of the LED die. This dense layer can be comprised of a powder layer of luminescent materials or a combination of luminescent materials and transparent, thermally-conductive particles (see Table 1). Alternatively, the luminescent materials can be dispensed in a solvent solution, which is then allowed to evaporate away—leaving a dense-luminescent-material layer, or, the luminescent materials can be dispensed directly in a very-heavily-loaded-silicone mixture.

6) Fix the luminescent materials around the LED die by depositing (e.g., using a dispense needle 270) a silicone (e.g., silicone 250), sol gel, or other stable binding material to the luminescent materials (if they were not dispensed already pre-mixed in a silicone).

7) Strip the thick film (or other) resist material with, for example, an $O_2$ plasma-etch system. A photoresist is selected to have a low etch rate of the binding material so as to enable the resist to be selectively removed—leaving behind the luminescent-materials-coating layer that surrounds each LED die. The etch rate of the binding material should thus be, for example >10× less than that of the photoresist 230.

8) Some embodiments (e.g., see FIG. 3) dip the die coated with luminescent materials into a clear silicone 310 and cure them in a particular spatial orientation (e.g., up-side-down) to create small lenses around each coated LED die and thus improve light-extraction efficiency. Alternatively, small silicone lens caps could be molded over each die.

9) Some embodiments place a reflective dam around a set of die on the submount and fill the dam with either clear silicone 310 or silicone loaded with a small amount of diffusant (e.g., to improve light-source uniformity).

10) Dice the silicon or ceramic submount into individual light sources.

11) Some embodiments affix a large lens to the reflective dam (if employed) to further improve light-extraction efficiency.

The result of performing the foregoing steps is a light source apparatus in the form of a two-dimensional arrangement of violet LED die that have been coated with a dense, luminescent material layer. Other embodiments (see FIG. 5) coat with a plurality of layers. Such an LED light source will have better light-extraction efficiency than is achievable with the luminescent-material "puddle" approach. Furthermore, the resulting apparatus possesses thermal transport characteristics that facilitate high-LED-current-density operation. And, following the methods described herein, many LED-die arrays can be coated simultaneously (e.g., in a panel-level or wafer-level luminescent-material-application process).

FIG. 1 is a LED die array 100 showing series of LED die that are attached and electrically connected to a silicon or ceramic submount.

As shown, a dam is placed around the LED die array and the dam is filled with a phosphor-loaded silicone.

FIG. 2A is a diagram 2A00 showing a juxtaposition of violet LED die 210 where the violet-emitting LED die are mounted to a silicon or ceramic submount 220 used for fabricating arrays of violet LED die coated with densely-packed-luminescent-material layers. The violet LED die may be arranged in any spatial configuration on the submount. For example, they could be arranged in a linear configuration or a two-dimensional rectangular or circular configuration.

FIG. 2B is a diagram 2B00 showing violet LED die 210 on a submount that are coated with a layer of photoresist that is thicker than the violet LED die 210 are tall.

FIG. 2C is a diagram 2C00 of cavities (e.g., cavity 240) in the photoresist 230 around each violet LED die in a process for fabricating arrays of violet LED die coated with densely-packed-luminescent-material layers.

FIG. 2D depicts an assembly step 2D00 to fill the cavities (e.g., cavity 240) with densely-packed luminescent materials and fix them in place by dispensing a small amount of silicone on to the formed luminescent material layer 260.

FIG. 2E depicts an assembly step 2E00 to strip the layer of photoresist layer leaving behind the luminescent-material layer that coats violet die in a process for fabricating arrays of violet LED die coated with densely-packed-luminescent-material layer.

FIG. 3 is a diagram 300 showing clear silicone 310 encapsulation of coated violet die to improve light-extraction efficiency in a process for fabricating densely-packed arrays of violet LED die coated with luminescent materials.

Figure 4:
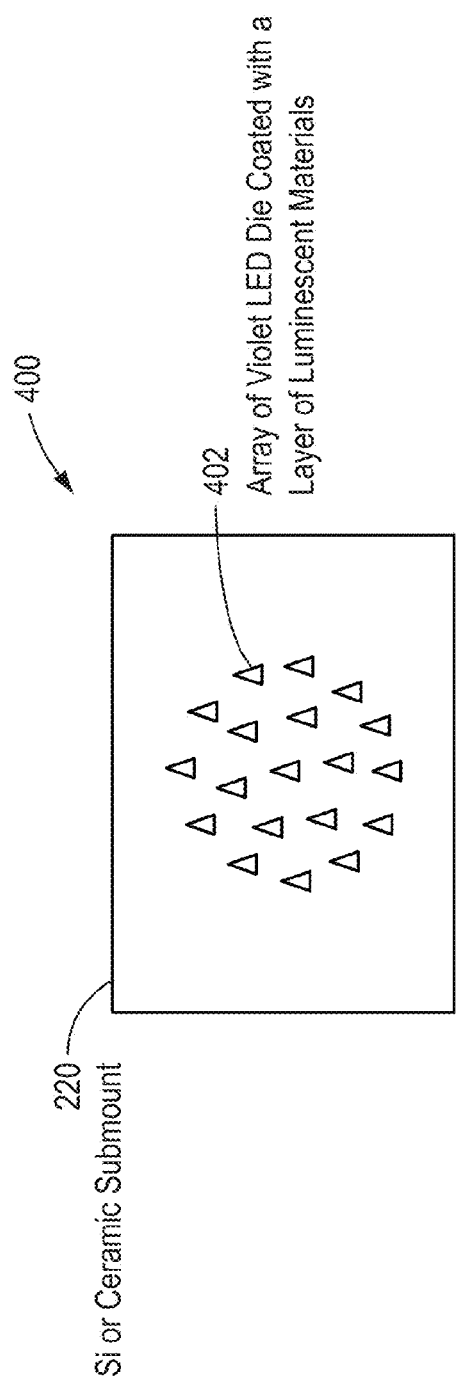
FIG. 4 is a top view of a circular array of luminescent-material-coated violet LED die, according to some embodiments.

FIG. 4 is a top view 400 of a circular array of luminescent-materials-coated violet LED die 210 positioned on a submount. The array may be formed of triangular die, or of diamond-shaped die, or of rectilinear-shaped die, or of die of any shape.

Figure 5:
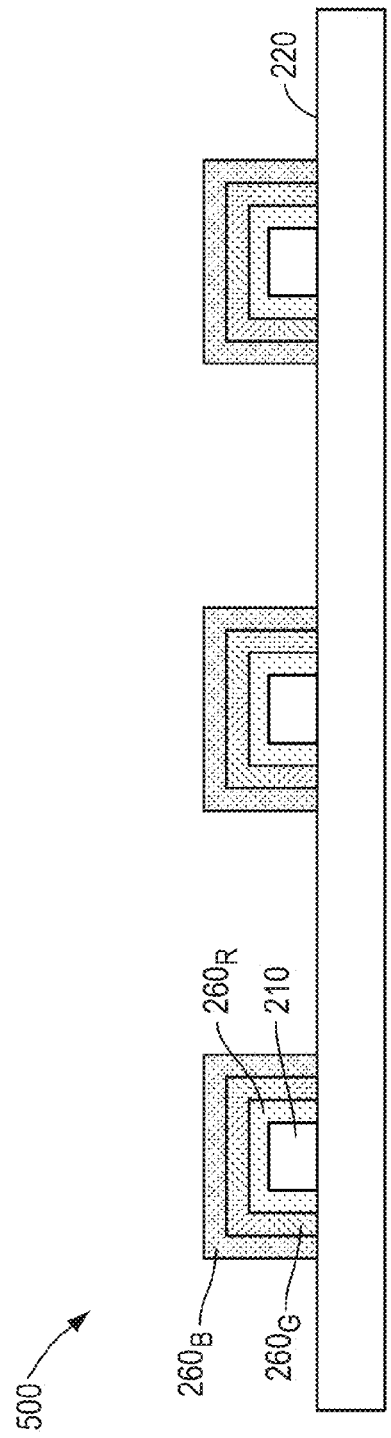
FIG. 5 is a diagram of an arrangement of violet LED die coated with red, green, and blue luminescent materials-containing layers, according to some embodiments.

FIG. 5 is a diagram 500 of an arrangement of violet die coated with red (e.g., red layer $260_R$), green (e.g., green layer $260_G$), and blue (e.g., blue layer $260_B$) luminescent-materials-containing layers resulting from fabricating arrays of violet LED die coated with densely-packed-luminescent-material layers.

Figure 6A:
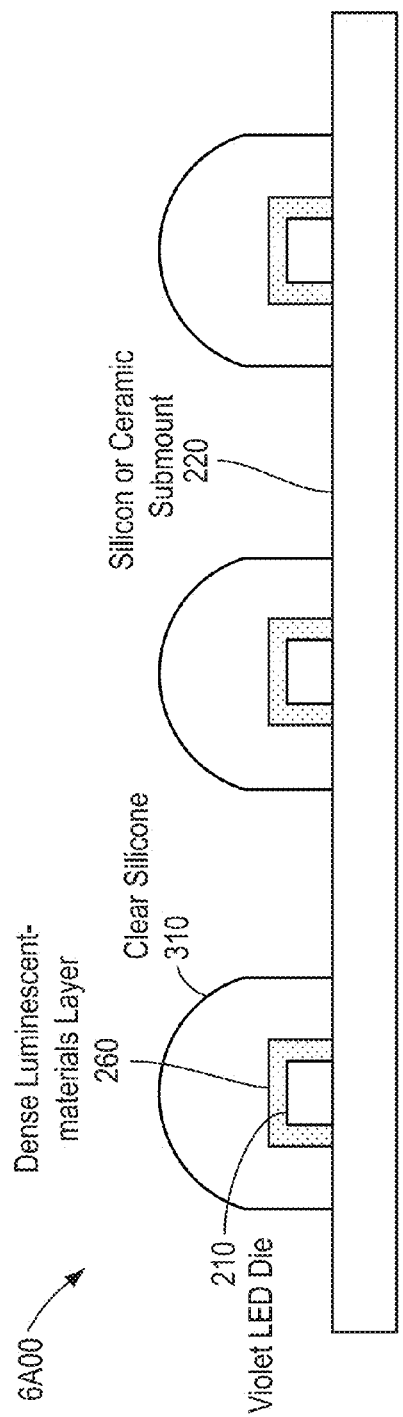
FIG. 6A is a cross-section side view of a die-level encapsulated device formed from arrays of violet LED die coated with densely-packed-luminescent-material layers, according to some embodiments.

FIG. 6A is a cross-section side view 6A00 of a die-level encapsulated device formed from fabricating arrays of violet LED die coated with densely-packed-luminescent-material layers.

Figure 6B:
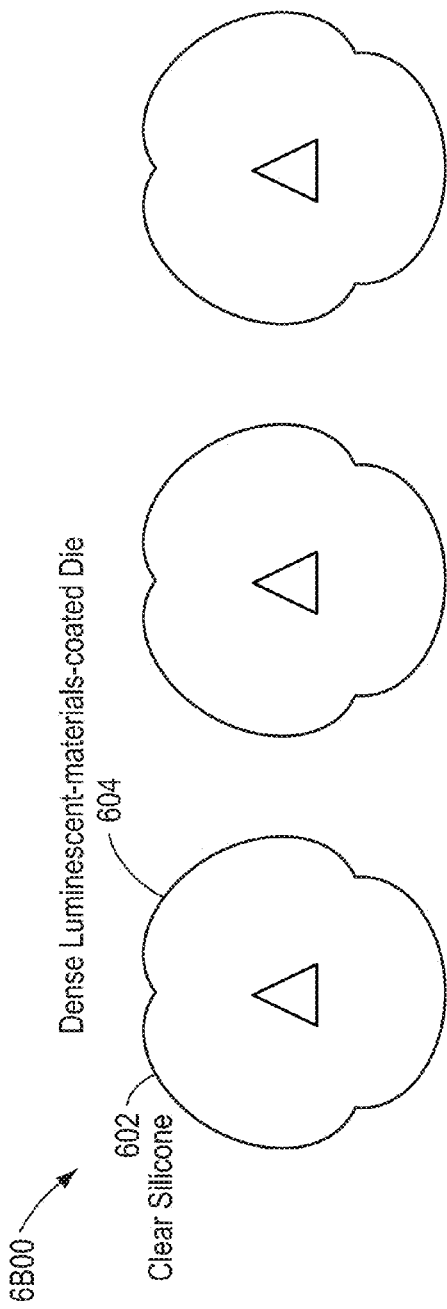
FIG. 6B is a top view of a shaped-side-wall-die-level-encapsulated device formed after fabricating arrays of violet LED die coated with densely-packed-luminescent-material layers, according to some embodiments.
Figure 7A:
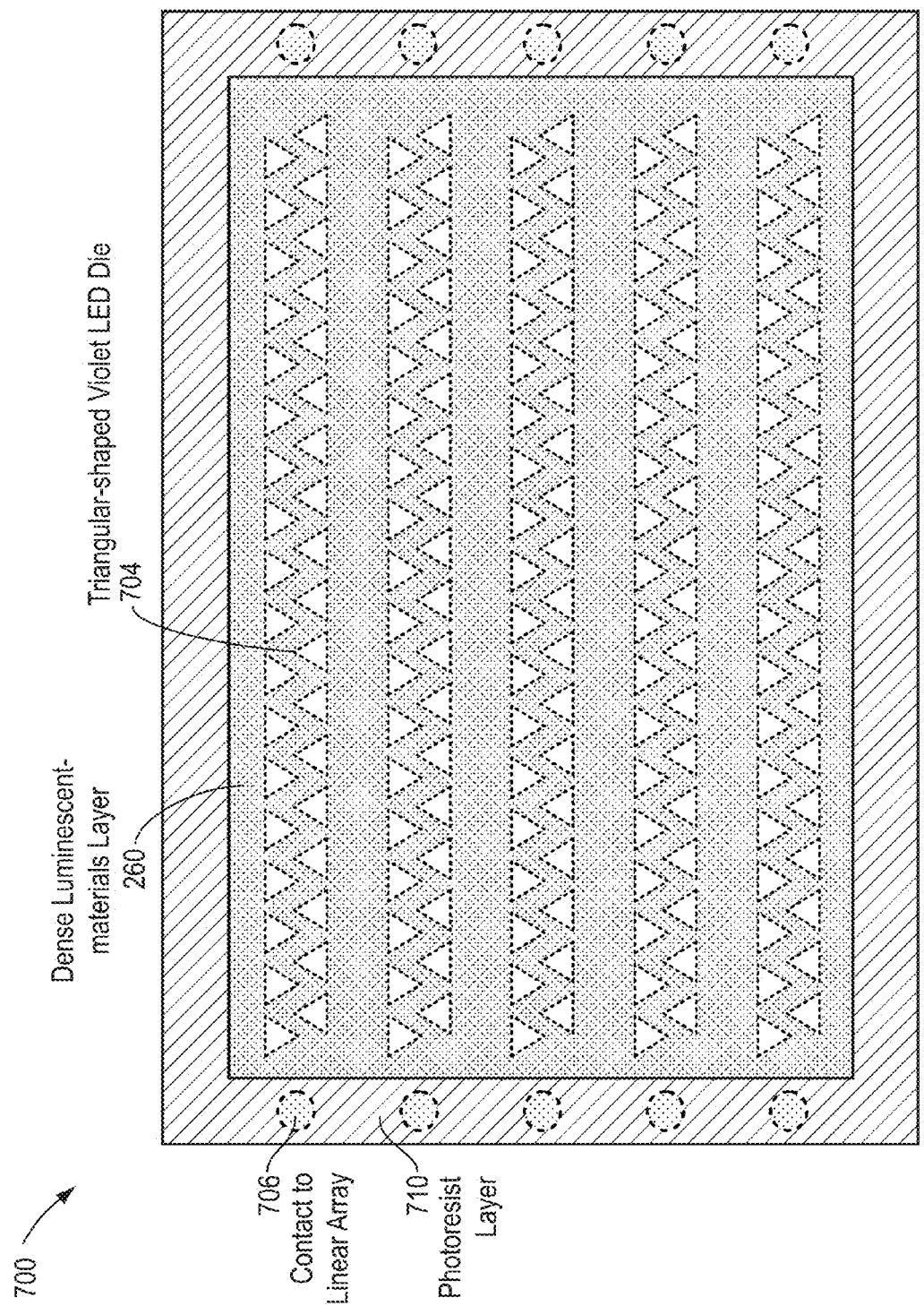
FIG. 7A is a top view of a series of linear arrays of triangular-shaped violet LED die 704 being surrounded with a photoresist layer and covered with a luminescent-material layer, according to some embodiments.

FIG. 6B is a top view 6B00 of a shaped-side-wall-die-level-encapsulated device formed after fabricating arrays of violet LED die coated with densely-packed-luminescent-material layers. FIG. 7A is a top view 700 of a series of linear arrays of triangular-shaped violet LED die 704 being surrounded with a photoresist layer 708 which covers the linear array contacts 706. The photoresist layer 708 defines the periphery of the area into which the dense luminescent-material layer 702 is formed, and the photoresist layer protects the contact pads as may be distributed through the periphery. After the photoresist is removed, the individual linear arrays can be singulated.

Figure 7B:
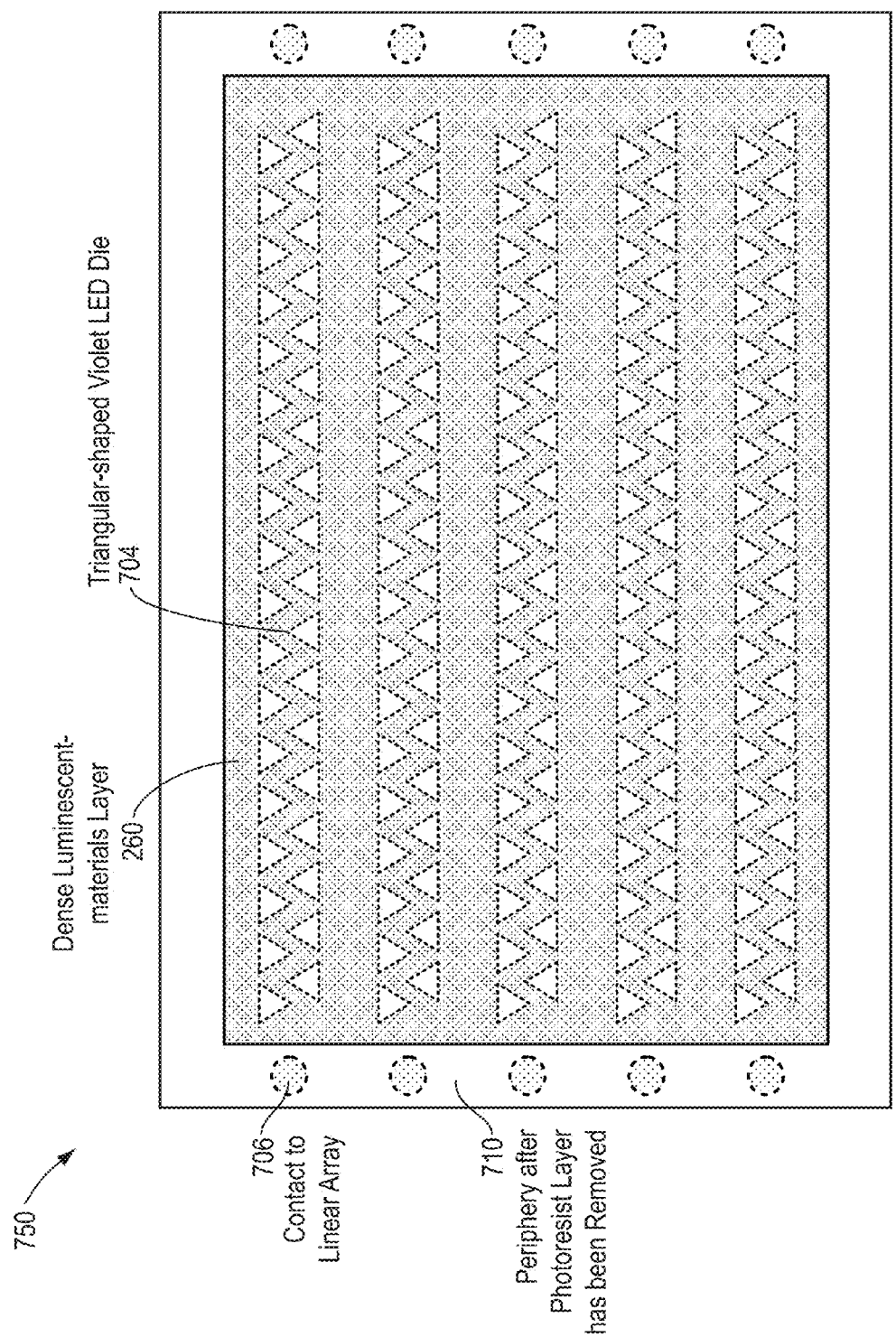
FIG. 7B is a top view of a series of linear arrays of triangular-shaped violet LED die covered with a luminescent-material layer after removal of a photoresist layer, according to some embodiments.

FIG. 7B is a top view 750 of a series of linear arrays of triangular-shaped violet LED die 704 after removal of a photoresist layer. Once the photoresist is removed, the individual linear arrays can be singulated (e.g., by sawing through the full device including the luminescent-material layer).

Figure 8A:
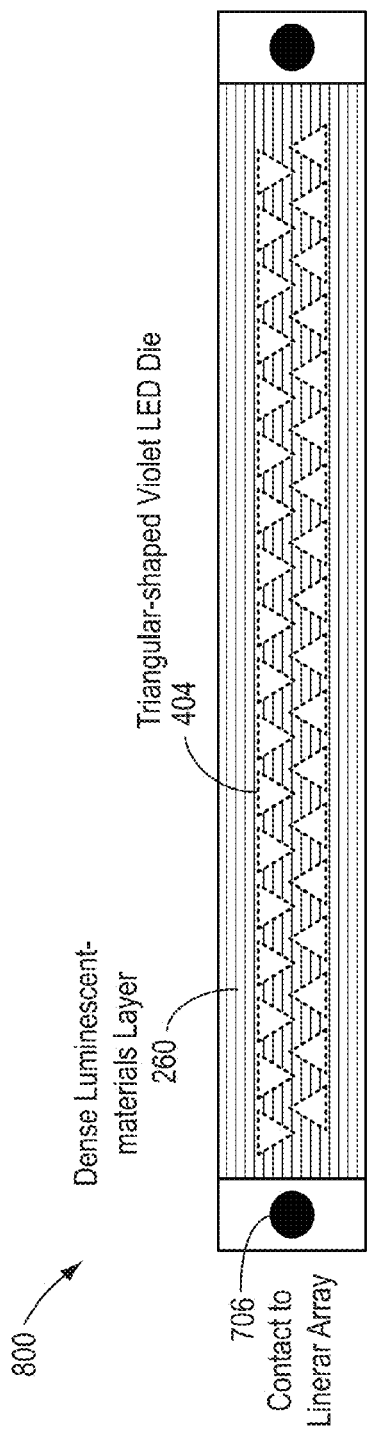
FIG. 8A depicts an example of a linear light source made with triangular-shaped violet LED die covered with a luminescent-material layer where the linear light source is made with two rows of triangular-shaped violet LED die where one side of each LED die faces the long side of the light source to improve uniformity of emission, according to some embodiments.

FIG. 8A depicts an example 800 of a linear light source made with triangular-shaped violet LED die where the linear light source is made with two rows of triangular-shaped violet LED die where one side of each violet LED die faces the long side of the light source to improve uniformity of emission, according to some embodiments.

Figure 8B:
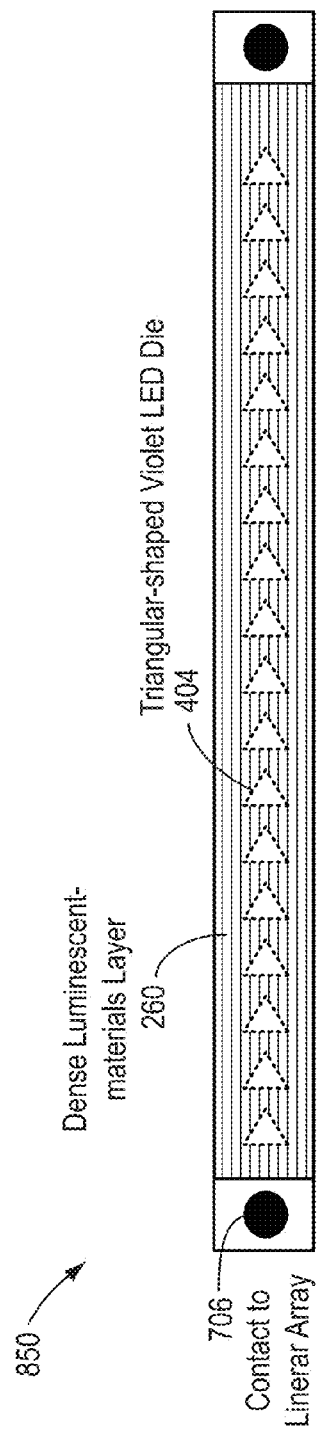
FIG. 8B depicts an example of a linear light source made with triangular-shaped violet LED die where the linear light source is made with one row of triangular-shaped violet LED die covered with a luminescent-material layer where one side of each LED die faces the short dimension of the linear array to improve uniformity of emission, according to some embodiments.

FIG. 8B depicts an example 850 of a linear light source made with triangular-shaped violet LED die where the linear light source made with one row of triangular-shaped violet LED die where one side of each violet LED die faces the short dimension of the linear array to improve uniformity of emission, according to some embodiments.

FIG. 9A shows a top view 900 of a linear light source prior to filling with luminescent material.

As shown in FIG. 9A and FIG. 9B, various embodiments are formed as follows:
  A silicon or ceramic submount is provided.
  The violet LED die are arranged in a linear array over the submount (see violet-emitting LED die 904).
  The area between and proximally-around the violet LED die forming the linear array forms the bounds of an area for luminescent-materials deposition 902.
  Additional processing steps are carried out as are depicted in FIG. 9B.

FIG. 9B shows a side view 950 of a linear light source after covering the area for luminescent-materials deposition with luminescent material and further covering with a transparent lens cap 908.

In some embodiments, the following steps are taken:
  a transparent silicone dam 906 is placed around the linear arrangement of LED die;
  one or more layers of luminescent materials are deposited (e.g., in encapsulants) over the area for luminescent-materials deposition (see luminescent-materials layer 260) and
  a transparent lens cap 908 is dispensed on top of the luminescent materials layers and the dam.

As shown, the dam forms a moat around the LED die and defines the outer shape of the luminescent-material layer, and the dam that surrounds LED die is made of a material that is transparent to visible light (e.g., clear silicone). The dam, in such embodiments, acts as an encapsulant for the sides of the linear light source. In addition, the dam forms a clear base upon which a clear silicone lens cap can be dispensed (see FIG. 9B). The resulting embodiment is a fully-encapsulated linear light source. This approach enables a wafer-level method of creating an encapsulated linear light source. In some cases, a plurality of transparent dams can be molded together in one piece and then attached to the submount in one piece. Such a construction facilitates singulation of individual light sources: singulation can be performed during the submount dicing process.

The aforementioned techniques for fabricating arrays of violet LED die coated with densely-packed-luminescent-material layers include depositing a layer over an array of die. Other techniques serve to coat individual LED die. In particular, the embodiments disclosed below pertain to a method for fabricating luminescent-material-coated individual LED die using photolithography processes. The disclosed methods include techniques where luminescent materials can be applied onto individual LED die in a manner that removes or reduces the need for a dam. Also, the photolithography processes can be tuned to vary the thickness of luminescent-materials on the top or sides of individual single- or multi-LED-die array. Tuning can be done in accordance with light output requirements. In some cases, luminescent materials are applied onto individual LED die after wire-bonds have been formed. Further, certain techniques in which luminescent materials are applied onto individual LED die serve to lower luminescent-material back scattering (e.g., resulting in a higher efficiency). Still further, certain techniques in which luminescent materials are applied result in higher luminescent material loading, which in turn can result in a decrease in operating temperatures (e.g., allowing integration of high index silicone in the luminescent material mix).

The aforementioned techniques and properties open up the possibility to:
  Fabricate a wide range of emitter configurations,
  Create layered luminescent-material structures, and
  Create pixelated arrays of LEDs with different combinations of luminescent materials.

As discussed herein and below, luminescent-material-coated individual LED die are formed using photolithography. Strictly as examples, the process can proceed as follows:
  A thickness of 350 μm is achieved using a multiple-spin process (e.g., Spin1=300 rpm for 20 s, Spin2=1000 rpm for 3.5 s, Spin3: 500 rpm for 14 s).
  The submount is baked in successive baking processes (e.g., hot-plate at 135° C. for 30 minutes after Spin2, 40 minutes after Spin3, etc.).
  The substrate is patterned with a mask under a contact mask aligner to open up holes around the dies.
  Proximity contact is used with an exposure gap of 50 μm.
  Exposure dose is set at 7800 mJ/cm$^2$ using multiple exposures with alternating exposure and dwell times.
  The photoresist is removed around the dies by developing the resist (e.g., using AZ300MIF for 5.5 minutes at room temperature, using puddle develop).

Luminescent materials (e.g., dispensed in a silicone-based slurry) are then dispensed inside the openings around the dies.

Subsequent vacuum de-gas steps are carried out to relieve the luminescent-material mix of unwanted air-bubbles.

The assembly is baked at 150° C. for 15 minutes in a convection oven to cure the silicone.

The photoresist is stripped off using first AZ300MIF (e.g., at 80° C. for 30 minutes, or via ultrasonic strip) and then using AZ400T (e.g., at 80° C. for 10 minutes).

The substrate is washed thoroughly with de-ionized water and then blown dry with nitrogen.

A de-hydration bake at 150° C. for 5 minutes is carried out before testing/evaluation of the parts.

Some embodiments include two layers of luminescent material coating the die. In one particular processing flow, certain spin steps are carried out at lower spin speeds (e.g., spins at 300 rpm for 20 s, 900 rpm for 3.5 s, 400 rpm 14 s). For multi-layer luminescent-material combinations, a second layer of photoresist is spun such that it is slightly thicker (e.g., about 0.5 µm thicker) than the first layer so as to barely cover the luminescent material patterned during processing of the first layer.

Several possible techniques to fabricate luminescent-material-coated LED die using photolithography processes is described in FIG. 10A through FIG. 10I (showing multiple coats over a single LED die) and in FIG. 11A through FIG. 11I (showing separate single coats over adjacent single LED die).

FIGS. 10A through 10I depict a process for producing multiple coats over a single die. As shown, the multiple coats of luminescent material are applied to a single LED die as follows:

The subassembly 10A00 is subjected to a photoresist spin-on process to form subassembly 10B00. Then a mask and photoresist process is used to form subassembly 10000. A first layer of luminescent material is deposited (e.g., dispensed) into the recesses formed after washing away the photoresist to form subassembly 10D00, which is in turn subjected to an additional wash to form subassembly 10E00. Yet another series of photoresist, exposure, and wash steps serve to form subassembly 10F00 (apply photoresist), and subassembly 10G00 (subsequent to wash after using mask 2). A second layer of luminescent material is deposited (e.g., dispensed) into the recesses formed after forming subassembly 10G00, which subassembly 1H00 is in turn subjected to an additional washes to form subassembly 10100, having two coats of luminescent material applied to a single LED die. Additional steps with additional masks can be used to add a third or n-th layer of luminescent material.

FIGS. 11A through 11I depict a process for producing a single coat of a first luminescent material over a first single LED die, and a single coat of a second luminescent material over a second single LED die. As shown, the multiple coats of wavelength-converting material is applied to a single LED die as follows:

The subassembly 11A00 is subjected to a photoresist spin-on process to form subassembly 11B00. Then a mask and photoresist process is used to form subassembly 11C00, where a first LED die is exposed. A first layer of luminescent material is deposited (e.g., dispensed) into the recesses formed after washing away the photoresist to form subassembly 11D00, which is in turn subjected to an additional wash to form subassembly 11E00. Yet another series of photoresist, exposure, and wash steps serve to form subassembly 11F00 (e.g., via application of photoresist), and subassembly 11G00 (subsequent to wash after using mask 2). A layer of second luminescent material is deposited (e.g., dispensed) over the second LED die (e.g., into the recesses formed after forming subassembly 11G00), which subassembly 1H00 is in turn subjected to an additional washes to form subassembly 11100, having different coats of luminescent material applied to first and second LED die (e.g., adjacent die, as shown). Using this technique, different luminescent materials in different thicknesses of conformal coatings can be applied to different (e.g., adjacent) LED die.

Figure 12A:
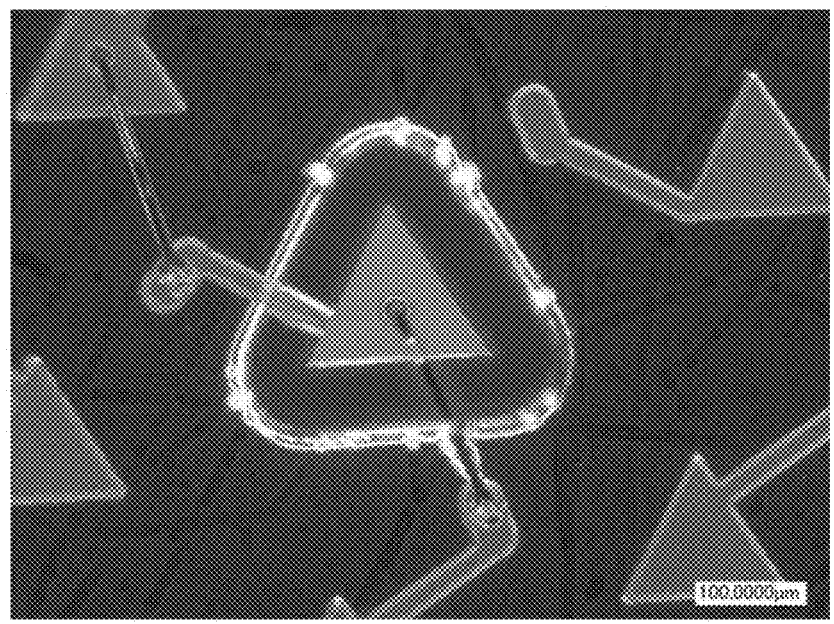
FIGS. 12A and 12B depict a single violet LED die with a conformal coating disposed in a sparsely-populated array, according to some embodiments.
Figure 12B:
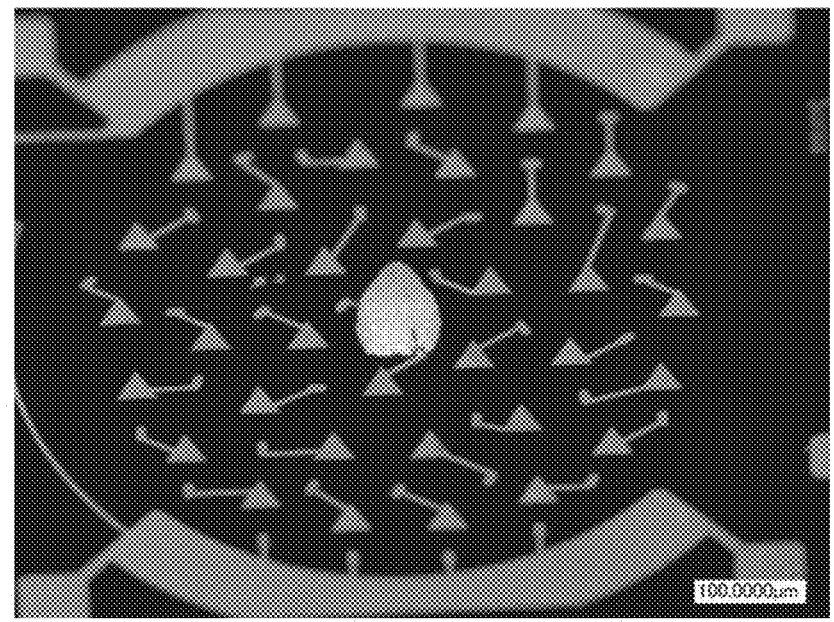

FIGS. 12A and 12B depict a single LED die with a conformal coating disposed in a sparsely-populated array. More specifically, FIG. 12A shows an exemplary wire-bonded LED die (with an exemplary triangular plan view) surrounded by a patterned resist layer with a cavity/moat adjacent to the exemplary LED die. FIG. 12B shows the same exemplary LED die with a conformal coat of luminescent material.

Figure 13A:
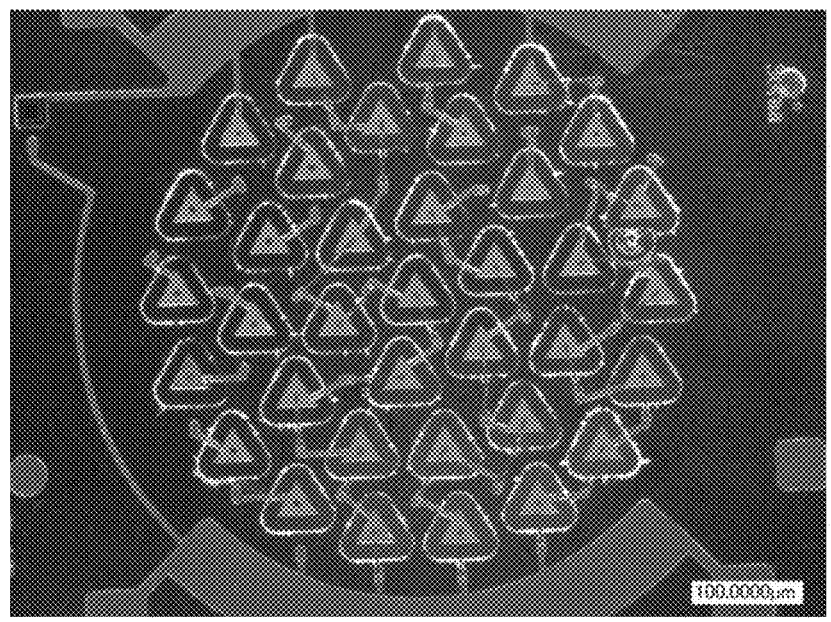
FIG. 13A through FIG. 13C depict multiple violet LED die in a fully-populated array, according to some embodiments.
Figure 13B:
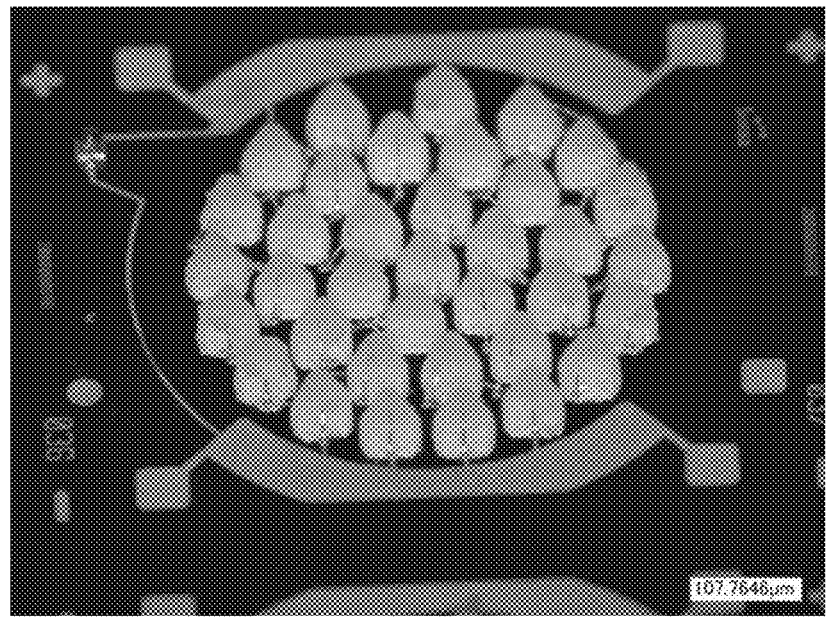
Figure 13C:
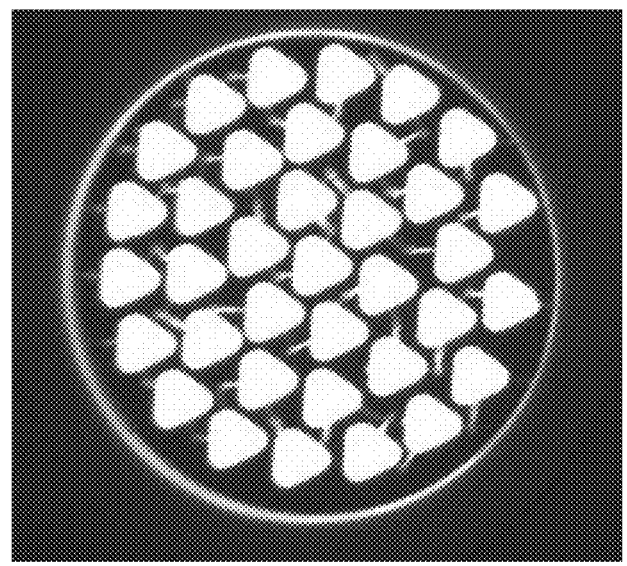

FIG. 13A through FIG. 13C depict multiple die in a fully-populated array. More specifically, FIG. 13A shows an exemplary wirebonded LED die arrangement (with LED die that have a triangular plan view) surrounded by a patterned resist layer with a cavity/moat adjacent to each LED die. FIG. 13B shows the same exemplary LED die arrangement with a conformal coat of luminescent material, and FIG. 13C shows the conformally-coated geometric arrangement of LED die in a powered-on state.

Figure 13D:
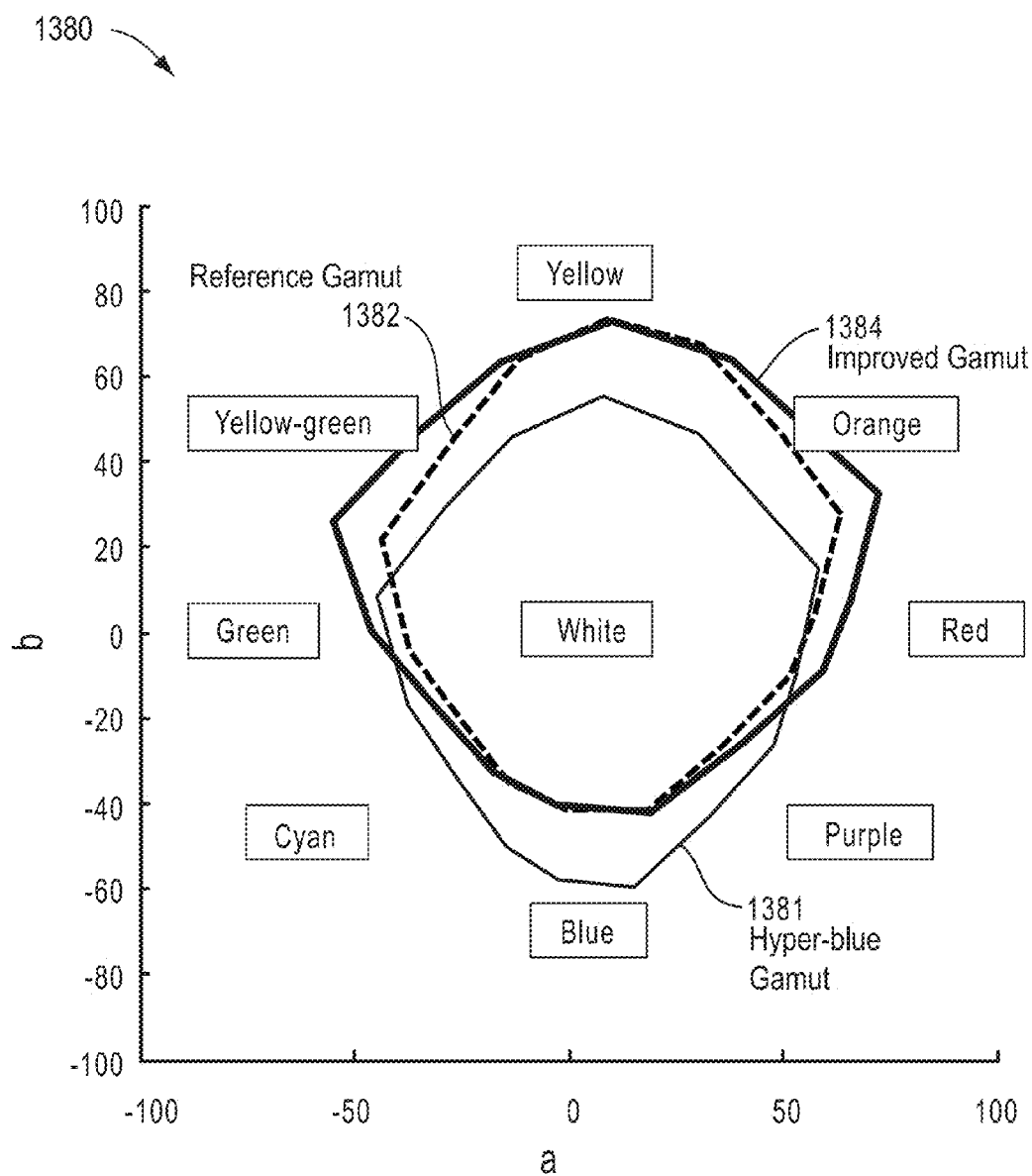
FIG. 13D shows color balance as tuned by spectrum engineering over a range of wavelengths, and a resulting quality of emitted light having a spectrum-engineered gamut of light, according to some embodiments.

FIG. 13D shows color balance as tuned by spectrum engineering over a range of wavelengths, and a resulting quality of emitted light having a spectrum-engineered gamut of light. The embodiments described herein address the hyper-blue color balance problem of conventional LEDs (e.g., having a large blue light component) by engineering the emitted spectrum. Spectrum engineering may for instance be achieved by choice of the emission spectra of LEDs (e.g., by choosing violet-emitting LEDs), and spectrum engineering can be achieved by choosing particular luminescent materials, and by depositing the luminescent materials in a particular manner so as to produce particular structures proximal to the LEDs, which structures in turn facilitate precise wavelength-converting light processes from one or more photonic down-conversions.

One possible way to measure the results of spectrum engineering (e.g., and to assess quality of emitted light) is to characterize the gamut of the light source. The experimental set-up considers up to 15 reflectance samples (e.g., taken from of the Color Quality Scale [Davis10]), and choosing which sample measurements are taken. From a series of measurements, chromaticity can be derived or calculated, from which in turn a gamut of resulting points can be plotted.

FIG. 13D depicts two examples overlaid on the gamut for a reference blackbody radiator with a correlated color temperature (CCT) of 3000K. As can be seen from the amalgamation of the series of experiments, the use of blue-emitting LEDs results in hyper-blue gamut. When blue LEDs are used, variations of luminescent materials, and variations in the techniques for depositing the luminescent materials produce particular structures proximal to the LEDs that nonetheless produce hyper-blue gamuts (e.g., hyper-blue gamut 1381).

Also shown in FIG. 13D is the improved gamut 1384 that is exhibited from use of a configuration of violet-emitting LEDs and selected luminescent materials that produce desired saturation in the green and red regions. To achieve such a desired gamut, luminescent materials are selected, and then deposited proximal to the LEDs in precisely-controlled structures (e.g., thicknesses of the luminescent-material coatings). For example, the aforementioned processing steps and structures of FIG. 10A-FIG. 10I, and the aforementioned processing steps and structures of FIG. 11A-FIG. 11I serve to precisely control the thicknesses and heights of the deposited structures. In the embodiments of FIG. 10 and FIG. 11, the structures surrounding the LED can be achieved by the processes described above, and with particular steps as follows:

- Apply resist layer (e.g., a thick-film) to the LED die array (the resist layer thickness is larger than the height of the LED die). In this configuration, the height of the resist can substantially influence the final thickness of the luminescent materials coating on the top surface of the die.
- Adjust the thickness of the luminescent materials coating on the top of the die to be in a relative thickness compared to the thickness of the luminescent-materials coating on the sides of the die. The thickness of the luminescent materials coating on the sides of the die can be controlled by the size of the openings in the resist layer.

Additional color variations responsive to variations in coating thickness around violet LEDs are characterized in the following figures.

FIG. 13E is a chart showing how blue light leakage variation due to variations in coating thickness results in white color point variations.

FIGS. 13F1 and 13F2 characterize the dimensions given as N, S, E, and W, and Top which dimensions are used to define the phosphor layer thickness around the LED die. Some of the figures herein present side views, corresponding to a view from a N, S, E, or W viewing orientation.

FIG. 13G1 and FIG. 13G2 show charts for comparisons of color variation from phosphor layer asymmetries. The variations are many times smaller for a violet based LED as compared to a blue based LED. Coating over the faces of the violet-emitting LED are exemplified as in the following table. Colorpoint variations corresponding to the thicknesses as shown in the following table are presented in FIG. 13G2.

| Face | Violet Leakage | Thickness (microns) |
| --- | --- | --- |
| Top | 10% | 25 μm (plus or minus 2 microns) |
| N | 8% | 27.5 μm (plus or minus 2 microns) |
| E | 0% | 90 μm (plus or minus 2 microns) |
| S | 0% | 77.5 μm (plus or minus 2 microns) |
| W | 1% | 47.5 μm (plus or minus 2 microns) |

Figure 14:
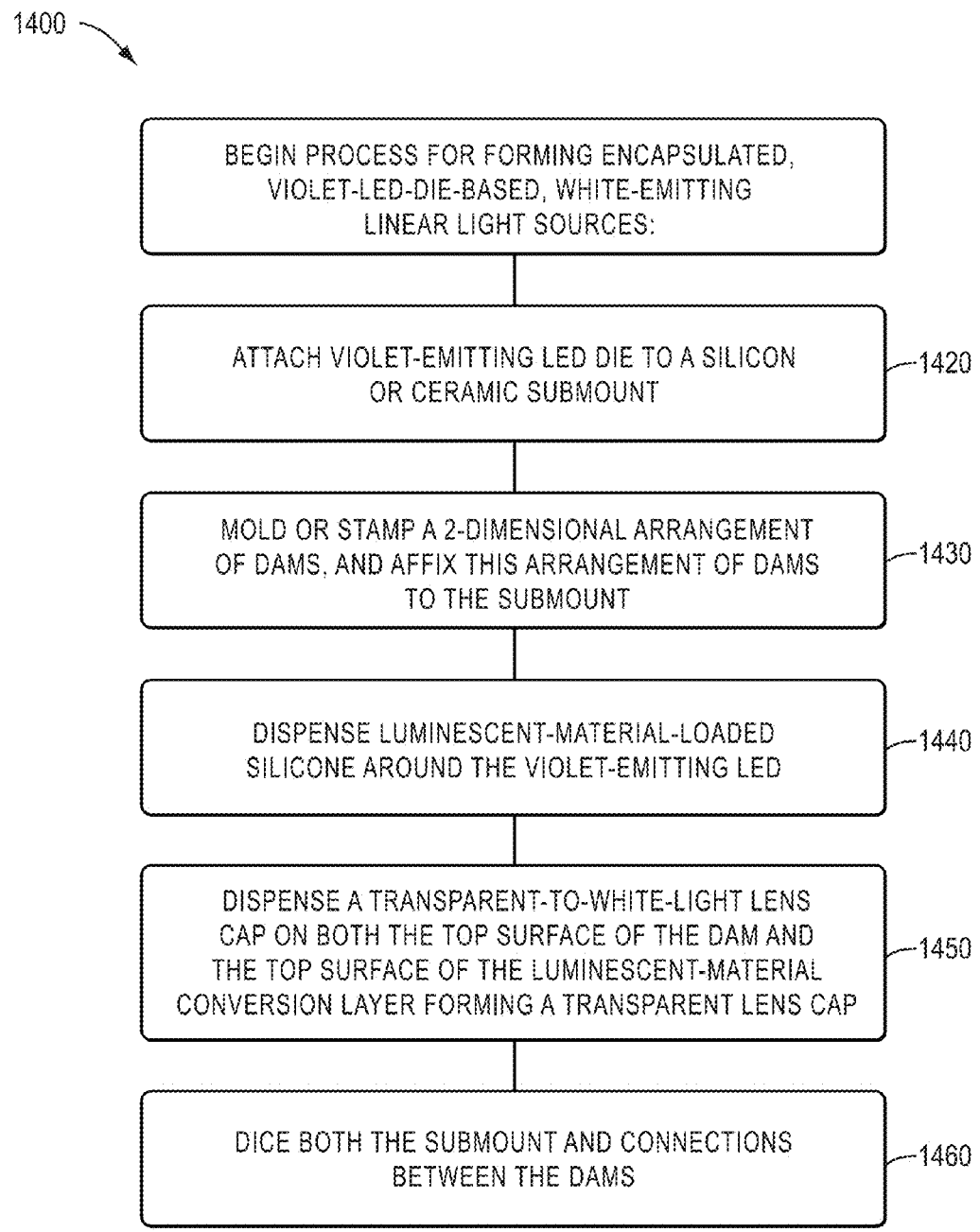
FIG. 14 is a flow chart of a system for creating encapsulated, violet-LED die-based, white-emitting linear light sources, according to some embodiments.

FIG. 14 is a flow chart of a system 1400 for creating encapsulated, violet-LED-die-based, white-emitting linear light sources by following the steps of attaching violet-emitting LED die to a silicon or ceramic submount in an n×m (where n>m) array (see step 1420), molding or stamping a 2-dimensional array of dams, affixing this array of dams to the submount (see step 1430), dispensing luminescent-material-loaded silicone around the violet-emitting LED die (see step 1440), dispensing a transparent-to-white-light lens cap on both the top surface of the dam and the top surface of the luminescent-material conversion layer forming a transparent lens cap (see step 1450), and dicing both the submount and connections between the dams (see step 1450).

Figure 15:
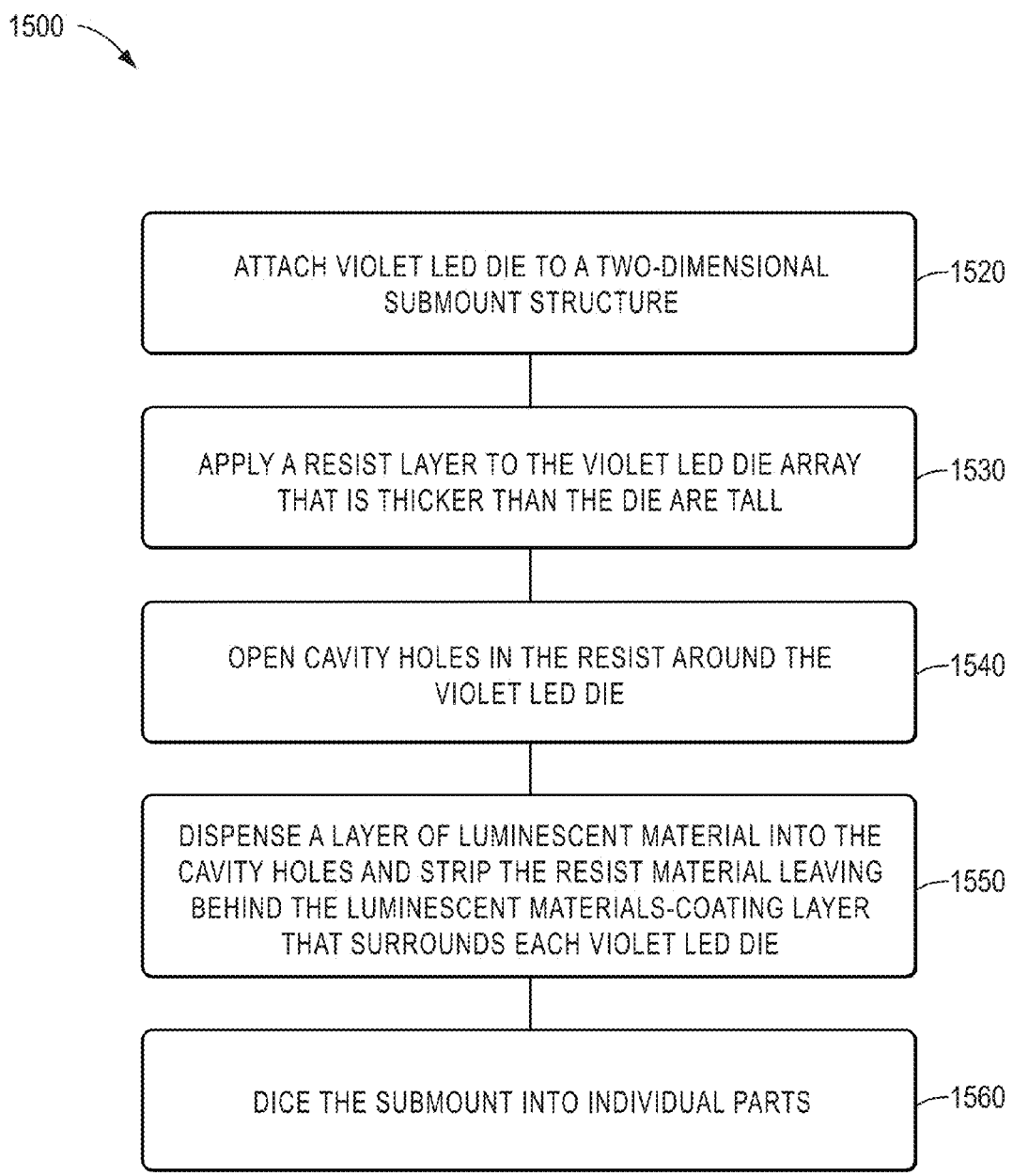
FIG. 15 is a flow chart of a system for fabricating arrays of violet LED die coated with densely-packed-luminescent-material layers, according to some embodiments.

FIG. 15 is a flow chart of a system 1500 to perform fabrication of dense-luminescent-materials—coated violet LED die. Steps in the system can, individually or in combination, perform method operations within system 1500. Any operations performed within system 1500 may be performed in any order unless as may be specified in the claims. As shown the system performs: attaching violet LED die to a submount structure (see module 1520); applying a resist layer to the violet LED die array that is thicker than the die are tall (see module 1530); opening cavity holes in the resist around the violet LED die (see module 1540); dispensing a layer of luminescent material into the cavity holes stripping the resist material leaving behind the luminescent materials-coating layer that surrounds each violet LED die (see module 1550); and dicing the submount into individual parts (see module 1560).

EXAMPLES

The following examples describe in detail examples of constituent elements of the herein-disclosed embodiments. It will be apparent to those skilled in the art that many modifications, both to materials and methods, may be practiced without departing from the scope of the disclosure.

Example 1

Example 1 follows aspects of the foregoing approach to making individual white-die arrays described above. This approach applies to fabrication using bulk-GaN-substrate-based LEDs with violet emission, and used in a high-current-density regime. Some embodiments include such white-die arrays built with violet LED die grown on bulk-GaN and some embodiments include individual violet LED die driven at high current densities (e.g., over 150 Amps/cm$^2$ or over 175 Amps/cm$^2$, etc.).

Example 2

The apparatus formed by the techniques of Example 1, further comprising single-color red, green, and blue luminescent materials deposited around each violet LED die to reduce the light absorption that is present in mixed-luminescent-material white light sources. This can have the effect of increasing the 1 m/W efficiency of such sources. A mixture of red, green, blue, and white (RGBW) coated violet LED die could also be produced which can help with color mixing.

Example 3

The apparatus formed by the techniques of Example 1, formed by depositing single-color luminescent materials around the individual violet LED die in an array. Accordingly, a bright, single-color light source can be produced.

Example 4

The apparatus formed by the techniques of Example 1, further comprising depositing a multi-layer luminescent-material stack by repeating the process described herein (see FIG. 5). In some such embodiments, the opening in the resist can be made successively larger to allow for the next luminescent-material layer to be deposited. The thickness of the individual layers could be optimized for light-emission efficiency. In addition, the height of the layer on top of the violet LED die can be varied independently from the width of the layer on the sides of the violet LED die.

Example 5

The apparatus formed by the techniques of Example 1, further comprising depositing the luminescent materials in a color-separated-layer structure around the die. For example, depositing a red luminescent-material layer prior to blue and green luminescent material layer may reduce light-absorption in the violet LED die as less of the more-likely-to-be-absorbed short-wavelength light will be scattered back into the violet LED die. The alignment precision achievable with standard photolithography techniques is more than adequate to create layered structures around each die. Strictly as an example, the first layer deposited is formed to be wide enough to account for variations in die-to-die placement on the submount; however, subsequent luminescent material layer(s) could be fairly thin.

Example 6

The apparatus formed by the techniques of Example 1, further comprising a two-layer luminescent-material stack made by "dusting" the original openings in the resist layer with a desired first-to-be-deposited luminescent-material and then filling the cavities with additional luminescent materials as described above.

Example 7

The apparatus formed by the techniques of Example 1, further comprising warm-white and cool-white luminescent-materials-deposited around different individually-addressable die to create color-point-tunable light sources. In some variations, different individual ones of the violet LED die have cool-white, warm-white, red, green, or blue luminescent-material coatings that are selected in a particular proportion in order to make a color-tunable-white-light source.

Example 8

The apparatus formed by the techniques of Example 1, further comprising repeating for die-level encapsulation. In this case, thick-film resist can be applied, holes opened to create the appropriate side-wall shape around the luminescent-material-coated die, and clear silicone dispensed around and on-top-of each coated violet LED die in the array (see FIG. 6). The size and shape of the clear-silicone encapsulant can be optimized to maximize performance from a die array. Such structures, of course, can be molded around the violet LED die using, for example, vacuum overmolding. In exemplary embodiments, the steps for opening of cavity holes is repeated with cavity holes that are successively larger than those of the previous layer in order to deposit successive separate-color-light-emitting layers.

Example 9

The apparatus formed by the techniques of Example 1, including vias formed in the submount for back-side electrical connections. Using this technique facilitates making single-die white LEDs by dicing the submount into individually-coated, slightly-larger-than-die-size pieces. A lamp formed of such die exhibits the light output, and the color consistency of a violet-pumped-three luminescent-material white light source. A lamp formed of such die could exhibit high light output at the high operating temperatures desired for automotive daytime-running-lamp applications.

Example 10

The apparatus formed by the techniques of Example 1, arranged into linear strips (e.g., rectangular-shaped strips) of individual die, which can be employed as tungsten-filament-like light sources. In a dipped, clear-silicone-cap version, there might be no need for further encapsulation for use as an A-lamp filament-like light source. Such linear strips may have sufficient surface brightness to now be employed in automotive-forward-lighting applications. Such linear strips can comprise a linear array of triangular-shaped violet LEDs atop a rectangular-shaped submount (or atop a rectangular-shaped area of a submount), were the violet LED die are arranged with one side of the triangular LED die facing the narrow side of the submount.

A process for fabricating violet LED die coated with densely-packed-luminescent-material layers, comprising:
  a. attaching violet LED die to a submount structure;
  b. applying a resist layer to the violet LED die wherein a top surface of the resist layer is above a top surface of the violet LED die;
  c. opening cavity holes in the resist layer around the violet LED die;
  d. dispensing a layer of luminescent material into the cavity holes;
  e. stripping the resist layer to provide a luminescent materials-coating layer surrounding the violet LED die; and
  f. dicing the submount into individual parts.

The process of Example 11, wherein the violet LEDs are grown on a bulk-GaN substrate.

The process of Example 11, wherein after the dispensing of a layer of luminescent material, the opening of cavity holes is repeated with cavity holes that are larger than those of the previous layer to deposit successive separate-color-light-emitting layers.

The process of Example 11, wherein a height of the resist layer above the LED die is different than the distance from an edge of the violet LED die to a photoresist cavity wall.

The process of Example 11, wherein dispensing a layer of luminescent material comprises dispensing a blue luminescent material around certain of the violet LED die, dispensing a green luminescent material around certain of the violet LED die, and dispensing a red luminescent material around certain of the violet LED die.

The process of Example 15, wherein different ones of the violet LED die are configured to be driven independently to create a color-tunable light source.

The process of Example 11, wherein dispensing a layer of luminescent material comprises dispensing a cool-white or a warm-white luminescent material around certain of the violet LED die and the different ones of the violet LED die are configured to be driven independently to create a color-temperature-tunable light source.

The process of Example 11, wherein dispensing a layer of luminescent material comprises dispensing cool-white luminescent material, warm-white luminescent material, red luminescent material, green luminescent material, or blue luminescent material around certain of the LED die in a selected proportion to make a color-tunable-white-light source.

The process of Example 11, wherein the luminescent materials are deposited in a linear strip around a linear arrangement of violet LED die.

The process of Example 11, wherein the cavity holes comprise linear strips around linearly arranged violet LED die.

The process of Example 11, wherein the violet LEDs are triangular-shaped and the violet LEDs are arranged in a linear array with one side of the triangular violet LED facing a narrow side of the submount.

The process of Example 11, wherein the violet LEDs are triangular-shaped and the violet LEDs are arranged in a dual strip of violet LEDs having one side of the triangular-shaped violet LEDs facing a wide side of the submount.

The process of Example 11, further comprising encapsulating the violet LED die in silicone and curing to create an encapsulated device.

The process of Example 11, further comprising an additional cavity opening step being performed after the violet LED die have been coated with a first luminescent material and further coating the violet LED die with a second luminescent material.

The process of Example 11, further comprising forming through-hole vias in the submount.

The process of Example 25, further comprising dicing luminescent-material-coated die out of the submount as stand-alone LEDs.

The process of Example 11, wherein a reflective dam is placed around a set of luminescent-material-coated die.

The process of Example 11, wherein the layer of luminescent material is about 50 μm thick to about 450 μm thick.

The process of Example 11, further comprising dispensing silicone onto the layer of luminescent material.

The process of Example 11, further comprising mixing the luminescent materials with solvent followed by dispensing of silicone onto the luminescent materials.

The process of Example 11, further comprising mixing the luminescent materials with silicone prior to dispensing the layer of luminescent materials into the cavity holes.

A light source is formed using violet-emitting LED die arranged in a n×m array where n>m, then:
(i) surrounding the die array with a transparent-to-white-light dam material,
(ii) dispensing luminescent-conversion-material-loaded-silicone around the violet LED die inside the dam, and
(iii) dispensing a transparent-to-white-light lens cap on top of both the dam and the luminescent-material conversion layer.

The light source of Example 32 where the violet-emitting LED die are grown on bulk GaN substrates.

The light source of Example 32 where the white-light-transparent dam material is loaded with a small number of scattering centers to improve the off-state appearance of the source and/or alter the light-emission pattern.

The light source of Example 32 where the violet-emitting LED die are individually coated with a conformal luminescent-material layer prior to placement of the white-light-transparent dams.

The light source of Example 35 where a white-light-transparent silicone is dispensed around the conformally-coated die and on top of the dam to create a lens cap.

A method of creating encapsulated, violet-die-based, white-emitting linear light sources by following the steps of:
(i) attaching violet-emitting LED die to a silicon or ceramic submount in an n×m (where n>m) array,
(ii) molding or stamping a 2-dimensional array of transparent-to-white-light dams, affixing this array of dams to the submount,
(iii) dispensing luminescent-material-loaded silicone around the violet-emitting LED die,
(iv) dispensing a transparent-to-white-light lens cap on both the top surface of the dam and the top surface of the luminescent-material conversion layer forming a transparent lens cap, and
(v) dicing both the submount and connections between the dams.

The method of Example 37 where the violet-emitting LED die are grown on bulk GaN substrates.

The method of Example 37 where the white-light-transparent dam material is loaded with a small number of scattering centers to improve the off-state appearance of the source and/or alter the light-emission pattern.

The method of Example 37 where the violet-emitting LED die are individually coated with a conformal luminescent-material layer prior to placement of the white-light-transparent dams.

The method of Example 40 where a white-light-transparent silicone is dispensed around the conformally-coated violet LED die and on top of the dam to create a lens cap.

FIG. 16A1 through FIG. 16I depict embodiments of the present disclosure as can be applied toward lighting applications. In these embodiments, one or more light-emitting diodes 16A10, can be covered or coated and/or patterned as taught by this disclosure, and can be mounted on a submount or package to provide an electrical interconnection. The submount or package can be a ceramic, oxide, nitride, semiconductor, metal, or combination thereof that includes an electrical interconnection capability 16A20 for the various coated LEDs. The submount or package can be mounted to a heatsink member 16B50 via a thermal interface. The LEDs can be configured to produce a desired emission spectrum, either by mixing primary emissions from various LEDs, or by having the LEDs photo-excite wavelength down-conversion materials such as phosphors, semiconductors, or semiconductor nanoparticles ("quantum dots"), or a combination of any of the foregoing.

The total light emitting surface (LES) of the LEDs and any down-conversion materials can form a light source 16A30. One or more light sources can be interconnected into an array 16B20, which in turn is in electrical contact with connectors 16B10 and brought into an assembly 16B30. One or more lens elements 16B40 can be optically coupled to the light source. The lens design and properties can be selected so that the desired directional beam pattern for a lighting product is achieved for a given LES. The directional lighting product may be an LED module, a retrofit lamp 16B70, or a lighting fixture 16C30. In the case of a retrofit lamp, an electronic driver can be provided with a surrounding member 16B60, the driver to condition electrical power from an external source to render it suitable for the LED light source. The driver can be integrated into the retrofit lamp. In the case of a fixture, an electronic driver is provided which conditions electrical power from an external source to make it suitable for the LED light source, with the driver either integrated into the fixture or provided externally to the fixture. In the case of a module, an electronic driver can be provided to condition electrical power from an external source to render it suitable for the LED light source, with the driver either integrated into the module or provided externally to the module. Examples of suitable external power sources include mains AC (e.g., 120 Vrms AC or 240 Vrms AC), low-voltage AC (e.g., 12 VAC), and low-voltage DC (e.g., 12 VDC). In the case of retrofit lamps, the entire lighting product may be designed to fit standard form factors (e.g., ANSI form factors). Examples of retrofit lamp products include LED-based MR16, PAR16, PAR20, PAR30, PAR38, BR30, A19 and various other lamp types. Examples of fixtures include replacements for halogen-based and ceramic metal halide-based directional lighting fixtures.

In some embodiments, the present disclosure can be applied to non-directional lighting applications. In these embodiments, one or more light-emitting diodes (LEDs), as taught by the disclosure, can be mounted on a submount or package to provide an electrical interconnection. The submount or package can be, for example, a ceramic, oxide, nitride, semiconductor, metal, or combination of any of the foregoing that includes electrical interconnection capability for the various LEDs. The submount or package can be mounted to a heatsink member via a thermal interface. The LEDs can be configured to produce a desired emission spectrum, either by mixing primary emissions from various LEDs, or by having the LEDs photo-excite wavelength down-conversion materials such as phosphors, semiconductors, or semiconductor nanoparticles ("quantum dots"), or a combination thereof. The LEDs can be distributed to provide a desired shape of the light source. For example, one common shape is a linear light source for replacement of conventional fluorescent linear tube lamps. One or more optical elements can be coupled to the LEDs to provide a desired non-directional light distribution. The non-directional lighting product may be an LED module, a retrofit lamp, or a lighting fixture. In the case of a retrofit lamp, an electronic driver can be provided to condition electrical power from an external source to render it suitable for the LED light source, with the driver integrated into the retrofit lamp. In the case of a fixture, an electronic driver is provided to condition electrical power from an external source to render it suitable for the LED light source, with the driver either integrated into the fixture or provided externally to the fixture. In the case of a module, an electronic driver can be provided to condition electrical power from an external source to render it suitable for the LED light source, with the driver either integrated into the module or provided externally to the module. Examples of external power sources include mains AC (e.g., 120 Vrms AC or 240 Vrms AC), low-voltage AC (e.g., 12 VAC), and low-voltage DC (e.g., 12 VDC). In the case of retrofit lamps, the entire lighting product may be designed to fit standard form factors (e.g., ANSI form factors). Examples of retrofit lamp products include LED-based replacements for various linear, circular, or curved fluorescent lamps. An example of a non-directional lighting product is shown in FIG. 16C. Such a lighting fixture can include replacements for fluorescent-based troffer luminaires. In this embodiment, LEDs are mechanically secured into a package 16C10, and multiple packages are arranged into a suitable shape such as linear array 16C20.

Some embodiments of the present disclosure can be applied to backlighting for flat panel display applications. In these embodiments, one or more light-emitting diodes (LEDs), as taught by this disclosure, can be mounted on a submount or package to provide an electrical interconnection. The submount or package can be a ceramic, oxide, nitride, semiconductor, metal, or combination of any of the foregoing that include electrical interconnection capability for the various LEDs. The submount or package can be mounted to a heatsink member via a thermal interface. The LEDs can be configured to produce a desired emission spectrum, either by mixing primary emissions from various LEDs, or by having the LEDs photo-excite wavelength down-conversion materials such as phosphors, semiconductors, or semiconductor nanoparticles ("quantum dots"), or a combination of any of the foregoing. The LEDs can be distributed to provide a desired shape of the light source. One common shape is a linear light source. The light source can be optically coupled to a lightguide for the backlight. This can be achieved by coupling at the edge of the lightguide (edge-lit), or by coupling light from behind the lightguide (direct-lit). The lightguide distributes light uniformly toward a controllable display such as a liquid crystal display (LCD) panel. The display converts the LED light into desired images based on electrical control of light transmission and its color. One way to control the color is by use of filters (e.g., color filter substrate 16D40). Alternatively, multiple LEDs may be used and driven in pulsed mode to sequence the desired primary emission colors (e.g., using a red LED 16D30, a green LED 16D10, and a blue LED 16D20). Optional brightness-enhancing films may be included in the backlight "stack". The brightness-enhancing films narrow the flat panel display emission to increase brightness at the expense of the observer viewing angle. An electronic driver can be provided to condition electrical power from an external source to render it suitable for the LED light source for backlighting, including any color sequencing or brightness variation per LED location (e.g., one-dimensional or two-dimensional dimming). Examples of external power sources include mains AC (e.g., 120 Vrms AC or 240 Vrms AC), low-voltage AC (e.g., 12 VAC), and low-voltage DC (e.g., 12 VDC). Examples of backlighting products are shown in FIG. 16D1, FIG. 16D2, FIG. 16E1 and FIG. 16E2.

Some embodiments of the present disclosure can be applied to automotive forward lighting applications, as shown in FIG. 16F (e.g., see the example of an automotive forward lighting product 16F30). In these embodiments, one or more light-emitting diodes (LEDs) can be mounted on a submount or on a rigid or semi-rigid package 16F10 to provide an electrical interconnection. The submount or package can be a ceramic, oxide, nitride, semiconductor, metal, or combination thereof, that include electrical interconnection capability for the various LEDs. The submount or package can be mounted to a heatsink member via a thermal interface. The LEDs can be configured to produce a desired emission spectrum, either by mixing primary emission from various LEDs, or by having the LEDs photo-excite wavelength down-conversion materials such as phosphors, semiconductors, or semiconductor nanoparticles ("quantum dots"), or a combination of any of the foregoing. The total light emitting surface (LES) of the LEDs and any down-conversion materials form a light source. One or more lens elements 16F20 can be optically coupled to the light source. The lens design and properties can be selected to produce a desired directional beam pattern for an automotive forward lighting application for a given LED. An electronic driver can be provided to condition electrical power from an external source to render it suitable for the LED light source. Power sources for automotive applications include low-voltage DC (e.g., 12 VDC). An LED light source may perform a high-beam function, a low-beam function, a side-beam function, or any combination thereof.

In some embodiments, the present disclosure can be applied to digital imaging applications such as illumination for mobile phone and digital still cameras (e.g., see FIG. 16G). In these embodiments, one or more light-emitting diodes (LEDs), as taught by the disclosure, can be mounted on a submount or package 16G10 to provide an electrical interconnection. The submount or package can be, for example, a ceramic, oxide, nitride, semiconductor, metal, or combination of any of the foregoing, that include electrical interconnection capability for the various LEDs. The submount or package can be mounted to a circuit board member and fitted with or into a mounting package 16G20. The LEDs can be configured to produce a desired emission spectrum, either by mixing primary emission from various LEDs, or by having the LEDs photo-excite wavelength down-conversion materials such as phosphors, semiconductors, or semiconductor nanoparticles ("quantum dots"), or a combination thereof. The total light emitting surface (LES)

of the LEDs and any down-conversion materials form a light source. One or more lens elements can be optically coupled to the light source. The lens design and properties can be selected so that the desired directional beam pattern for an imaging application is achieved for a given LES. An electronic driver can be provided to condition electrical power from an external source to render it suitable for the LED light source. Examples of suitable external power sources for imaging applications include low-voltage DC (e.g., 5 VDC). An LED light source may perform a low-intensity function 16G30, a high-intensity function 16G40, or any combination thereof.

Figure 16H:
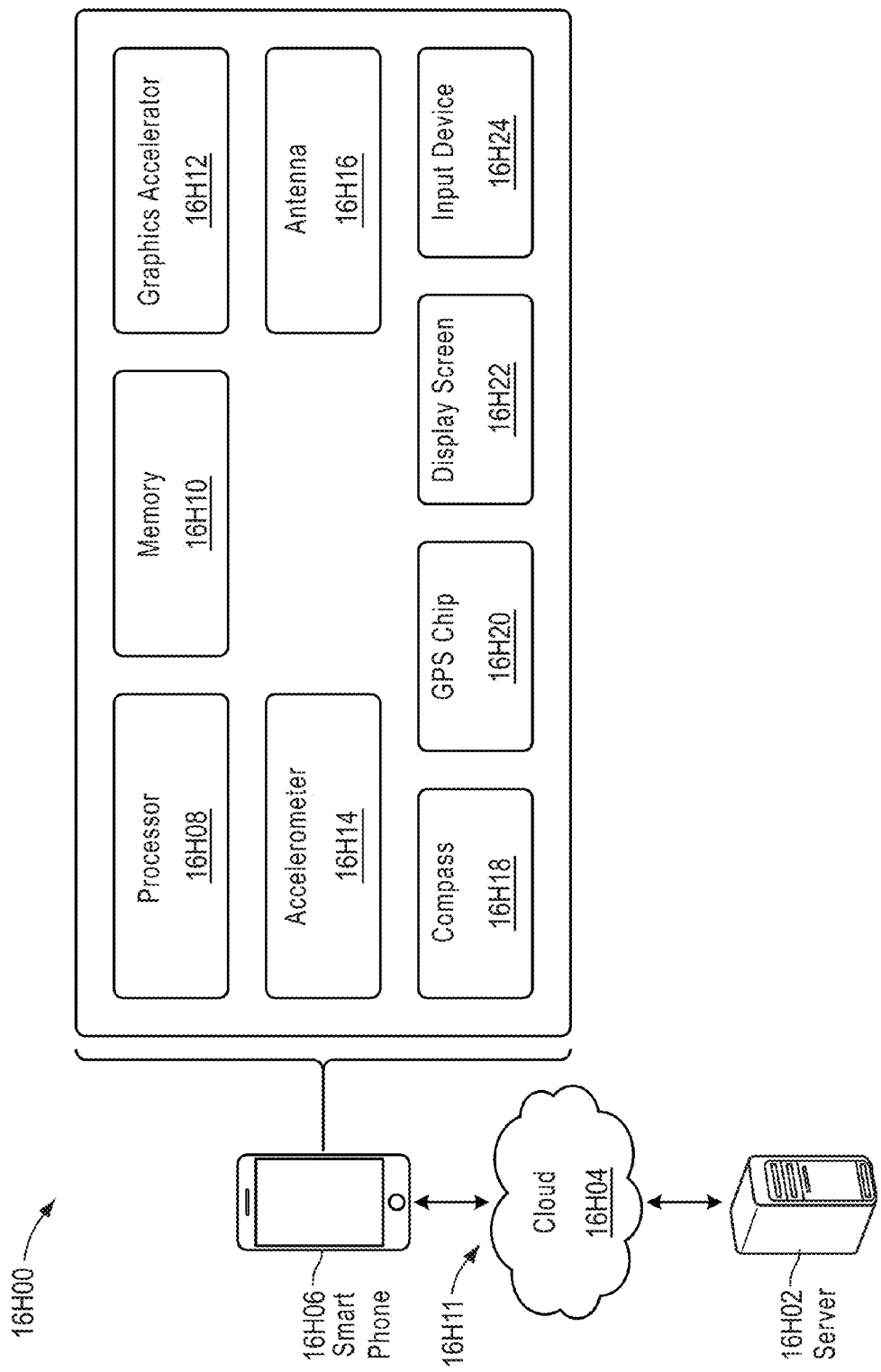

Some embodiments of the present disclosure can be applied to mobile terminal applications. FIG. 16H is a diagram illustrating a mobile terminal (see smart phone architecture 16H00). As shown, the smart phone 16H06 includes a housing, display screen, and interface device, which may include a button, microphone, and/or touch screen. In certain embodiments, a phone has a high resolution camera device, which can be used in various modes. An example of a smart phone can be an iPhone from Apple Inc. of Cupertino, Calif. Alternatively, a smart phone can be a Galaxy from Samsung, or others.

In an example, the smart phone may include one or more of the following features (which are found in an iPhone 4 from Apple Inc., although there can be variations), see www.apple.com:

GSM model: UMTS/HSDPA/HSUPA (850, 900, 1900, 2100 MHz); GSM/EDGE (850, 900, 1800, 1900 MHz)
CDMA model: CDMA EV-DO Rev. A (800, 1900 MHz)
802.11b/g/n Wi-Fi (802.11n 2.4 GHz only)
Bluetooth 2.1+EDR wireless technology
Assisted GPS
Digital compass
Wi-Fi
Cellular
Retina display
3.5-inch (diagonal) widescreen multi-touch display
800:1 contrast ratio (typical)
500 cd/m2 max brightness (typical)
Fingerprint-resistant oleophobic coating on front and back
Support for display of multiple languages and characters simultaneously
5-megapixel iSight camera
Video recording, HD (720p) up to 30 frames per second with audio
VGA-quality photos and video at up to 30 frames per second with the front camera
Tap to focus video or still images
LED flash
Photo and video geotagging
Built-in rechargeable lithium-ion battery
Charging via USB to computer system or power adapter
Talk time: Up to 16 hours on 3G, up to 14 hours on 2G (GSM)
Standby time: Up to 300 hours
Internet use: Up to 6 hours on 3G, up to 10 hours on Wi-Fi
Video playback: Up to 10 hours
Audio playback: Up to 40 hours
Frequency response: 16 Hz to 16,000 Hz
Audio formats supported: AAC (8 to 320 Kbps), protected AAC (from iTunes Store), HE-AAC, MP3 (8 to 320 Kbps), MP3 VBR, audible (formats 2, 3, 4, audible enhanced audio, AAX, and AAX+), Apple lossless, AIFF, and WAV
User-configurable maximum volume limit
Video out support at up to 1620p with Apple digital AV adapter or Apple VGA adapter; 576p and 480p with Apple component AV cable; 576i and 480i with Apple composite AV cable (cables sold separately)
Video formats supported: H.264 video up to 1620p, 30 frames per second, main profile Level 3.1 with AAC-LC audio up to 160 Kbps, 48 kHz, stereo audio in .m4v, .mp4, and .mov file formats; MPEG-4 video up to 2.5 Mbps, 640 by 480 pixels, 30 frames per second, simple profile with AAC-LC audio up to 160 Kbps per channel, 48 kHz, stereo audio in .m4v, .mp4, and .mov file formats; motion JPEG (M-JPEG) up to 35 Mbps, 1280 by 1620 pixels, 30 frames per second, audio in ulaw, PCM stereo audio in .avi file format
Three-axis gyro
Accelerometer
Proximity sensor
Ambient light sensor
etcetera.

Embodiments of the present disclosure may be used with other electronic devices. Examples of suitable electronic devices include a portable electronic device such as a media player, a cellular phone, a personal data organizer, or the like. In such embodiments, a portable electronic device may include a combination of the functionalities of such devices. In addition, an electronic device may allow a user to connect to and communicate through the Internet or through other networks such as local or wide area networks. For example, a portable electronic device may allow a user to access the internet and to communicate using e-mail, text messaging, instant messaging, or using other forms of electronic communication. By way of example, the electronic device may be similar to an iPod having a display screen or an iPhone available from Apple Inc.

In certain embodiments, a device may be powered by one or more rechargeable and/or replaceable batteries. Such embodiments may be highly portable, allowing a user to carry the electronic device while traveling, working, exercising, and so forth. In this manner, and depending on the functionalities provided by the electronic device, a user may listen to music, play games or video, record video or take pictures, place and receive telephone calls, communicate with others, control other devices (e.g., via remote control and/or Bluetooth functionality), and so forth while moving freely with the device. In addition, the device may be sized such that it fits relatively easily into a pocket or the hand of the user. While certain embodiments of the present disclosure are described with respect to portable electronic devices, it should be noted that the presently disclosed techniques may be applicable to a wide array of other, less portable, electronic devices and systems that are configured to render graphical data such as a desktop computer.

As shown, FIG. 16H includes a system diagram with a smart phone that includes an LED according to an embodiment of the present disclosure. The smart phone 16H06 is configured to communicate with a server 16H02 in electronic communication with any forms of handheld electronic devices. Illustrative examples of such handheld electronic devices can include functional components such as a processor 16H08, memory 16H10, graphics accelerator 16H12, accelerometer 16H14, communications interface 16H11 (possibly including an antenna 16H16), compass 16H18, GPS chip 16H20, display screen 16H22, and an input device 16H24. Each device is not limited to the illustrated components. The components may be hardware, software or a combination of both.

In some examples, instructions can be input to the handheld electronic device through an input device 16H24 that instructs the processor 16H08 to execute functions in an electronic imaging application. One potential instruction can be to generate an abstract of a captured image of a portion of a human user. In that case the processor 16H08 instructs the communications interface 16H11 to communicate with the server 16H02 (e.g., possibly through or using a cloud 16H04) and transfer data (e.g., image data). The data is transferred by the communications interface 16H11 and either processed by the processor 16H08 immediately after image capture or stored in memory 16H10 for later use, or both. The processor 16H08 also receives information regarding the display screen's attributes, and can calculate the orientation of the device, e.g., using information from an accelerometer 16H14 and/or other external data such as compass headings from a compass 16H18, or GPS location from a GPS chip 16H20, and the processor then uses the information to determine an orientation in which to display the image depending upon the example.

The captured image can be rendered by the processor 16H08, by a graphics accelerator 16H12, or by a combination of the two. In some embodiments, the processor can be the graphics accelerator 16H12. The image can first be stored in memory 16H10 or, if available, the memory can be directly associated with the graphics accelerator 16H12. The methods described herein can be implemented by the processor 16H08, the graphics accelerator 16H12, or a combination of the two to create the image and related abstract. An image or abstract can be displayed on the display screen 16H22.

Figure 16I:
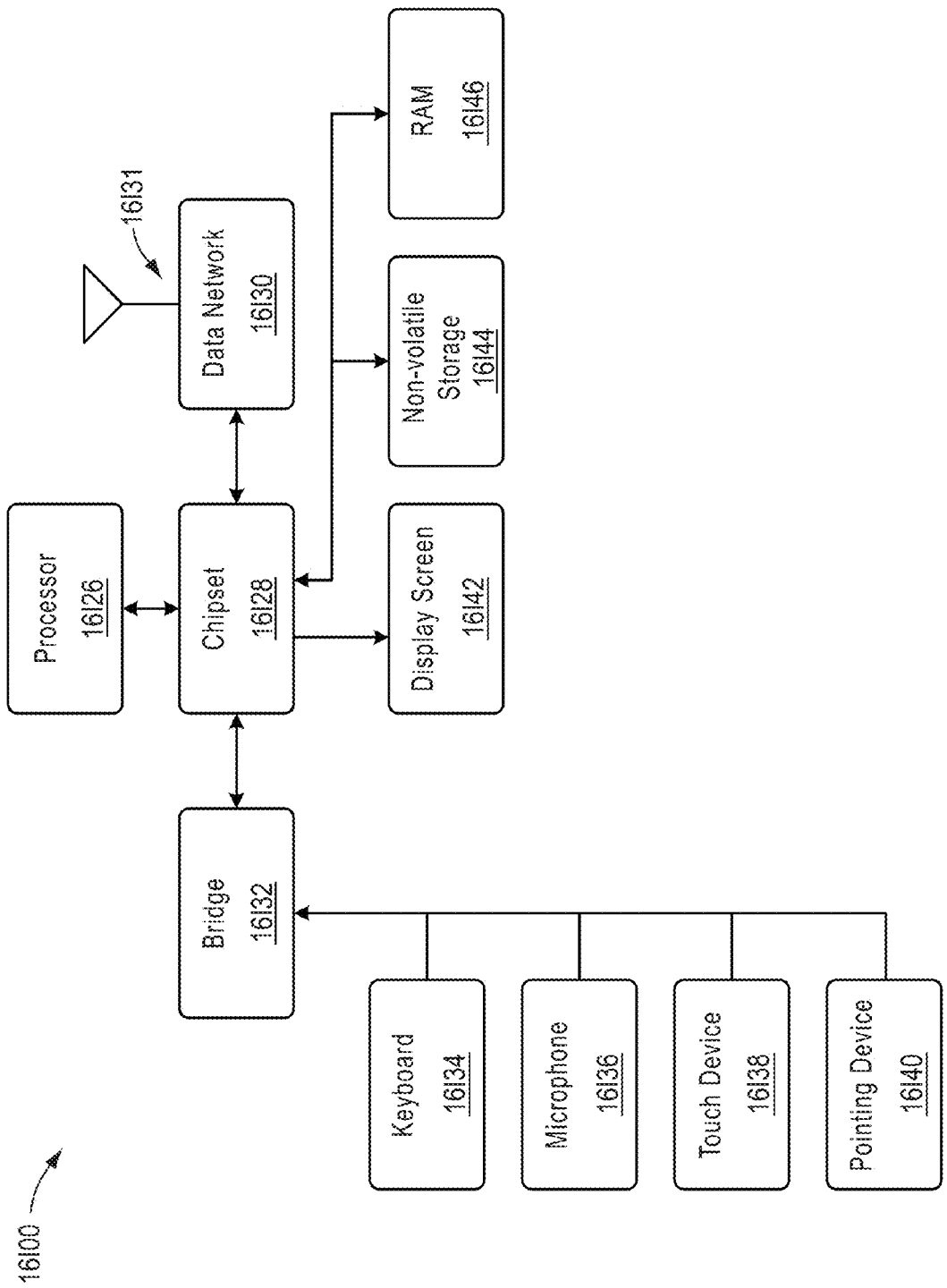

FIG. 16I depicts an interconnection of components in an electronic device 16I00. Examples of electronic devices include an enclosure or housing, a display, user input structures, and input/output connectors in addition to the aforementioned interconnection of components. The enclosure may be formed from plastic, metal, composite materials, or other suitable materials, or any combination thereof. The enclosure may protect the interior components of the electronic device from physical damage, and may also shield the interior components from electromagnetic interference (EMI).

The display may be a liquid crystal display (LCD), a light emitting diode (LED) based display, an organic light emitting diode (OLED) based display, or some other suitable display. In accordance with certain embodiments of the present disclosure, the display may display a user interface and various other images such as logos, avatars, photos, album art, and the like. Additionally, in certain embodiments, a display may include a touch screen through which a user may interact with the user interface. The display may also include various functions and/or system indicators to provide feedback to a user such as power status, call status, memory status, or the like. These indicators may be incorporated into the user interface displayed on the display.

In certain embodiments, one or more of the user input structures can be configured to control the device such as by controlling a mode of operation, an output level, an output type, etc. For instance, the user input structures may include a button to turn the device on or off. Further, the user input structures may allow a user to interact with the user interface on the display. Embodiments of the portable electronic device may include any number of user input structures including buttons, switches, a control pad, a scroll wheel, or any other suitable input structures. The user input structures may work with the user interface displayed on the device to control functions of the device and/or any interfaces or devices connected to or used by the device. For example, the user input structures may allow a user to navigate a displayed user interface or to return such a displayed user interface to a default or home screen.

Certain device may also include various input and output ports to allow connection of additional devices. For example, a port may be a headphone jack that provides for the connection of headphones. Additionally, a port may have both input and output capabilities to provide for the connection of a headset (e.g., a headphone and microphone combination). Embodiments of the present disclosure may include any number of input and/or output ports such as headphone and headset jacks, universal serial bus (USB) ports, IEEE-1394 ports, and AC and/or DC power connectors. Further, a device may use the input and output ports to connect to and send or receive data with any other device such as other portable electronic devices, personal computers, printers, or the like. For example, in one embodiment, the device may connect to a personal computer via an IEEE-1394 connection to send and receive data files such as media files.

The depiction of an electronic device 16I00 encompasses a smart phone system diagram according to an embodiment of the present disclosure. The depiction of an electronic device 16I00 illustrates computer hardware, software, and firmware that can be used to implement the disclosures above. The shown system includes a processor 16I26, which is representative of any number of physically and/or logically distinct resources capable of executing software, firmware, and hardware configured to perform identified computations. A processor 16I26 communicates with a chipset 16I28 that can control input to and output from processor 16I26. In this example, chipset 16I28 outputs information to display screen 16I42 and can read and write information to non-volatile storage 16I44, which can include magnetic media and solid state media, and/or other non-transitory media, for example. Chipset 16I28 can also read data from and write data to RAM 16I46. A bridge 16I32 for interfacing with a variety of user interface components can be provided for interfacing with chipset 16I28. Such user interface components can include a keyboard 16I34, a microphone 16I36, touch-detection-and-processing circuitry 16I38, a pointing device 16I40 such as a mouse, and so on. In general, inputs to the system can come from any of a variety of machine-generated and/or human-generated sources.

Chipset 16I28 also can interface with one or more data network interfaces 16I30 that can have different physical interfaces. Such data network interfaces 16I30 can include interfaces for wired and wireless local area networks, for broadband wireless networks, as well as personal area networks. Some applications of the methods for generating, displaying and using the GUI disclosed herein can include receiving data over a physical interface 16I31 or be generated by the machine itself by a processor 16I26 analyzing data stored in non-volatile storage 16I44 and/or in memory or RAM 16I46. Further, the machine can receive inputs from a user via devices such as a keyboard 16I34, microphone 16I36, touch-detection-and-processing circuitry 16I38, and pointing device 16I40 and execute appropriate functions such as browsing functions by interpreting these inputs using processor 16I26.

Figure 17:
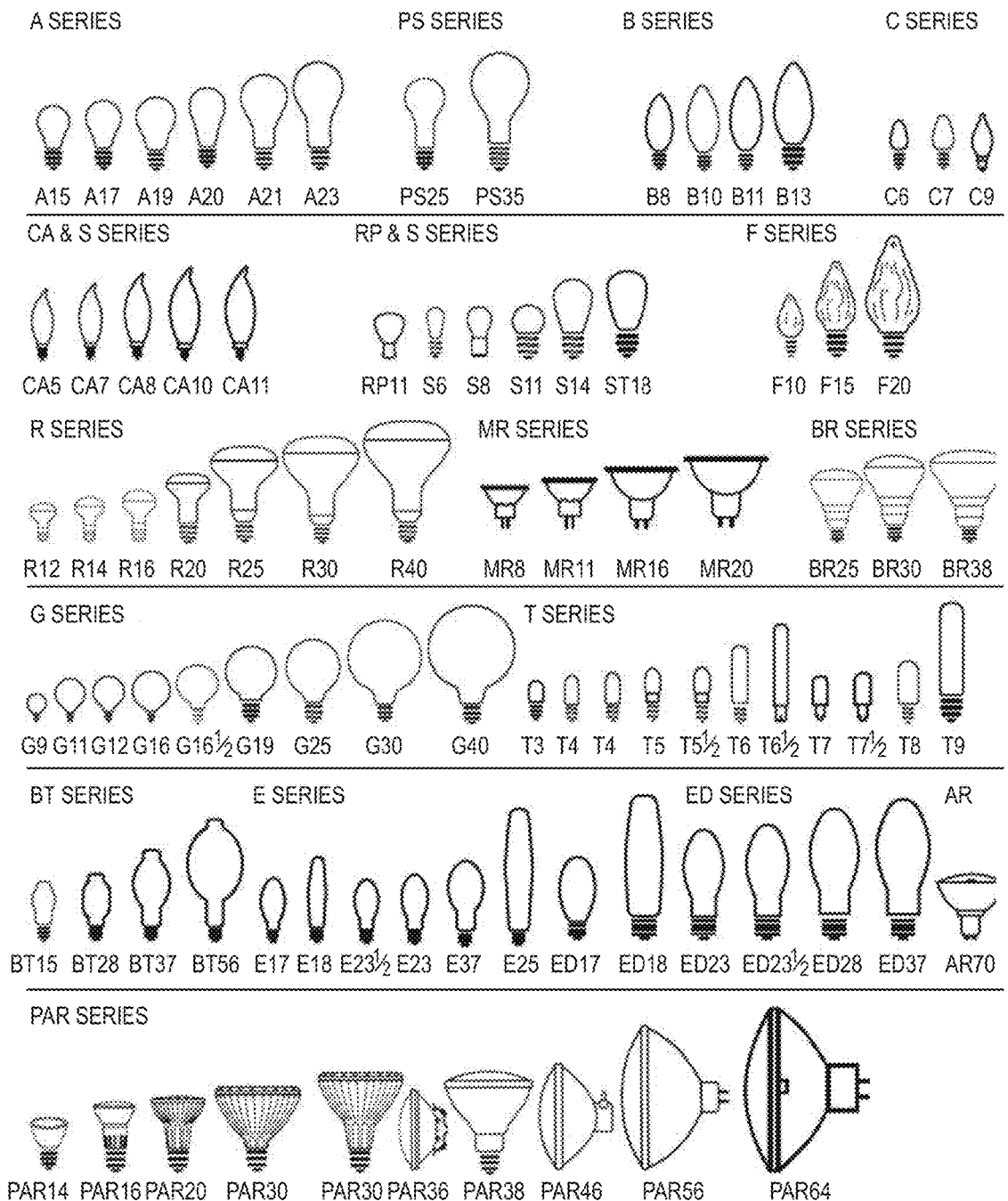
FIG. 17 depicts an arrangement of lamps used for implementing embodiments of the present disclosure in lighting applications.

FIG. 17 depicts embodiments of the present disclosure as can be applied toward lighting applications. The arrangement 1700 shows lamps organized into several lamp types (e.g., lamp series, as shown). Some of the various lamps (e.g., "A Series", "PS Series", "B Series", "C Series", etc.) have different lamp bases. Such lamp bases can conform to any standard, some of which are included in the following tables (see Table 2 and Table 3).

TABLE 2

| Designation | Base Diameter (Crest of thread) | Name | IEC 60061-1 standard sheet |
|---|---|---|---|
|  | 5 mm | Lilliput Edison Screw (LES) | 7004-25 |
| E10 | 10 mm | Miniature Edison Screw (MES) | 7004-22 |
| E11 | 11 mm | Mini-Candelabra Edison Screw (mini-can) | (7004-6-1) |
| E12 | 12 mm | Candelabra Edison Screw (CES) | 7004-28 |
| E14 | 14 mm | Small Edison Screw (SES) | 7004-23 |
| E17 | 17 mm | Intermediate Edison Screw (IES) | 7004-26 |

TABLE 2-continued

| Designation | Base Diameter (Crest of thread) | Name | IEC 60061-1 standard sheet |
|---|---|---|---|
| E26 | 26 mm | [Medium] (one-inch) Edison Screw (ES or MES) | 7004-21A-2 |
| E27 | 27 mm | [Medium] Edison Screw (ES) | 7004-21 |
| E29 | 29 mm | [Admedium] Edison Screw (ES) |  |
| E39 | 39 mm | Single-contact (Mogul) Giant Edison Screw (GES) | 7004-24-A1 |
| E40 | 40 mm | (Mogul) Giant Edison Screw (GES) | 7004-24 |

Additionally, the base member of a lamp can be of any form factor configured to support electrical connections, which electrical connections can conform to any of a set of types or standards. For example Table 3 gives standards (see "Type") and corresponding characteristics, including mechanical spacing between a first pin (e.g., a power pin) and a second pin (e.g., a ground pin).

TABLE 3

| Type | Standard | Pin center to center | Pin diameter | Usage |
|---|---|---|---|---|
| G4 | IEC 60061-1 (7004-72) | 4.0 mm | 0.65-0.75 mm | MR11 and other small halogens of 5/10/20 watt and 6/12 volt |
| GU4 | IEC 60061-1 (7004-108) | 4.0 mm | 0.95-1.05 mm |  |
| GY4 | IEC 60061-1 (7004-72A) | 4.0 mm | 0.65-0.75 mm |  |
| GZ4 | IEC 60061-1 (7004-64) | 4.0 mm | 0.95-1.05 mm |  |
| G5 | IEC 60061-1 (7004-52-5) | 5 mm |  | T4 and T5 fluorescent tubes |
| G5.3 | IEC 60061-1 (7004-73) | 5.33 mm | 1.47-1.65 mm |  |
| G5.3-4.8 | IEC 60061-1 (7004-126-1) |  |  |  |
| GU5.3 | IEC 60061-1 (7004-109) | 5.33 mm | 1.45-1.6 mm |  |
| GX5.3 | IEC 60061-1 (7004-73A) | 5.33 mm | 1.45-1.6 mm | MR16 and other small halogens of 20/35/50 watt and 12/24 volt |
| GY5.3 | IEC 60061-1 (7004-73B) | 5.33 mm |  |  |
| G6.35 | IEC 60061-1 (7004-59) | 6.35 mm | 0.95-1.05 mm |  |
| GX6.35 | IEC 60061-1 (7004-59) | 6.35 mm | 0.95-1.05 mm |  |
| GY6.35 | IEC 60061-1 (7004-59) | 6.35 mm | 1.2-1.3 mm | Halogen 100 W 120 V |
| GZ6.35 | IEC 60061-1 (7004-59A) | 6.35 mm | 0.95-1.05 mm |  |
| G8 |  | 8.0 mm |  | Halogen 100 W 120 V |
| GY8.6 |  | 8.6 mm |  | Halogen 100 W 120 V |
| G9 | IEC 60061-1 (7004-129) | 9.0 mm |  | Halogen 120 V (US)/ 230 V (EU) |
| G9.5 |  | 9.5 mm | 3.10-3.25 mm | Common for theatre use, several variants |
| GU10 |  | 10 mm |  | Twist-lock 120/230-volt MR16 halogen lighting of 35/50 watt, since mid-2000s |
| G12 |  | 12.0 mm | 2.35 mm | Used in theatre and single-end metal halide lamps |

TABLE 3-continued

| Type | Standard | Pin center to center | Pin diameter | Usage |
|---|---|---|---|---|
| G13 | | 12.7 mm | | T8 and T12 fluorescent tubes |
| G23 | | 23 mm | 2 mm | |
| GU24 | | 24 mm | | Twist-lock for self-ballasted compact fluorescents, since 2000s |
| G38 | | 38 mm | | Mostly used for high-wattage theatre lamps |
| GX53 | | 53 mm | | Twist-lock for puck-shaped under-cabinet compact fluorescents, since 2000s |

The listings above are merely representative and should not be taken to include all the standards or form factors that may be utilized within the scope of the embodiments described herein.

Finally, it should be noted that there are alternative ways of implementing the embodiments disclosed herein. Accordingly, the present embodiments are to be considered as illustrative and not restrictive, and the claims are not to be limited to the details given herein, but may be modified within the scope and equivalents thereof.

What is claimed is:

1. An apparatus comprising:
    a submount;
    at least one LED die attached to the submount, wherein the perimeter of the LED die defines a plurality of sides; and
    a conformal coating over the plurality of sides to define a thickness on each of the sides, and comprising at least one luminescent material;
    wherein at least one of the LED die or the thickness of the conformal coating on the sides of the LED die is configured such that light emitted from each of the sides has a chromaticity with a Du'v' that varies by no more than 0.015 from the Du'v' of the light of the other sides.

2. The apparatus of claim 1, wherein the thickness of the conformal coating varies among the plurality of sides.

3. The apparatus of claim 2, wherein the plurality of sides comprises a top side and a plurality of lateral sides, wherein the thickness of the conformal coating on the lateral sides is thicker than the top side.

4. The apparatus of claim 3, wherein the thickness of the conformal coating varies among the lateral sides.

5. The apparatus of claim 1, wherein the LED die is a violet-emitting die.

6. The apparatus of claim 5, wherein the current density in the at least one LED die is 175 Amps/cm$^2$.

7. The apparatus of claim 1, wherein the at least one LED die comprises a first LED die and a second LED die having different spectra.

8. The apparatus of claim 1, further comprising reflective dam around the at least one LED die.

9. The apparatus of claim 8, wherein a portion of the conformal coating is between at least one of the plurality of sides and the reflective dam.

10. The apparatus of claim 1 further comprising at least one optical element disposed over the at least one LED die.

11. The apparatus of claim 10, wherein the at least one optical element is a lens.

12. The apparatus of claim 11, wherein the lens is a silicone encapsulant.

13. The apparatus of claim 12, wherein the silicone encapsulant is at least partially spherical.

14. The apparatus of claim 1, where the at least one LED die comprises at least a first LED die and a second LED die forming at least one linear array.

15. The apparatus of claim 1, wherein at least one face of the at least one LED die is aligned to be substantially parallel to a long edge of the submount.

* * * * *